(12) United States Patent
Kim et al.

(10) Patent No.: US 9,899,388 B2
(45) Date of Patent: Feb. 20, 2018

(54) INTEGRATED CIRCUIT DEVICE AND METHOD OF MANUFACTURING THE SAME

(71) Applicants: Ki-Il Kim, Suwon-si (KR); Jung-gun You, Ansan-si (KR); Gi-gwan Park, Suwon-si (KR)

(72) Inventors: Ki-Il Kim, Suwon-si (KR); Jung-gun You, Ansan-si (KR); Gi-gwan Park, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,562

(22) Filed: Jun. 24, 2016

(65) Prior Publication Data
US 2017/0103985 A1 Apr. 13, 2017

(30) Foreign Application Priority Data
Oct. 7, 2015 (KR) .................. 10-2015-0141047

(51) Int. Cl.
*H01L 29/78* (2006.01)
*H01L 27/092* (2006.01)
*H01L 21/8238* (2006.01)
*H01L 29/06* (2006.01)

(52) U.S. Cl.
CPC .. *H01L 27/0924* (2013.01); *H01L 21/823821* (2013.01); *H01L 21/823878* (2013.01); *H01L 29/0649* (2013.01); *H01L 29/0657* (2013.01)

(58) Field of Classification Search
CPC .......... H01L 29/6681; H01L 29/66818; H01L 29/66795; H01L 29/7831; H01L 29/785; H01L 29/7856; H01L 29/7858; H01L 29/786; H01L 29/791
See application file for complete search history.

(56) References Cited

U.S. PATENT DOCUMENTS

| 6,953,973 | B2 | 10/2005 | Kim |
| 7,719,043 | B2 | 5/2010 | Yamagami et al. |
| 8,697,515 | B2* | 4/2014 | Yin .................... H01L 29/6681 257/E21.409 |
| 8,835,268 | B2 | 9/2014 | Sudo |
| 8,878,299 | B2 | 11/2014 | Lee et al. |
| 8,895,446 | B2 | 11/2014 | Peng et al. |
| 8,987,836 | B2 | 3/2015 | Kim et al. |
| 9,006,067 | B2 | 4/2015 | Kang et al. |
| 9,385,191 | B2* | 7/2016 | Wu .................... H01L 29/7856 |
| 9,508,718 | B2* | 11/2016 | Wu .................. H01L 29/66636 |
| 2003/0001225 | A1 | 1/2003 | Goda et al. |

(Continued)

*Primary Examiner* — Cuong Q Nguyen
(74) *Attorney, Agent, or Firm* — Muir Patent Law, PLLC

(57) ABSTRACT

An integrated circuit device includes a double-humped protrusion protruding from a surface of an inter-device isolation region. To manufacture the integrated circuit device, a plurality of grooves are formed in the inter-device isolation region of a substrate, a recess is formed by partially removing a surface of the substrate between the plurality of grooves, at least one fin-type active area is formed in a device region by etching the substrate in the device region and the inter-device isolation region, and the double-humped protrusion is formed from the surface of the substrate in the inter-device isolation region.

25 Claims, 38 Drawing Sheets

(56) References Cited

U.S. PATENT DOCUMENTS

| | | |
|---|---|---|
| 2014/0227857 A1 | 5/2014 | Youn et al. |
| 2014/0374828 A1 | 12/2014 | Song et al. |
| 2015/0145065 A1 | 5/2015 | Kanakasabapathy et al. |
| 2015/0179503 A1 | 6/2015 | Tsai et al. |
| 2015/0179524 A1 | 6/2015 | Liang et al. |
| 2015/0179768 A1 | 6/2015 | Chen et al. |
| 2015/0179771 A1 | 6/2015 | Lo et al. |
| 2015/0187943 A1 | 7/2015 | Lee et al. |
| 2015/0194426 A1 | 7/2015 | Liu et al. |
| 2016/0056045 A1* | 2/2016 | Huang ............... H01L 29/6681 257/623 |

* cited by examiner

INTEGRATED CIRCUIT DEVICE AND METHOD OF MANUFACTURING THE SAME

CROSS-REFERENCE TO RELATED APPLICATION

This application claims the benefit of priority under 35 U.S.C. § 119 to Korean Patent Application No. 10-2015-0141047, filed on Oct. 7, 2015, in the Korean Intellectual Property Office, the disclosure of which is incorporated herein in its entirety by reference.

BACKGROUND

The disclosed embodiments relate to an integrated circuit device and a method of manufacturing the same, for example, to an integrated circuit device including a fin-type field effect transistor (FET) and a method of manufacturing the same.

As designing and manufacturing technologies are improved, semiconductor devices continue to be down-scaled. In such down-scaled semiconductor devices, spaces between wirings and contacts have been reduced, and thus demands for high speed operation and accurate operation of transistors have further increased.

SUMMARY

Aspects of the inventive concept provide an integrated circuit device having a structure capable of improving performance of a fin-type field effect transistor (FET) that is included in a highly-integrated semiconductor device and is highly scaled.

Aspects of the inventive concept also provide a method of manufacturing an integrated circuit device having a structure capable of improving performance of a fin-type field effect transistor (FET) that is included in a highly-integrated semiconductor device and is highly scaled.

According to an aspect of the inventive concept, there is provided an integrated circuit device including a substrate comprising a PMOS device region, an NMOS device region adjacent to the PMOS device region and an inter-device isolation region interposed between the PMOS device region and the NMOS device region, a first fin-type active area protruding from the substrate, in one of the PMOS device region and NMOS device region, a device isolation layer covering the substrate at the inter-device isolation region, wherein, as viewed with respect to a vertical cross section extending between the PMOS device region and the NMOS device region, an upper surface of the substrate at the inter-device isolation region comprises a double-humped protrusion, the double-humped protrusion comprising a first hump having a first peak, a second hump having a second peak and a recess disposed between the first peak and the second peak, the recess having a depth comprising a vertical distance from the lower most portion of the recess to a height of one of the first peak and second peak, wherein the double-humped protrusion has a height comprising a vertical distance from a minimum height of a top surface of the substrate immediately adjacent to the double-humped protrusion to a top of one of the first peak and second peak, and the height of the double-humped protrusion is greater than the depth of the recess.

The vertical cross section may be taken in a direction perpendicular to a length direction of the first fin-type active area. With respect to the vertical cross section, side walls of the first hump may be asymmetric with respect to the first peak. With respect to the vertical cross section, side walls of the second hump may be asymmetric with respect to the second peak. The upper surface of the substrate may comprise valley portions at sides of the double-humped protrusion. With respect to the vertical cross section, a lowest point of each of the valley portions may be lower than a lowest point of the recessed top surface of the double-humped protrusion. The integrated circuit device may comprise a second fin-type active area adjacent to the first fin-type active area. With respect to the vertical cross section, at least one of the first peak and the second peak may be at the same level as a top surface of the substrate between the first and second fin-type active areas. The integrated circuit device may comprise a second fin-type active area adjacent to the first fin-type active area. With respect to the vertical cross section, at least one of the first peak and the second peak may be lower than a lowest point of the top surface of the substrate between the first and second fin-type active areas.

The integrated circuit device may comprise a second fin-type active area adjacent to the first fin-type active area. With respect to the vertical cross section, a lowest point of the recess may be lower than a lowest point of the top surface of the substrate between two adjacent fin-type active areas among the plurality of fin-type active areas. The device isolation layer may comprise an insulating liner covering a side wall of the first fin-type active area and the double-humped protrusion and conformally formed on a top surface of the double-humped protrusion, and a gap-fill insulating layer on the insulating liner, the gap-fill insulating layer covering the side wall of the first fin-type active area and covering the double-humped protrusion. The insulating liner may be formed of different material from the material of the gap-fill insulating layer. The insulating liner may comprise a first insulating liner and a second insulating liner that are sequentially stacked on the side wall of the first fin-type active area and the double-humped protrusion. The first insulating liner may be formed of different material from the material of the second insulating liner.

According to an aspect of the disclosure, an integrated circuit device comprises a substrate comprising a first device region, a second device region, and an inter-device isolation region between the first device region and the second device region, a plurality of fin-type active areas protruding from the substrate, in the first device region and the second device region, a device isolation layer disposed on the substrate at the inter-device isolation region between the first device region and the second device region, wherein the surface of the substrate in the inter-device isolation region comprises a plurality of double-humped protrusions with a plurality of valley portions each between neighboring pairs of the plurality of double-humped protrusions in the inter-device isolation region, a vertical depth of the valley regions being less than a height of the plurality of fin-type active areas, and wherein the device isolation layer covers the plurality of double-humped protrusions and the plurality of valley portions.

The device isolation layer may comprise a corrugated bottom surface facing the substrate, wherein the corrugated bottom surface may comprise a first protrusion surface and a second protrusion surface that protrude downward to different depths. Each of the plurality of double-humped protrusions may comprise a first hump having a first peak, a second hump having a second peak, and a recessed top surface between the first hump and the second hump and lower than the first peak and the second peak, wherein the recessed top surface is higher than a lowest point in the plurality of valley portions. Each of the plurality of valley portions and the recessed top surface may be alternately disposed one by one along a direction extending from the first device region to the second device region. The device isolation layer may comprise a corrugated bottom surface facing the substrate. The corrugated bottom surface may comprise a first protrusion facing the plurality of valley portions and a second protrusion facing the recessed top surface, the first protrusion having a first depth from a top surface of the device isolation layer, and the second protrusion having a second depth from the top surface of the device isolation layer, wherein the second depth may be less than the first depth.

Each of the first hump and the second hump may have both side walls of an asymmetric shape. Sidewalls of the first hump may have different lengths in a vertical direction, and sidewalls of the second hump may have different lengths in the vertical direction. The fin type active areas of the plurality of fin-type active areas may be spaced apart from each other by a first pitch, and the double-humped protrusions of the plurality of double-humped protrusions may be spaced apart from each other by a second pitch that is equal to the first pitch. The fin-type active areas of the plurality of fin-type active areas may be repeatedly formed at a first pitch, and the fin-type active areas of the plurality of double-humped protrusions may be repeatedly formed at a second pitch that is different from the first pitch. Each of the plurality of double-humped protrusions may comprise at least one of a III-V group material and a IV group material.

According to an aspect of the disclosure, a method of manufacturing an integrated circuit device includes forming a plurality of mask patterns in a device region and an inter-device isolation region of a substrate, forming a plurality of grooves in the inter-device isolation region by etching an exposed portion of the substrate located between the plurality of mask patterns in the inter-device isolation region, removing the plurality of mask patterns in the inter-device isolation region, forming a recess in the inter-device isolation region by partially removing a portion of the substrate exposed by the removing of the plurality of mask patterns, and forming at least one fin-type active area in the device region and a double-humped protrusion in the inter-device isolation region on the surface of the substrate, by etching the substrate in the device region and the inter-device isolation region by using the plurality of mask patterns disposed in the device region as an etching mask.

The plurality of grooves may have a first depth from a top surface of the substrate, and wherein the recess may have a depth smaller than the first depth from the top surface of the substrate. The double-humped protrusion may comprise a first hump having a first peak, a second hump having a second peak, and a recessed top surface between the first hump and the second hump and lower than the first peak and the second peak. The forming of the at least one fin-type active area and the double-humped protrusion may comprise etching the substrate such that at least one of the first peak and the second peak is at the same level as a lowest top surface of the substrate adjacent to the at least one fin-type active area. The forming of the plurality of grooves, the removing of the plurality of mask patterns in the inter-device isolation region, and the forming of the recess in the inter-device isolation region may be performed while the device region is covered by a protection mask pattern.

The method may further comprise, during the removing of the plurality of mask patterns in the inter-device isolation region, forming a passivation layer on inner walls of the plurality of grooves. The removing of the plurality of mask patterns in the inter-device isolation region may use etching gas comprising a hydrocarbon compound substituted with fluorine and oxygen. The passivation layer may comprise silicon oxide and polymer. The method may include, after the forming of the recess in the inter-device isolation region and before the forming of the double-humped protrusion, exposing the inner walls of the plurality of grooves by removing the passivation layer. The method may include, after the forming of the recess in the inter-device isolation region, forming a middle trench in the inter-device isolation region, by partially removing the substrate and transferring shapes of the plurality of grooves and the recess to a bottom surface of the middle trench while covering the device region with the protection mask pattern.

The forming of the at least one fin-type active area in the device region and the double-humped protrusion in the inter-device isolation region may include etching the substrate such that at least one of the first peak and the second peak is lower than a top surface of the substrate adjacent to the at least one fin-type active area. The removing of the plurality of mask patterns and the forming of the recess may be performed using the same etching gas. The method may further include forming a device isolation layer covering the double-humped protrusion, wherein the device isolation layer may include a corrugated bottom surface facing the substrate. The corrugated bottom surface may comprise a plurality of first protrusions and a plurality of second protrusions that are alternately disposed one by one, wherein the plurality of first protrusions protrude downward to a first depth from a top surface of the device isolation layer, and the plurality of second protrusions protrude downward to a second depth from the top surface of the device isolation layer, and the second depth may be less than the first depth. The forming of the device isolation layer may include forming an insulating liner on the double-humped protrusion, the insulating liner conformally formed on the double-humped protrusion, and forming a gap-fill insulating layer on the insulating liner, the gap-fill insulating layer covering a side wall of the at least one fin-type active area and the double-humped protrusion.

According to an aspect of the disclosure, a method of manufacturing an integrated circuit device includes steps of forming a plurality of mask patterns in a device region and an inter-device isolation region of a substrate, forming a plurality of fin-type active areas in the device region and the inter-device isolation region by etching the substrate by using the plurality of mask patterns as an etching mask, forming a plurality of double-humped protrusions in the inter-device isolation region by removing the plurality of mask patterns and partially removing the plurality of fin-type active areas in the inter-device isolation region while the plurality of fin-type active areas in the device region are covered by a protection mask pattern and forming a plurality of grooves each between the plurality of double-humped protrusions, exposing the plurality of fin-type active areas in the device region by removing the protection mask pattern, and forming a device isolation layer covering side walls of the plurality of fin-type active areas, the plurality of double-humped protrusions, and the plurality of grooves.

The forming of the plurality of double-humped protrusions may include forming a first hump having a first peak, a second hump having a second peak, and a recessed top surface between the first hump and the second hump by partially removing the plurality of fin-type active areas in the inter-device isolation region, and wherein each of the first hump and the second hump may have both side walls of an asymmetric shape. Lowest point of the recessed top surface may be higher than a lowest point of the plurality of grooves.

The forming of the device isolation layer may include forming an insulating liner including a first insulating material conformally formed on the plurality of double-humped protrusions, and forming a gap-fill insulating layer on the insulating liner, the gap-fill insulating layer including a second insulating material different from the first insulating material and covering the plurality of double-humped protrusions. The method may further include forming a gate insulating layer and a gate line that cover the plurality of fin-type active areas in the device region and cover the plurality of double-humped protrusions in the inter-device isolation region.

According to an aspect of the disclosure, a method of manufacturing an integrated circuit device includes steps of forming a plurality of sacrificial patterns extending in a first direction on a substrate, forming a plurality of spacer mask patterns on the side walls of the sacrificial patterns, removing the plurality of sacrificial patterns from the substrate, forming a plurality of first mask patterns on the substrate using the spacer mask patterns as an etching mask, etching the substrate using the spacer mask patterns and the first mask patterns as an etching mask to form a first double-humped protrusion extending in a first direction in a first region of the substrate and a first fin-type active area extending in the first direction in a second region of the substrate, wherein, as viewed with respect to a vertical cross section taken in a direction perpendicular to the first direction, an upper surface of the first double-humped protrusion comprises a first hump having a first peak, a second hump having a second peak and a recess disposed between the first peak and the second peak, the recess having a depth comprising a vertical distance from the lower most portion of the recess to a height of one of the first peak and second peak, the first double-humped protrusion has a height comprising a vertical distance from a minimum height of a top surface of the substrate immediately adjacent to the double-humped protrusion to a top of one of the first peak and second peak, and the height of the double-humped protrusion is greater than the depth of the recess.

A ratio of the height of the first fin-type active area to the height of the first double-humped protrusion may be between 2 and 4, wherein the height of the first fin-type active area may be a vertical difference from the topmost point of the first fin-type active area to a depth corresponding to minimum height of the substrate immediately adjacent to the fin-type active area. The ratio of the height of the first fin-type active area to the height of the first double-humped protrusion may be between 2.5 and 3. A ratio of the height of the first double-humped protrusion to the depth of the recess may be between 1.2 and 2.5. The ratio of the height of the hump to the depth of the recess is between 1.5 and 2. The height of the first fin-type active area may be less than 180 nm, wherein the height of the first fin-type active area may be a vertical difference from the topmost point of the first fin-type active area to a depth corresponding to minimum height of the substrate immediately adjacent to the fin-type active area. The recess between the first peak and the second peak may have a depth between 10 nm and 50 nm. The height of the first double-humped protrusion may be between 20 nm and 80 nm.

The method may further include a step of forming a protection mask pattern in the second region of the substrate, wherein the protection mask pattern may cover the substrate, the plurality of spacer mask patterns, and the plurality of first mask patterns, wherein the protection mask pattern may protect the substrate of the second region from being etched while a portion of the substrate of the first region is etched.

The method may include forming a passivation layer on the periphery of the plurality of first masks in the first region of the substrate, wherein the passivation layer protects the substrate from being etched while the substrate is etched in an area where the passivation layer is not formed in the first region.

According to an aspect of the disclosure, an integrated circuit device includes a substrate having a top surface forming a plurality of double-humped protrusions, including a first double-humped protrusion, in a first region of a substrate, and a fin-type active area in a second region of the substrate, wherein the ratio of the height of the first fin-type active area to the height of a hump of the first double-humped protrusions is between 2 and 4, the height of the fin-type active area is a vertical distance from a top surface of the first fin-type active area to a depth corresponding to a minimum height of the substrate immediately adjacent to the first fin-type active area, wherein the height of the hump is a vertical distance from a top surface of the hump to a depth corresponding to a minimum height of the substrate immediately adjacent to the first double-humped protrusion.

The ratio of the height of the first fin-type active area to the height of the hump of the first double-humped protrusion may be between 2.5 and 3. The first double-humped protrusion may include a recess between adjacent humps and ratios of the heights of the humps to the depth of the recess are between 1.2 and 2.5. The ratios of the height of the humps to the depth of the recess may be between 1.5 and 2. The depth of the recess may be between 10 nm and 50 nm. The height of the first fin-type active area may be less than 180 nm. The heights of the humps of the first double-humped protrusions may be between 20 nm and 80 nm. The first region may be an inter-device isolation region, and the second region is a device region. The device may further include a second fin-type active area formed in a third region of the substrate, wherein the first fin-type active area may form a first transistor having a channel region doped with n-type impurities, and the second fin-type active area forms a second transistor having a channel region doped with p-type impurities. The device may include a device isolation layer extending from a sidewall of the first fin-type active area to a sidewall of the second fin-type active area and covering the plurality of double-humped protrusions disposed between the first fin-type active area and the second fin-type active area.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1A:
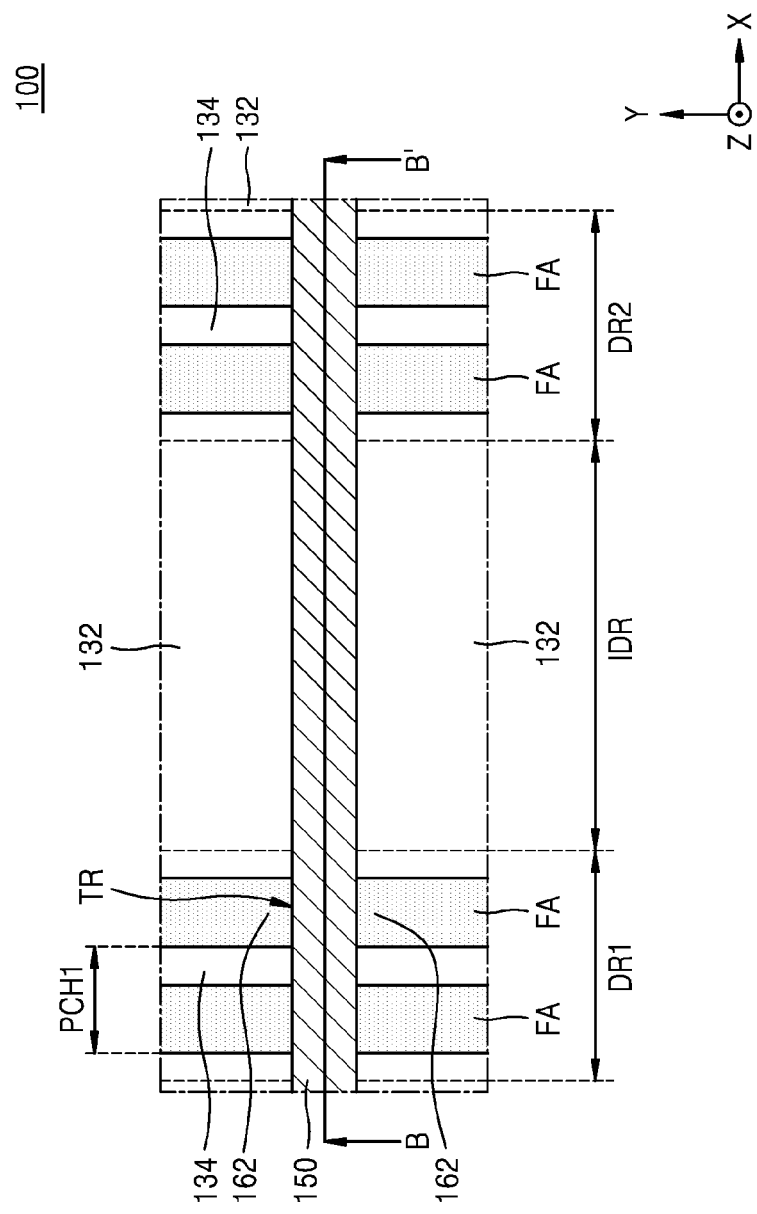
FIG. 1A is a plan layout diagram of main elements of an integrated circuit device according to certain exemplary embodiments.

Hereinafter, aspects of the inventive concept will be described in detail by explaining exemplary embodiments of the invention with reference to the attached drawings. Like reference numerals in the drawings denote like elements, and thus their description will be omitted. As used herein, the term "and/or" includes any and all combinations of one or more of the associated listed items. Expressions such as "at least one of," when preceding a list of elements, modify the entire list of elements and do not modify the individual elements of the list.

The inventive concept may be embodied in many different forms and should not be construed as limited to the exemplary embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, lengths and sizes of layers and areas may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Also, though terms like 'first' and 'second' are used to describe various elements, components, areas, layers, and/or portions in various embodiments of the inventive concept, the elements, components, areas, layers, and/or portions should not be limited by these terms. These terms are only used to distinguish one element, component, area, layer, or portion from another. Thus, a first element, component, area, layer or section discussed below could be termed a second element, component, area, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of areas illustrated herein but are to include deviations in shapes that result, for example, from manufacturing. A term such as "substrate" may denote a substrate itself, or a stack structure including a substrate and predetermined layers or films formed on a surface of the substrate. In addition, a term "surface of substrate" may denote an exposed surface of the substrate itself, or an external surface of a predetermined layer or a film formed on the substrate.

Figure 1B:
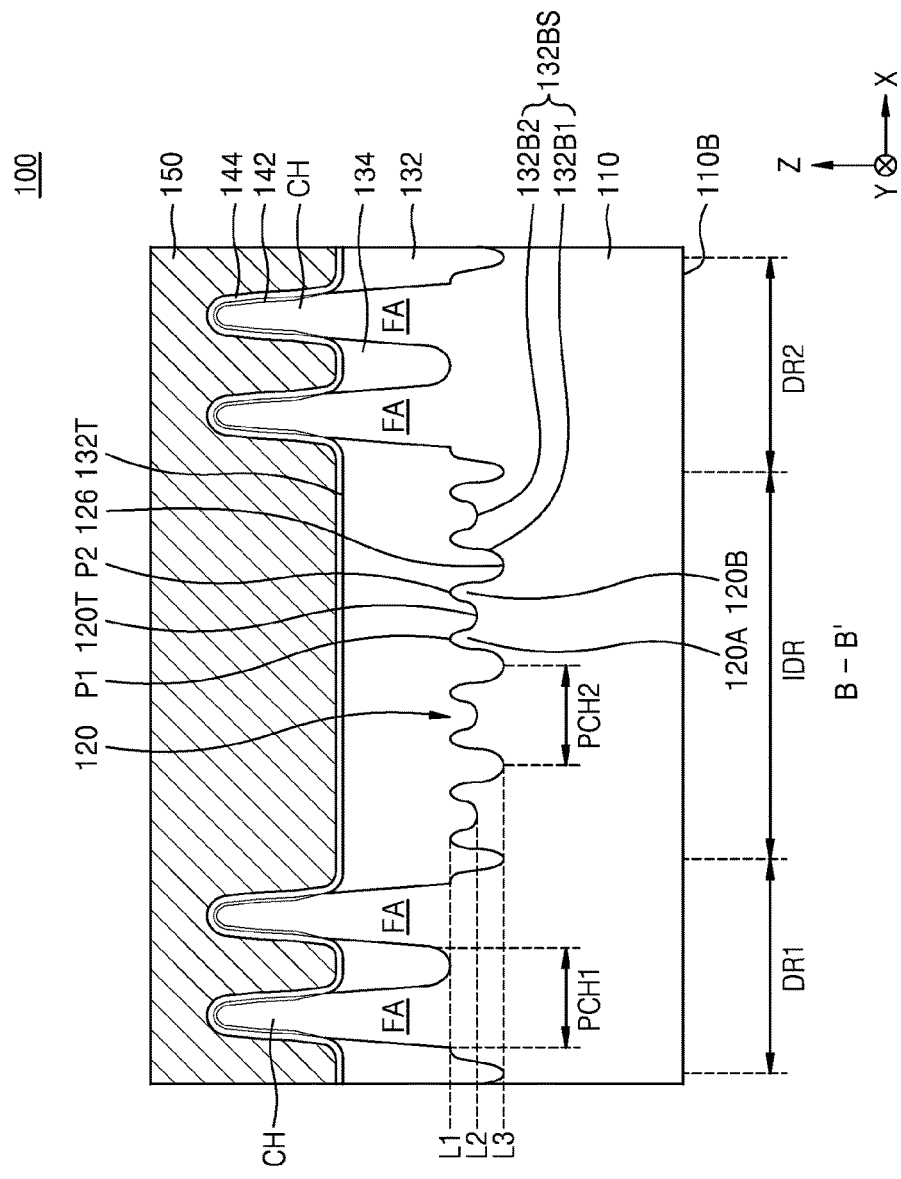
FIG. 1B is a cross-sectional view of the integrated circuit device taken along a line B-B' of FIG. 1A.

FIGS. 1A and 1B are diagrams illustrating main elements of an integrated circuit device 100 according to exemplary embodiments. FIG. 1A is a plan layout diagram of the integrated circuit device 100. FIG. 1B is a cross-sectional view of the integrated circuit device 100 taken along a line B-B' of FIG. 1A.

Referring to FIGS. 1A and 1B, the integrated circuit device 100 may include a substrate 110 having a main surface extending in a horizontal direction (X and Y directions of FIG. 1). The main surface of the substrate 110 may be the active surface of the integrated circuit device 100 and may be a surface in or on which a majority of the circuits of the integrated circuit device 100 are formed. The substrate 110 may include a plurality of device regions DR1 and DR2 that are spaced apart from each other and an inter-device isolation region IDR disposed between the plurality of device regions DR1 and DR2. The plurality of device regions DR1 and DR2 may include a first device region DR1 and a second device region DR2 that are spaced apart from each other with the inter-device isolation region IDR interposed between the first device region DR1 and the second device region DR2.

At least one fin-type active area FA protruding from the substrate 110 may be formed in each of the plurality of device regions DR1 and DR2. FIGS. 1A and 1B show an example in which two fin-type active areas FA are formed in each of device regions DR1 and DR2, but the exemplary embodiments of the inventive concept are not limited to the example of the attached drawings. For example, one fin-type active area FA or three or more fin-type active areas FA may be formed in each of the plurality of device regions DR1 and DR2, and different numbers of fin-type active areas FA may be formed in the plurality of device regions DR1 and DR2. For example, the number of fin-type active areas FA of a first device region DR1 may be different from the number of fin-type active areas FA of a second device region DR2.

At least one double-humped protrusion 120 may be formed on a surface of the inter-device isolation region IDR included in the substrate 110. FIG. 1B shows an example of four double-humped protrusions 120 formed in the single inter-device isolation region IDR but the exemplary embodiments of the inventive concept are not limited to the example of the attached drawings. According to certain exemplary embodiments of the inventive concept, one double-humped protrusion 120 or a plurality of double-humped protrusions 120 may be formed in the inter-device isolation region IDR according to a layout design of a device that is to be formed, and the number of the plurality of double-humped protrusions 120 may be variously selected.

A device isolation layer 132 covering the at least one double-humped protrusion 120 may be formed on the inter-device isolation region IDR. A shallow trench isolation (STI) layer 134 may be formed between the plurality of fin-type active areas FA on the plurality of device regions DR1 and DR2. A depth of the STI layer 134 may be smaller than that of the device isolation layer 132.

The plurality of fin-type active areas FA may protrude from the substrate 110 in a direction (Z direction) perpendicular to the main surface of the substrate 110 and may extend in parallel to each other along one direction (Y direction of FIGS. 1A and 1B) on the substrate 110.

Each of the plurality of fin-type active areas FA may have a lower side wall covered by the device isolation layer 132 and/or the STI layer 134. Channel areas CH may be formed on the plurality of fin-type active areas FA protruding from the device isolation layer 132 and the STI layer 134.

The substrate 110 may include semiconductor such as Si and Ge, or compound semiconductor such as SiGe, SiC, GaAs, InAs, and InP. In some exemplary embodiments, the substrate 110 may include at least one of a group III-V material and a group IV material. The group III-V material may include a binary, a trinary, or a quaternary compound including at least one group III element and at least one group V element. The group III-V material may be a compound including at least one element of In, Ga, and Al as the group III element and at least one element of As, P, and Sb as the group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb and GaSb. The trinary compound may be one of InGaP, InGaAs, AlInAs, InGaSb, GaAsSb and GaAsP. The group IV material may be Si or Ge. However, the exemplary embodiments of the inventive concept are not limited to the above examples of the group III-V material and the group IV material. The group III-V material and the group IV material such as Ge may be used as channel materials for forming a transistor having a low power consumption and a high operating speed. A high performance complementary metal oxide semiconductor (CMOS) may be fabricated by using a semiconductor substrate including the group III-V material, e.g., GaAs, having a higher electron mobility than the electron mobility of an Si substrate, and a semiconductor substrate having a semiconductor material, e.g., Ge, having a higher hole mobility than the hole mobility of the Si substrate. In some exemplary embodiments, when an NMOS transistor is formed on the substrate 110, the substrate 110 may include one of the group III-V materials explained above. In some exemplary embodiments, when a PMOS transistor is formed on the substrate 110, at least a part of the substrate 110 may include Ge. In certain exemplary embodiments, the substrate 110 may have a silicon-on-insulator (SOI) structure. The substrate 110 may include a conductive area, for example, a well doped with impurities or a structure doped with impurities.

In some exemplary embodiments, the channel areas CH of the plurality of fin-type active areas FA may include a single material. For example, the plurality of fin-type active areas FA including the channel areas CH may include Si. In some exemplary embodiments, some of the plurality of fin-type active areas FA may include Ge, and others of the plurality of fin-type active areas FA may include Si.

FIG. 1B shows a case where both side walls of each of the plurality of fin-type active areas FA are formed to have an approximately symmetric profile shape. However, the exemplary embodiments of the inventive concept are not limited to the example shown in FIG. 1B. Both side walls of at least some of the plurality of fin-type active areas FA may have an asymmetric profile shape.

The double-humped protrusion 120 formed in the inter-device isolation region IDR may include a first hump 120A having a first peak P1 and a second hump 120B having a second peak P2. The double-humped protrusion 120 may include a recessed top surface 120T defined by the first hump 120A and the second hump 120B between the first peak P1 and the second peak P2.

Both side walls of the first hump 120A of the double-humped protrusion 120 may have an asymmetric shape with respect to the first peak P1. Both side walls of the second hump 120B of the double-humped protrusion 120 may have an asymmetric shape with respect to the second peak P2.

The first peak P1 and the second peak P2 may be located at higher levels than the level of the recessed top surface 120T. The level of the first peak P1 and the level of the second peak P2 may be the same or similar. The term "level" used in the present specification may mean a vertical height from a bottom surface 110B of the substrate 110.

In the plurality of device regions DR1 and DR2, a first level L1 of a top surface of the substrate 110 between two adjacent fin-type active areas FA among the plurality of fin-type active areas FA may be higher than a second level L2 of a lowest point of the recessed top surface 120T of the double-humped protrusion 120. The level of the first peak P1 and the level of the second peak P2 may be the same as or similar to the first level L1. The top surface of the substrate 110 at a location midway between two adjacent fin-type active areas FA may be a lowest point of the top surface of the substrate 110 between the two adjacent fin-type active areas FA as viewed in a cross section taken and perpendicular to the fin-type active areas FA (such as shown in FIG. 1B).

For example, the top surface of the substrate 110 at a location midway between two adjacent fin-type active areas FA may be the lowest point of the top surface of the substrate 110 between the two adjacent fin-type active areas FA as viewed in a cross section taken and perpendicular to the fin-type active areas FA. For example, the first level L1 of FIG. 1B may represent the level of the lowest point of the top surface of the substrate 110 at a location midway between the two adjacent fin-type active areas FA. The height of the fin active area FA may be a vertical distance between the highest point of a fin active area FA and the lowest point of the top surface of the substrate 110 between the two adjacent fin-type active areas FA.

In certain embodiments, the height of the fin-type active areas FA with respect to the height of the lowest point of the top surface of the substrate 110 between two adjacent fin-type active area FA may be about 160 nm or less or 140 nm or less. For example, this height of the fin-type active areas FA may be in a range 140±20 nm. For example, this height of the fin-type active areas FA may be in a range between 120 nm and 160 nm. In certain embodiments, this height of the fin-type active areas FA may be in a range 140±40 nm. For example, this height of the fin-type active areas FA may be in a range between 100 nm and 180 nm. For example, the height of a fin-type active area may be the difference between a first line connecting two respective top points of adjacent two fin-type active areas and a second line parallel to the first line and passing through a lowest point of the upper surface of the fin-type active area forming layer between the two adjacent fin-type active areas.

For example, the difference between the first level L1 and the second level L2 may represent the depth of the recessed top surface 120T from the peaks P1 and P2 of a double-humped protrusion 120 in FIG. 1B. The depth of the recessed top surface 120T from the peaks P1 and P2 of a double-humped protrusion 120 may be about 30 nm. For example, the depth of the recessed top surface 120T from the peaks P1 and P2 of a double-humped protrusion 120 may be in a range of 30±10 nm. For example, the depth of the recessed top surface 120T from the peaks P1 and P2 of a double-humped protrusion 120 may be in a range between 20 nm and 40 nm. In certain embodiments, the depth of the recessed top surface 120T from the peaks P1 and P2 of a double-humped protrusion 120 may be in a range of 30±20 nm. For example, the depth of the recessed top surface 120T from the peaks P1 and P2 of a double-humped protrusion 120 may be in a range between 10 nm and 50 nm. For example, the depth of the recessed top surface may be a distance between a third line connecting two peaks P1 and P2 of the respective humps of the double-humped protrusion 120 and a fourth line parallel to the third line and passing through the lowest point of the upper surface of the double-humped protrusion forming layer between the two humps of the double-humped protrusion.

The inter-device isolation region DR may further include a plurality of valley portions 126 respectively disposed at each side of each of the double-humped protrusions 120. A third level L3 of a lowest point of the valley portion 126 may be lower than the first level L1 and may be lower than the second level L2.

For example, the difference between the first level L1 and the third level L3 may represent the height of peaks P1 and P2 from a lowest point of the valley portion 126 in FIG. 1B. The height of the peaks P1 and P2 from the lowest point of the valley portion 126 may be about 50 nm. For example, the height of the peaks P1 and P2 from the lowest point of the valley portion 126 may be in a range of 50±15 nm. For example, the height of the peaks P1 and P2 from the lowest point of the valley portion 126 may be in a range between 35 nm and 65 nm. In certain embodiments, the height of the peaks P1 and P2 from the lowest point of the valley portion 126 may be in a range of 50±30 nm. For example, the difference between the first level L1 and the third level L3 may be in a range between 20 nm and 80 nm. For example, the height of the peaks P1 and P2 may be the distance between a third line connecting the two peaks P1 and P2 of the respective humps of a double-humped protrusion 120 and a fifth line parallel to the third line passing through the lowest point of the upper surface of the double-humped protrusion forming layer between two adjacent double-humped protrusions.

In the inter-device isolation region IDR, the plurality of double-humped protrusions 120 may be arranged along a direction (X direction) from the first device region DR1 to the second device region DR2 such that the valley portion 126 and the recessed top surface 120T are alternately arranged in the X direction.

The plurality of fin-type active areas FA may be repeatedly formed at a first pitch PCH1 in the plurality of device regions DR1 and DR2. For example, a plurality of fin-type active areas FA may be formed in each of the device regions DR1 and DR2 at a first pitch PCH1 in the X direction. For example, the first pitch PCH1 may be about 80 nm. For example, the first pitch PCH1 may be in a range of 80±20 nm. For example, the first pitch may be in a range between 60 nm and 100 nm. In certain embodiments, the first pitch PCH1 may be in a range of 80±40 nm. For example the first pitch PCH1 may be in a range between 40 nm and 120 nm. In the inter-device isolation regions IDR, the plurality of double-humped protrusions 120 may be repeatedly formed at a second pitch PCH2. The first pitch PCH1 and the second pitch PCH2 may be the same or similar. For example, the second pitch PCH2 may be in a range substantially the same as the range described above with respect to the first pitch PCH1.

In some exemplary embodiments, in the double-humped protrusion 120, the first hump 120A and the second hump 120B may be symmetric with respect to the recessed top surface 120T. Both side walls of each of the first hump 120A and the second hump 120B may have an asymmetric shape. Vertical lengths (lengths along a Z direction) of both side walls of each of the first hump 120A and the second hump 120B may be different from each other. For example, the vertical length of one side wall of a hump 120A or 120B of a double-humped protrusion 120 may be different from the vertical length of the other side wall of each hump 120A or 120B. As shown in FIG. 1B, in the first hump 120A, a vertical length of side walls extending to the valley portion 126 from the first peak P1 may be greater than a vertical length of side walls extending to the recessed top surface 120T from the first peak P1. Similarly, in the second hump 120B, a vertical length of side walls extending to the valley portion 126 from the second peak P2 may be greater than a vertical length of side walls extending to the recessed top surface 120T from the second peak P2.

The double-humped protrusion 120 may constitute a part of the substrate 110 and may include the same material as that of the substrate 110. In some exemplary embodiments, the double-humped protrusion 120 may include at least one of a group III-V material and a group IV material. Further details of the material of the double-humped protrusion 120 are the same as those described with respect to the substrate 110 above.

The device isolation layer 132 may include a corrugated bottom surface 132BS facing the substrate 110. The corrugated bottom surface 132BS may include a plurality of alternately arranged first protrusion surfaces 132B1 and second protrusion surfaces 132B2. The plurality of first protrusion surfaces 132B1 may protrude, for example downwardly, from the top surface 132T of the device isolation layer 132 to a depth corresponding to the third level L3. For example, the device isolation layer 132 may have a plurality of first downward protrusions reaching to the third level L3. The plurality of second protrusion surfaces 132B2 may protrude, for example downwardly, from the top surface 132T of the device isolation layer 132 to a depth corresponding to the second level L2. For example, the device isolation layer 132 may have a plurality of second protrusions reaching to the second level L2.

In some exemplary embodiments, the device isolation layer 132 may include a silicon-containing insulating layer such as a silicon oxide layer, a silicon nitride layer, a silicon oxynitride layer, and a silicon tantalum carbonitride film, polysilicon, or a combination thereof. For example, the device isolation layer 132 may include a film formed by a deposition process or a coating process. In some exemplary embodiments, the device isolation layer 132 may include an oxide layer formed by a flowable chemical vapour deposition (FCVD) process or a spin coating process. For example, the device isolation layer 132 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

The channel area CH of a fin-type active area FA may be covered by an interfacial layer 142. A gate insulating layer 144 and a gate line 150 that cover both side walls and a top surface of the fin-type active area FA may be sequentially formed on the interfacial layer 142. The gate insulating layer 144 and the gate line 150 may extend in a direction crossing a direction in which the fin-type active area FA extends (X direction in FIGS. 1A and 1B). For example, the gate line 150 may cross the fin-type active area FA. For example, the gate line 150 may extend in X direction, and the fin-type active area may extend in Y direction that is perpendicular to X direction.

A transistor TR may be formed on a portion where the fin-type active area FA and the gate line 150 cross each other. The transistor TR may be a metal oxide semiconductor (MOS) transistor having a three-dimensional structure in which a channel is formed on the top surface and both side walls of the fin-type active area FA. The transistor TR may configure an NMOS transistor or a PMOS transistor.

In some exemplary embodiments, the interfacial layer 142 may be obtained by oxidizing the surface of the fin-type active area FA. The interfacial layer 142 may contact the fin-type active area FA. The interfacial layer 142 may repair interfacial defects between the fin-type active area FA and the gate insulating layer 144. For example, the interfacial layer 142 may electrically insulate gate line 150 from the fin-type active area FA, for example, in an area that the gate insulating layer 144 has a defect.

In some exemplary embodiments, the interfacial layer 142 may include a low dielectric material layer having a dielectric constant of 9 or less, e.g., a silicon oxide layer, a silicon oxynitride layer, or a combination thereof. In some other exemplary embodiments, the interfacial layer 142 may include silicate, a combination of the silicate and a silicon oxide layer, or a combination of the silicate and a silicon oxynitride layer. In some exemplary embodiments, the interfacial layer 142 may have a thickness in a range from about 5 Å to about 20 Å, but is not limited thereto. In some exemplary embodiments, the interfacial layer 142 may be omitted. For example, in some embodiments, the gate insulating layer 144 may contact the fin-type active area FA.

The gate insulating layer 144 may include a material having a dielectric constant greater than that of the interfacial layer 142. For example, the gate insulating layer 144 may have a dielectric constant of about 10 to about 25. The gate insulating layer 144 may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The gate insulating layer 144 may be formed by an atomic layer deposition (ALD), a chemical vapour deposition (CVD), or physical vapor deposition (PVD) process. The gate insulating layer 144 may have a thickness in a range from about 10 Å to about 40 Å, but is not limited thereto.

The gate line 150 may include a layer containing metal for adjusting a work function, and a layer containing metal for filling a gap formed on an upper portion of the layer containing metal for adjusting the work function. In some exemplary embodiments, the gate line 150 may have a structure in which a metal nitride layer, a metal layer, a conductive capping layer, and a gap-fill metal layer are sequentially stacked. The metal nitride layer and the metal layer may each include at least one metal material selected from Ti, W, Ru, Nb, Mo, Hf, Ni, Co, Pt, Yb, Tb, Dy, Er, and Pd. The metal nitride layer and the metal layer may be formed by the ALD process, a metal organic ALD (MOALD) process, or a metal organic CVD (MOCVD) process. The conductive capping layer may act as a protective layer for preventing oxidation of a surface of the metal layer. For example, the conductive capping layer may act as a wetting layer to ease a deposition of another conductive layer on the metal layer. The conductive capping layer may include a metal nitride layer, e.g., TiN, TaN, or a combination thereof, but is not limited thereto. The gap-fill metal layer may extend on the conductive capping layer. The gap-fill metal layer may include a W layer. The gap-fill metal layer may be formed by an ALD, a CVD, or a PVD process. The gap-fill metal layer may be embedded in a recess space formed by a step between areas on an upper surface of the conductive capping layer without a void. For example, the gap-fill metal layer may be formed in a recess area or in a step area on an upper surface of the conductive capping layer. In some exemplary embodiments, the gate line 150 may include a stack structure of TiAlC/TiN/W, a stack structure of TiN/TaN/TiAlC/TiN/W, or a stack structure of TiN/TaN/TiN/TiAlC/TiN/W. In the above stack structures, a TiAlC layer or a TiN layer may function as a layer containing metal for adjusting the work function.

As illustrated in FIG. 1A, a pair of source and drain areas 162 may be formed on both sides of the gate line 150 in a fin-type active area FA. The pair of source and drain areas 162 may include a semiconductor layer that is epitaxially grown from a recessed area (not shown) formed by etching a part of the fin-type active area FA. For example, a recess area may be formed in the fin-type active area FA by etching a portion of the fin-type active area FA, and a source/drain area 162 may be formed in the recess area by growing an epitaxial semiconductor layer. The source and drain areas 162 may have an embedded SiGe structure including a Si layer that is epitaxially grown, an SiC layer that is epitaxially grown, and a plurality of SiGe layers that are epitaxially grown.

In the integrated circuit device 100 described with reference to FIGS. 1A and 1B, the at least one double-humped protrusion 120 may be formed on the surface of the inter-device isolation region IDR disposed between the adjacent two device regions DR1 and DR2. The double-humped protrusion 120 may have a structure obtained during a process of manufacturing a highly integrated semiconductor device for obtaining optimized operating characteristics and improving performance of the highly integrated semiconductor device. For example, the integrated circuit device 100 according to the exemplary embodiment of the inventive concept may be beneficial to control leakage current in a highly scaled fin-type field effect transistor (FET).

Figure 2:
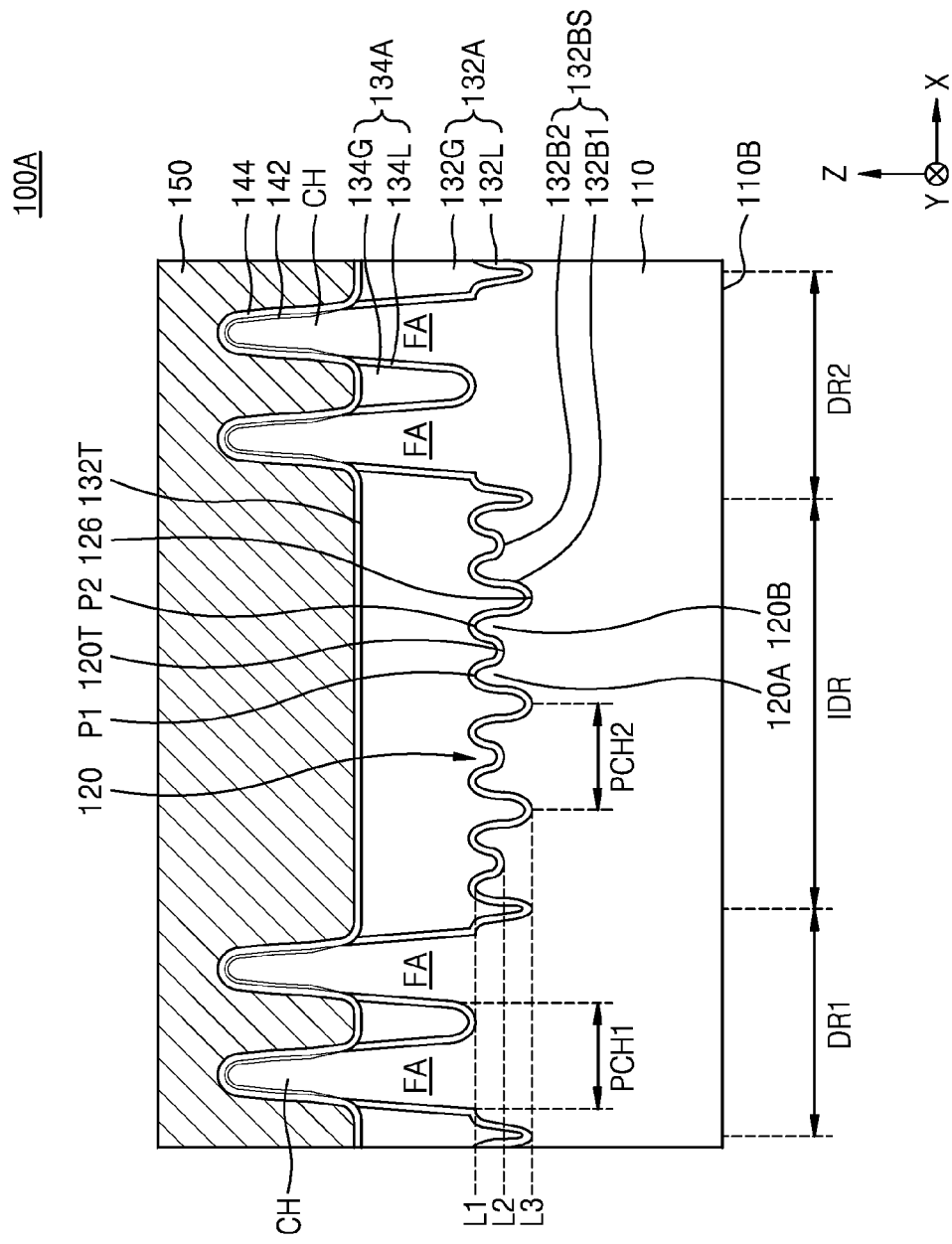
FIG. 2 is a cross-sectional view of an integrated circuit device according to certain exemplary embodiments.

FIG. 2 is a cross-sectional view of an integrated circuit device 100A according to certain exemplary embodiments. In FIG. 2, like reference numerals as those of FIGS. 1A and 1B denote like elements, and detailed descriptions of the elements will be omitted.

Referring to FIG. 2, the integrated circuit device 100A may generally have the same configuration as the integrated circuit device 100 illustrated in FIGS. 1A and 1B, except that the integrated circuit device 100A may include a device isolation layer 132A including an insulating liner 132L and a gap-fill insulating layer 132G, instead of the device isolation layer 132 of the integrated circuit device 100 illustrated in FIGS. 1A and 1B. The integrated circuit device 100A may include an STI layer 134A including an insulating liner 134L and a gap-fill STI layer 134G, instead of the STI layer 134 of the integrated circuit device 100 illustrated in FIGS. 1A and 1B.

The insulating liner 132L may extend to cover a side wall of at least one fin-type active area FA and a double-humped protrusion 120. The insulating liner 132L may wind and extend in correspondence with a top surface profile of the double-humped protrusion 120 on the inter-device isolation region DR. For example, the insulating liner 132L may be conformally formed on the double-humped protrusion 120 in the inter-device isolation region IDR. The gap-fill insulating layer 132G may be formed on the insulating liner 132L to cover the side wall of the at least one fin-type active area FA and the double-humped protrusion 120.

The insulating liner 134L constituting the STI layer 134A may extend on the plurality of device regions DR1 and DR2 to cover a lower side wall of at least one fin-type active area FA. The gap-fill STI layer 134G may be formed on the insulating liner 134L to cover the lower side wall of the at least one fin-type active area FA.

In some exemplary embodiments, materials of the insulating liners 132L and 134L may be different from those of the gap-fill insulating layer 132G and the gap-fill STI layer 134G. In some other exemplary embodiments, the materials of the insulating liners 132L and 134L may be the same as those of the gap-fill insulating layer 132G and the gap-fill STI layer 134G.

In some exemplary embodiments, the insulating liners 132L and 134L may include materials applying stress to the channel area CH of the fin-type active area FA. The insulating liners 132L and 134L may act to improve carrier mobility in the channel area CH by applying stress to the channel area CH. For example, if the channel area CH is an N type channel area, the insulating liners 132L and 134L may include materials applying a tensile stress to the channel area CH. For example, the insulating liners 132L and 134L may include SiN (silicon nitride), SiON (silicon oxynitride), SiBN (silicon boronitride), SiC (silicon carbide), SiC:H, SiCN, SiCN:H, SiOCN, SiOCN:H, SiOC (silicon oxycarbide), SiO$_2$ (silicon dioxide), polysilicon, or a combination thereof.

In some exemplary embodiments, the insulating liners 132L and 134L may have thicknesses in a range from about 10 Å to about 100 Å.

In some exemplary embodiments, the gap-fill insulating layer 132G and the gap-fill STI layer 134G may include oxide layers. In some exemplary embodiments, the gap-fill insulating layer 132G and the gap-fill STI layer 134G may include oxide layers formed by a deposition process or a coating process. In some exemplary embodiments, the gap-fill insulating layer 132G and the gap-fill STI layer 134G may include oxide layers formed by a flowable chemical vapor deposition (FCVD) process or a spin coating process.

For example, the gap-fill insulating layer 132G and the gap-fill STI layer 134G may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but are not limited thereto.

Figure 3:
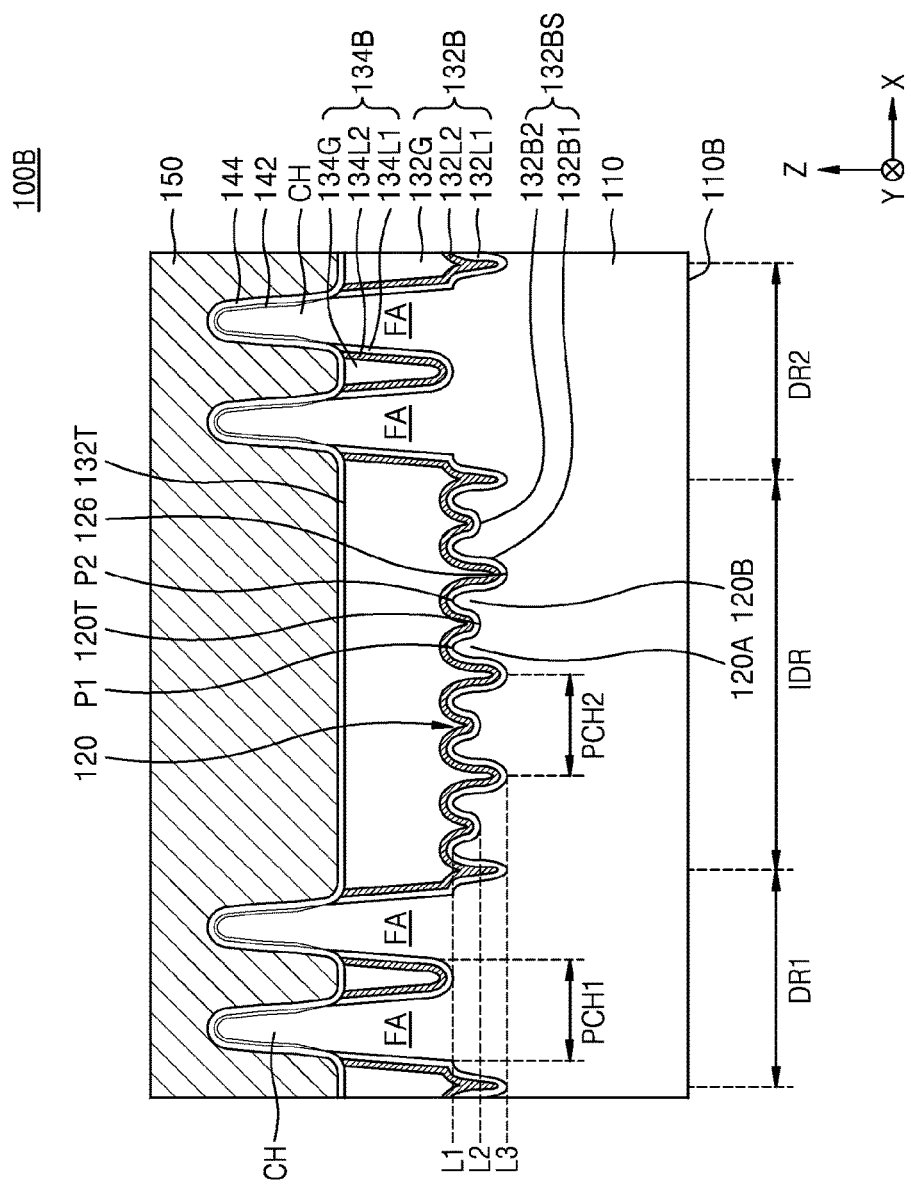
FIG. 3 is a cross-sectional view of an integrated circuit device according to certain exemplary embodiments.

FIG. 3 is a cross-sectional view of an integrated circuit device 100B according to certain exemplary embodiments. In FIG. 3, like reference numerals as those of FIGS. 1A through 2 denote like elements, and detailed descriptions of the elements will be omitted.

Referring to FIG. 3, the integrated circuit device 100B may generally have the same configuration as the integrated circuit device 100 illustrated in FIGS. 1A and 1B, except that the integrated circuit device 100B may include a device isolation layer 132B including insulating liners 132L1 and 132L2 of a bi-layer structure and the gap-fill insulating layer 132G, instead of the device isolation layer 132 of the integrated circuit device 100 illustrated in FIGS. 1A and 1B. The integrated circuit device 100B may include an STI layer 134B including insulating liners 134L1 and 134L2 of a bi-layer structure and the gap-fill STI layer 134G, instead of the STI layer 134 of the integrated circuit device 100 illustrated in FIGS. 1A and 1B.

The insulating liners 132L1 and 132L2 of the bi-layer structure may include a first insulating liner 132L1 and a second insulating liner 132L2 that sequentially cover a side wall of the at least one fin-type active area FA and the double-humped protrusion 120. The insulating liners 132L1 and 132L2 of the bi-layer structure may wind and extend in correspondence with a top surface profile of the double-humped protrusion 120 on the inter-device isolation region IDR. For example, the insulating liners 132L1 and 132L2 may be conformally formed on the double-humped protrusion 120 in the inter-device isolation region IDR. The gap-fill insulating layer 132G may be formed on the insulating liners 132L1 and 132L2 of the bi-layer structure to cover both side walls of the at least one fin-type active area FA and the double-humped protrusion 120. For example, the gap-fill insulating layer 132G may be formed on the insulating liners 132L1 and 132L2 and to cover at least one of the side walls of fin-type active areas FA and at least one of the double-humped protrusions 120.

The insulating liners 134L1 and 134L2 of the bi-layer structure constituting the STI layer 134B may include a first insulating liner 134L1 and a second insulating liner 134L2 that sequentially cover a lower side wall of the at least one fin-type active area FA on the plurality of device regions DR1 and DR2. The gap-fill STI layer 134G may be formed on the insulating liners 134L1 and 134L2 of the bi-layer structure to cover the lower side wall of the at least one fin-type active area FA.

In some exemplary embodiments, more details of materials of the insulating liners 132L1 and 132L2 of the bi-layer structure and the insulating liners 134L1 and 134L2 of the bi-layer structure are the same as those materials of the insulating liners 132L and 132L described with reference to FIG. 3. For example, the first insulating liners 132L1 and 134L1 may include oxide layers, and the second insulating liners 132L2 and 134L2 may include SiN, SiON, SiBN, SiC, SiC:H, SiCN, SiCN:H, SiOCN, SiOCN:H, SiOC, SiO$_2$, polysilicon, or a combination thereof. In some exemplary embodiments, the insulating liners 132L1 and 132L2 and the insulating liners 134L1 and 134L2 of the bi-layer structure may have thicknesses in a range from about 10 Å to about 100 Å.

More detailed configurations of the gap-fill insulating layer 132G and the gap-fill STI layer 134G are the same as those described with reference to FIG. 2 above.

Figure 4:
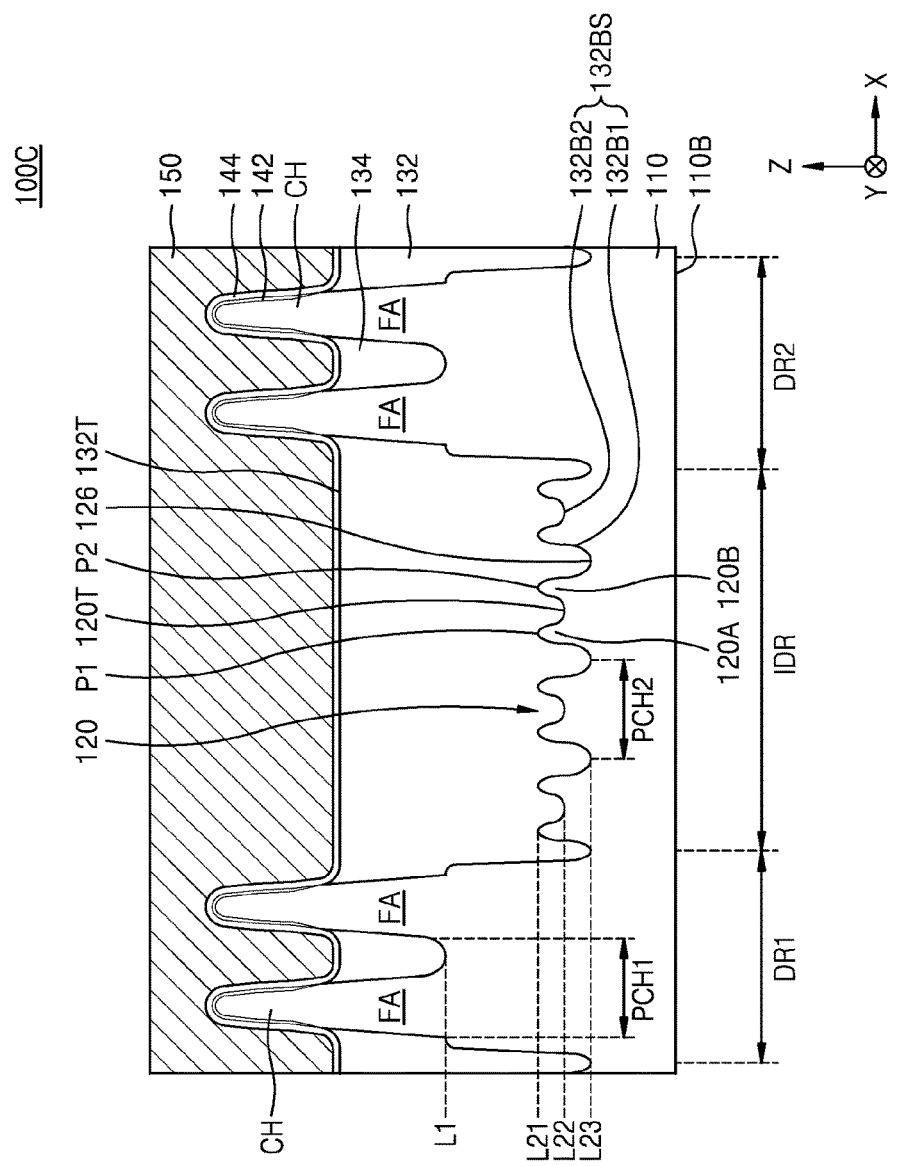
FIG. 4 is a cross-sectional view of an integrated circuit device according to certain exemplary embodiments.

FIG. 4 is a cross-sectional view of an integrated circuit device 100C according to certain exemplary embodiments. In FIG. 4, like reference numerals as those of FIGS. 1A and 1B denote like elements, and detailed descriptions of the elements will be omitted.

Referring to FIG. 4, the integrated circuit device 100C may generally have the same configuration as the integrated circuit device 100 illustrated in FIGS. 1A and 1B, except that in the integrated circuit device 100C, the first level L1 of a top surface of the substrate 110 between two adjacent fin-type active areas FA among the plurality of fin-type active areas FA may be higher than a level L21 of the first peak P1 and the second peak P2 of the double-humped protrusion 120.

For example, the top surface of the substrate 110 between two adjacent fin-type active areas FA may be the lowest point of the top surface of the substrate 110 between the two adjacent fin-type active areas FA. The first level L1 in FIG. 4 may represent the lowest point of the top surface of the substrate 110 between the two adjacent fin-type active areas FA. The height of the fin-type active areas FA may be substantially the same as the height of the fin-type active areas FA described above with respect to FIG. 1B. For example, the height of a fin-type active area may be the difference between a first line connecting two respective top points of adjacent two fin-type active areas and a second line parallel to the first line and passing through a lowest point of the upper surface of the fin-type active area forming layer between the two adjacent fin-type active areas.

In the inter-device isolation region IDR, a level L22 of the lowest point in a recessed top surface 120T of the double-humped protrusions 120 may be lower than the level L21 of the first peak P1 and the second peak P2. A third level L23 of the lowest point of the valley portion 126 at both sides of each of the double-humped protrusions 120 may be lower than a level L22 of the lowest point in the recessed top surface 120T.

For example, the difference between the level L21 and the level L22 may represent the depth of the recessed top surface 120T from the peaks P1 and P2 of a double-humped protrusion 120 in FIG. 4. The depth of the recessed top surface 120T from the peaks P1 and P2 of the double-humped protrusion 120 may be substantially the same as the depth of the recessed top surface 120T from the peaks P1 and P2 of the double-humped protrusion 120 described above with respect to FIG. 1B.

For example, the difference between the level L21 and the level L23 may represent the height of peaks P1 and P2 from a lowest point of the valley portion 126 in FIG. 4. The height of the peaks P1 and P2 from the lowest point of the valley portion 126 may be substantially the same as the height of the peaks P1 and P2 from the lowest point of the valley portion 126 described above with respect to FIG. 1B. For example, the height of the peaks P1 and P2 may be the distance between a third line connecting two peaks P1 and P2 of the respective humps of a double-humped protrusion and a fifth line parallel to the third line and passing through the lowest point of the upper surface of the double-humped protrusion forming layer between two adjacent double-humped protrusions.

In certain embodiments, the ratio of the height of the fin-type active areas FA to the height of the peaks P1 and P2 from the lowest point of the valley portion 126 may be about 14/5. For example, the ratio of the height of the fin-type active area FA to the height of the peaks P1 and P2 of a double-humped protrusion 120 from a lowest point 126 of two adjacent double-humped protrusions 120 may be between 2.5 and 3. In certain embodiments, the ratio of the height of the fin-type active area FA to the height of the peaks P1 and P2 of a double-humped protrusion 120 from a lowest point 126 of two adjacent double-humped protrusions 120 may be between 2 and 4. For example, the height of a fin-type active area may be the difference between a first line connecting two respective top points of adjacent two fin-type active areas and a second line parallel to the first line and passing through a lowest point of the upper surface of the fin-type active area forming layer between the two adjacent fin-type active areas.

In certain embodiments, the ratio of the height of the peaks P1 and P2 of a double-humped protrusion 120 from a lowest point 126 of two adjacent double-humped protrusions 120 to the depth of the recessed top surface 120T from the peaks P1 and P2 of the double-humped protrusion 120 may be about 5/3. For example, the ratio of the height of the peaks P1 and P2 of a double-humped protrusion 120 from a lowest point 126 of two adjacent double-humped protrusions 120 to the depth of the recessed top surface 120T from the peaks P1 and P2 of the double-humped protrusion 120 may be between 1.5 and 2. In certain embodiments, the ratio of the height of the peaks P1 and P2 of a double-humped protrusion 120 from a lowest point 126 of two adjacent double-humped protrusions 120 to the depth of the recessed top surface 120T from the peaks P1 and P2 of the double-humped protrusion 120 may be between 1.2 and 2.5. For example, the height of the peaks P1 and P2 may be the height of a hump of the double-humped protrusion 120. The height of a hump of the double-humped protrusion 120 may be the difference between the top point of the hump and a lowest point 126 between two adjacent double-humped protrusions 120.

Figure 5A:
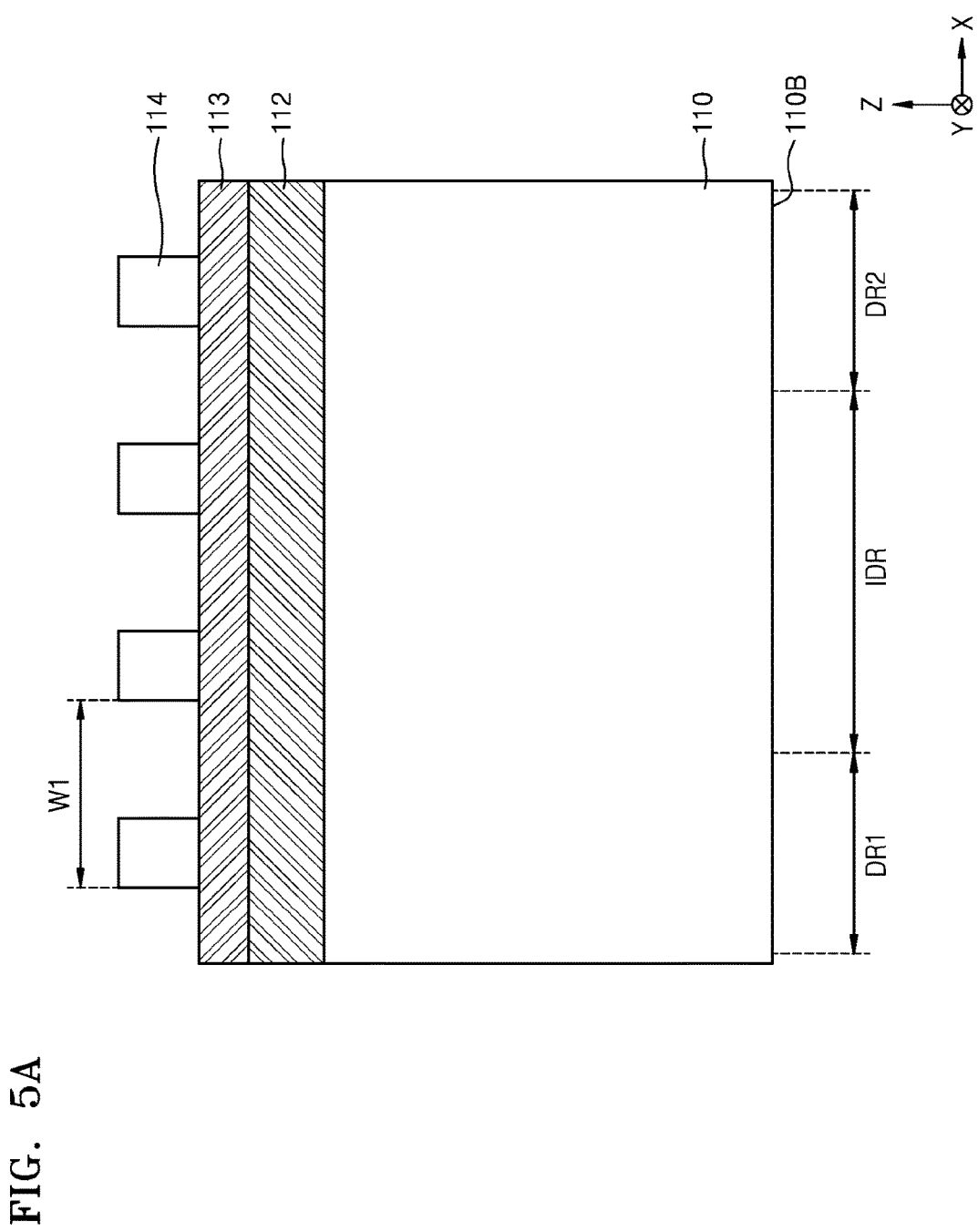
FIGS. 5A through 5P are cross-sectional views for describing a method of manufacturing an integrated circuit device based on a process order, according to certain exemplary embodiments.
Figure 5B:
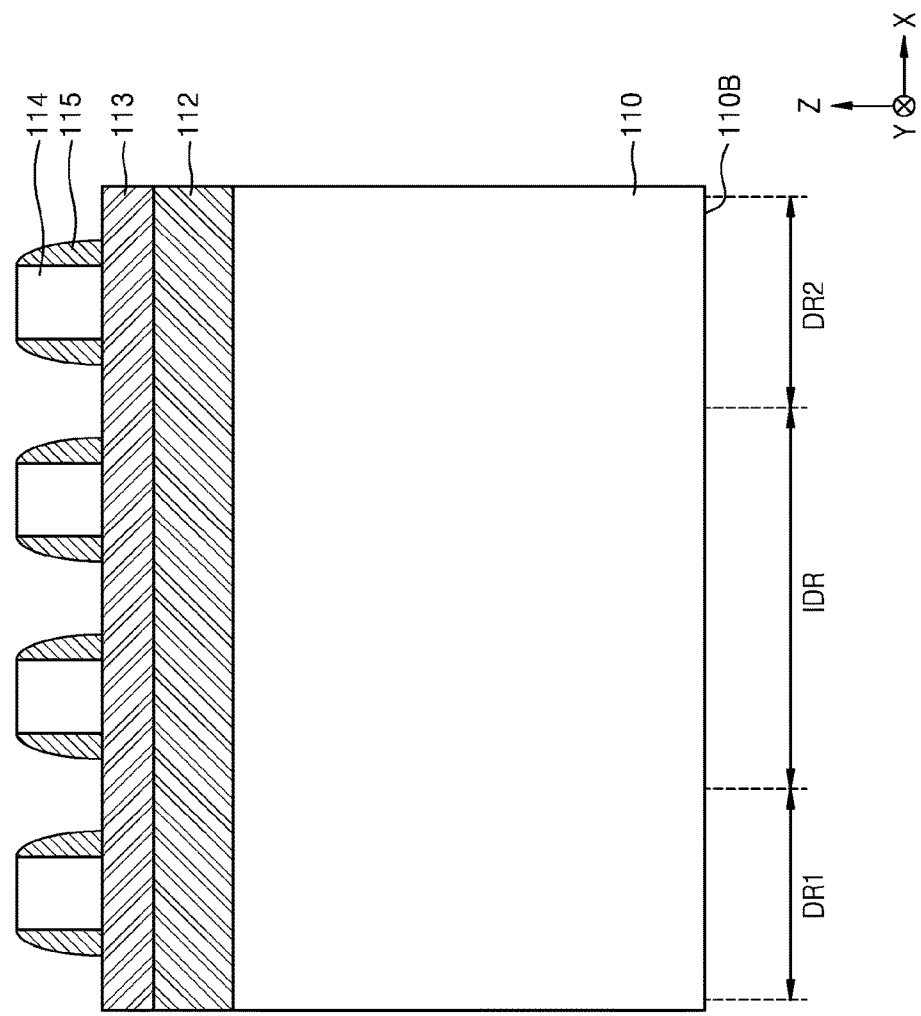
Figure 5C:
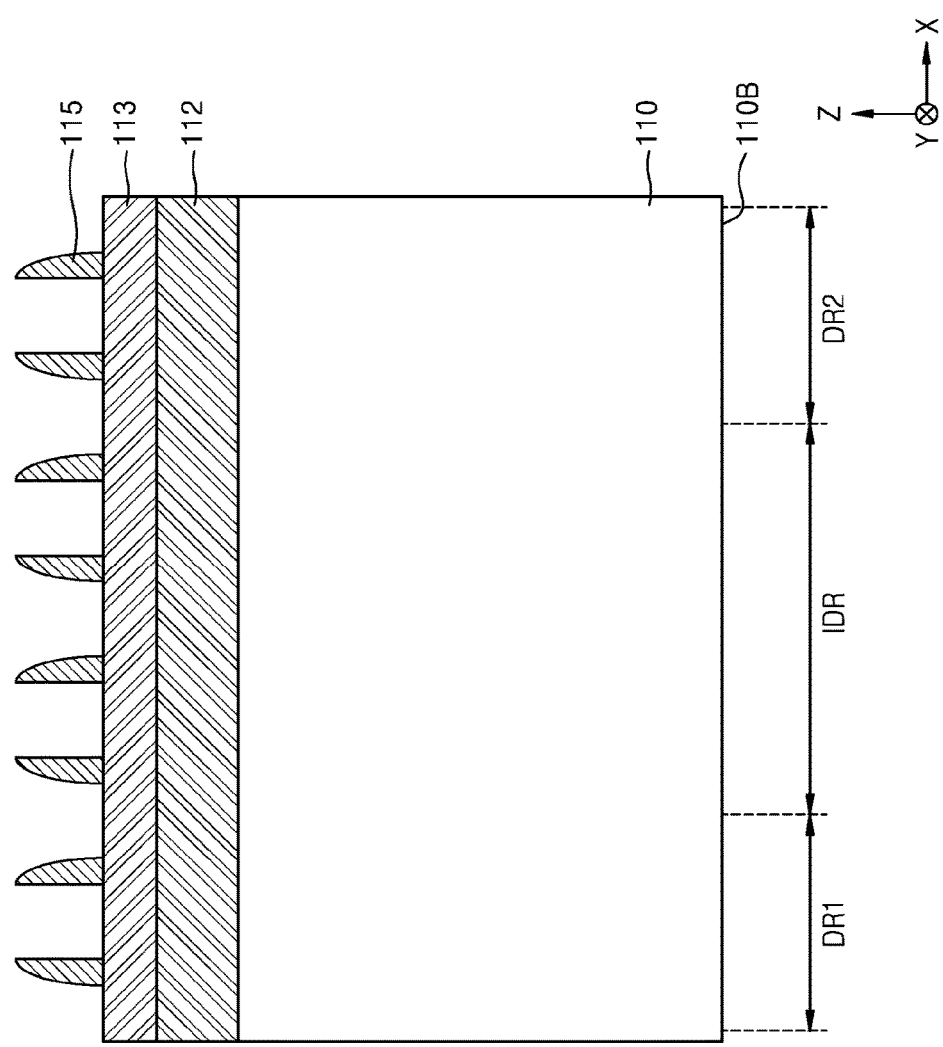
Figure 5D:
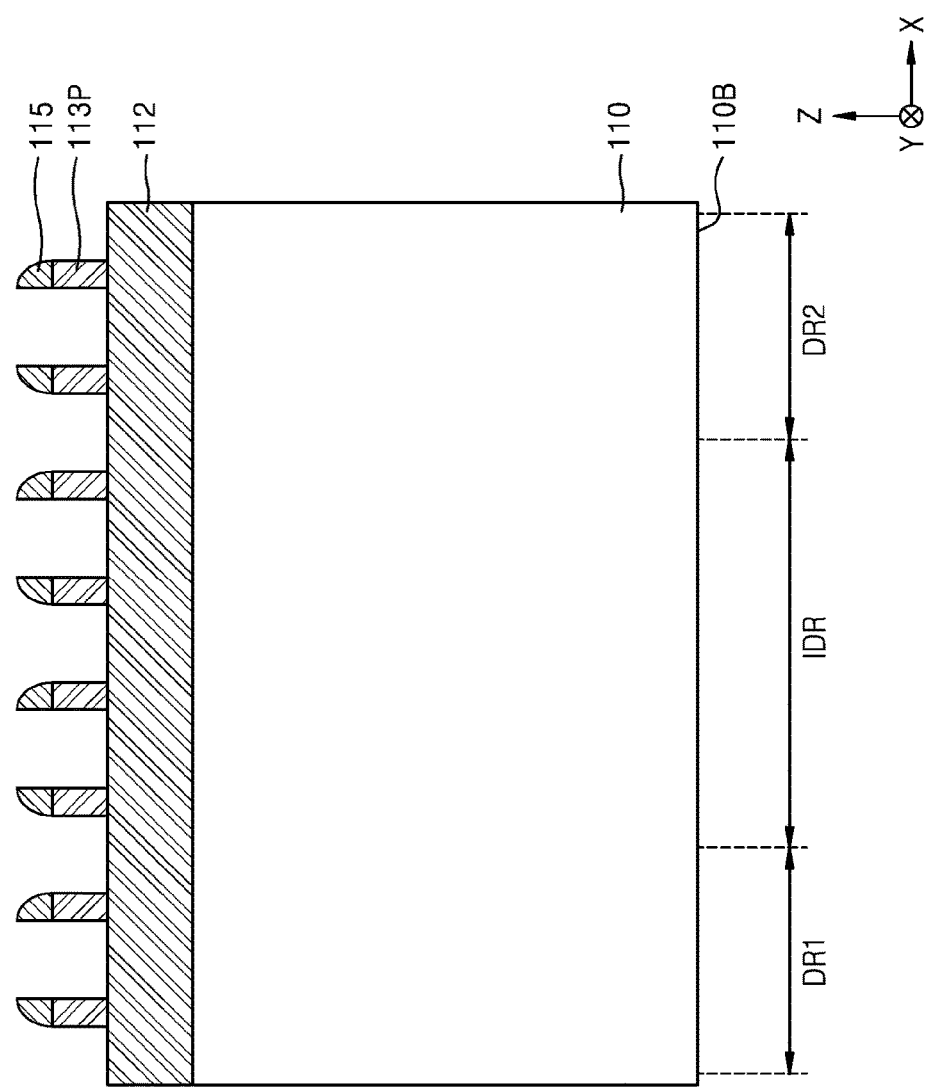
Figure 5E:
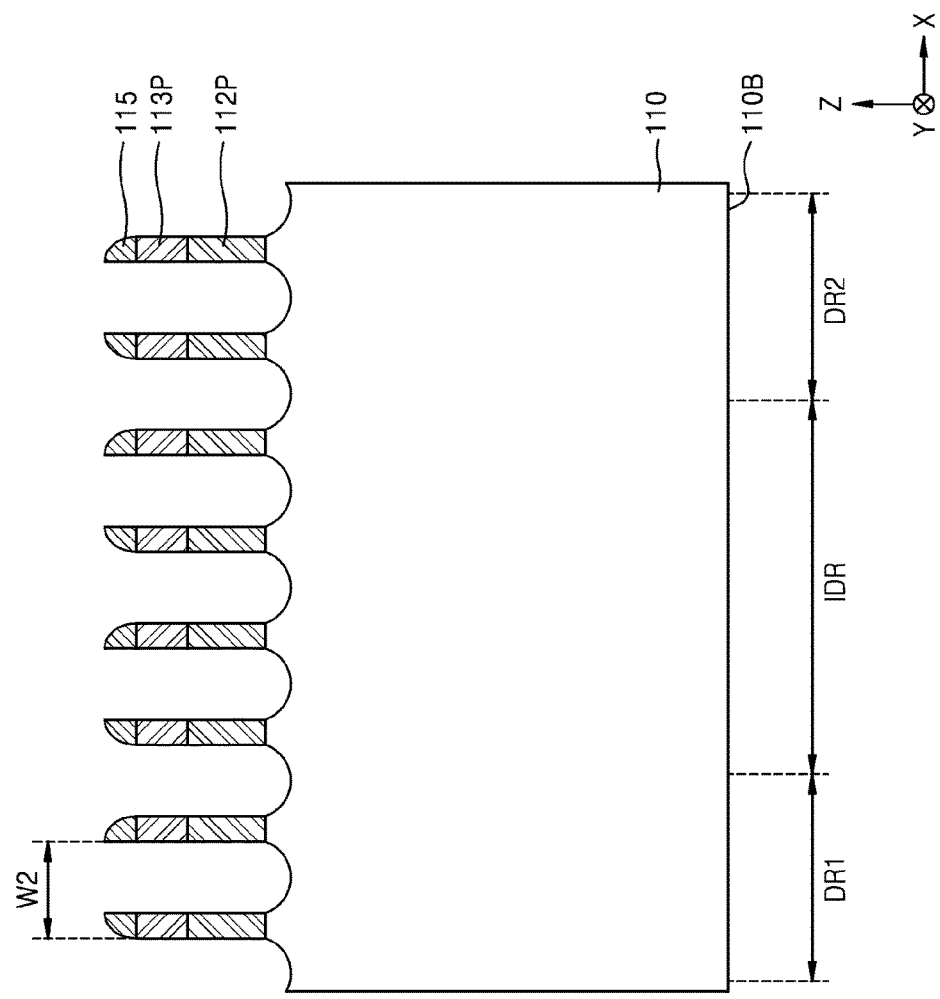
Figure 5F:
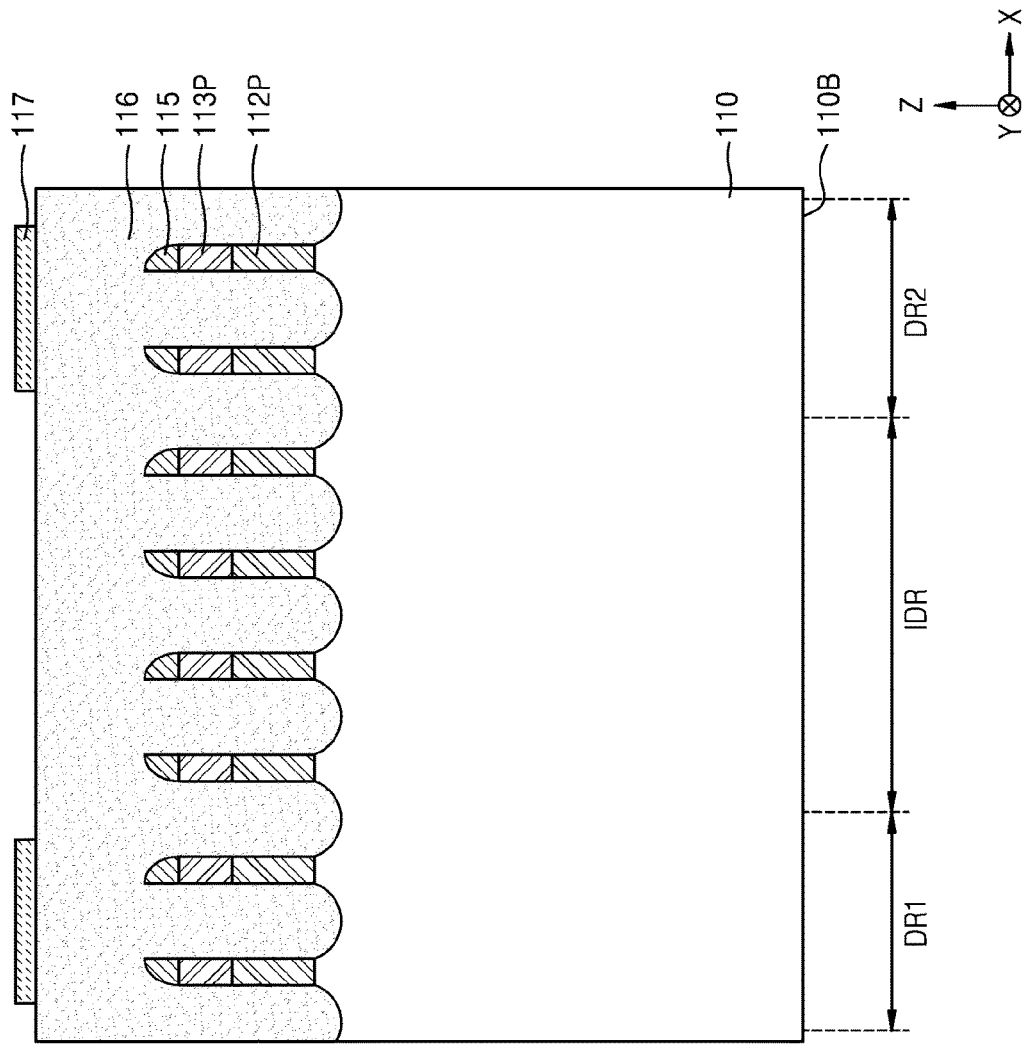
Figure 5G:
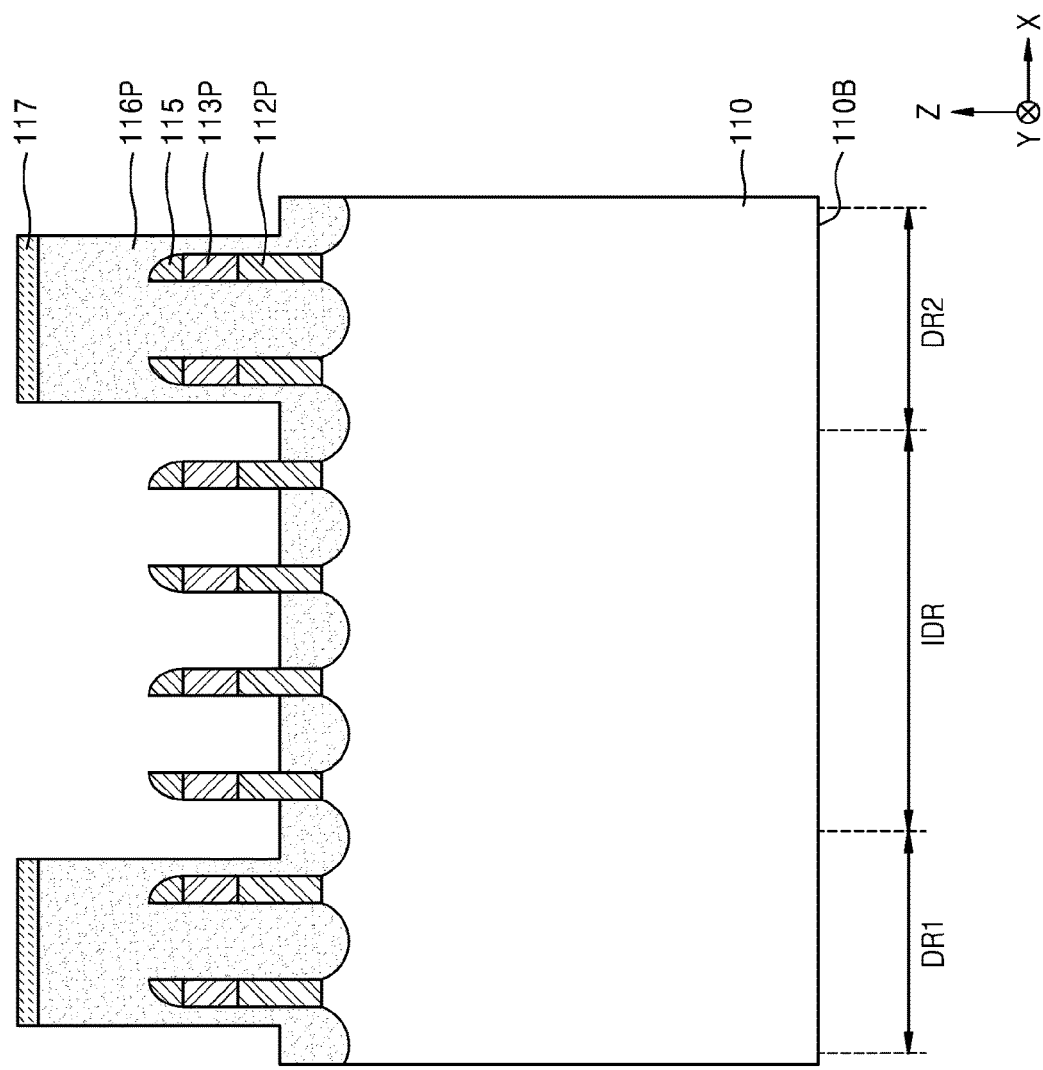
Figure 5H:
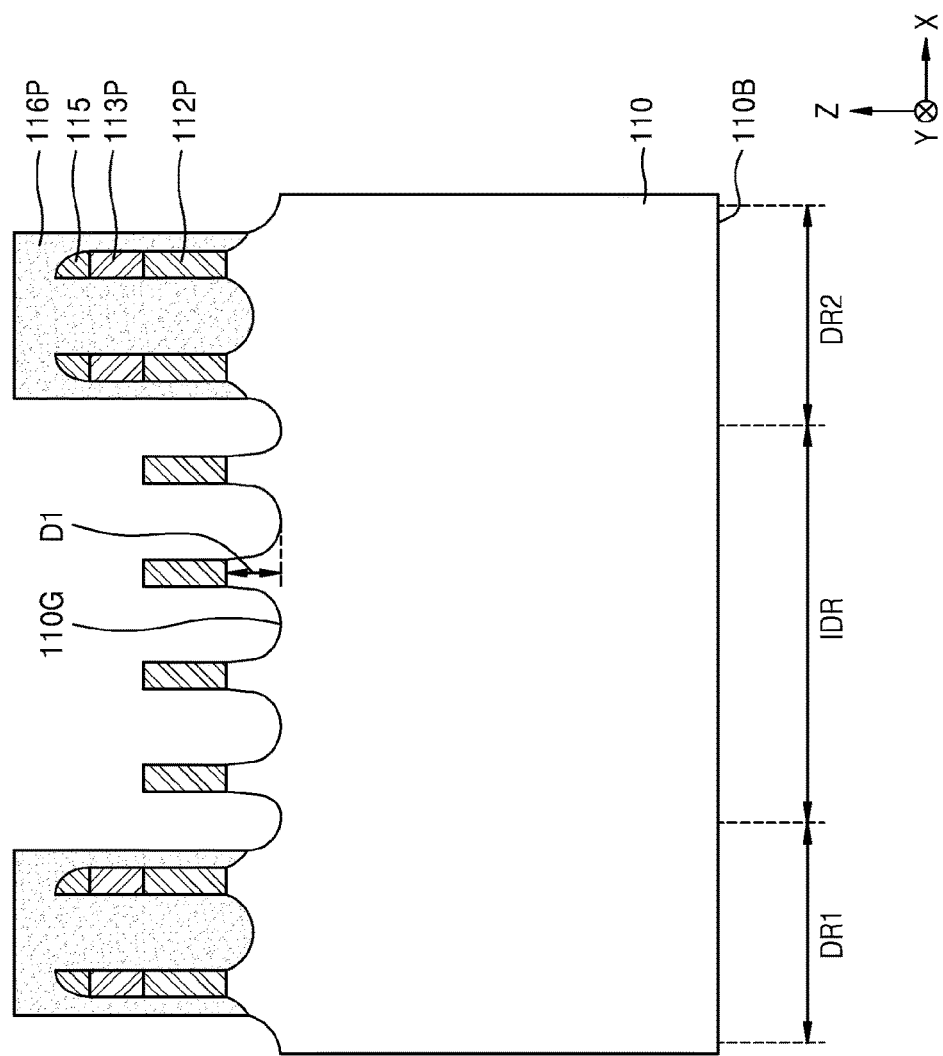
Figure 5I:
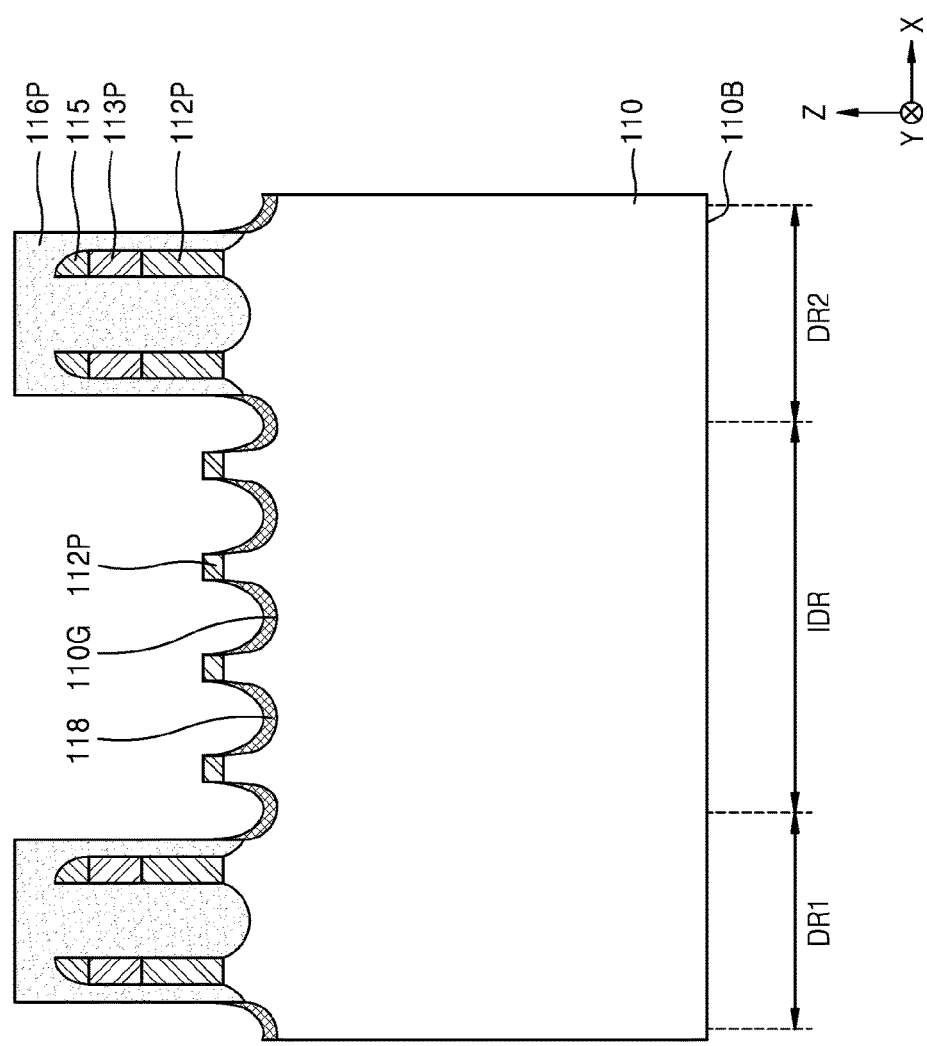
Figure 5J:
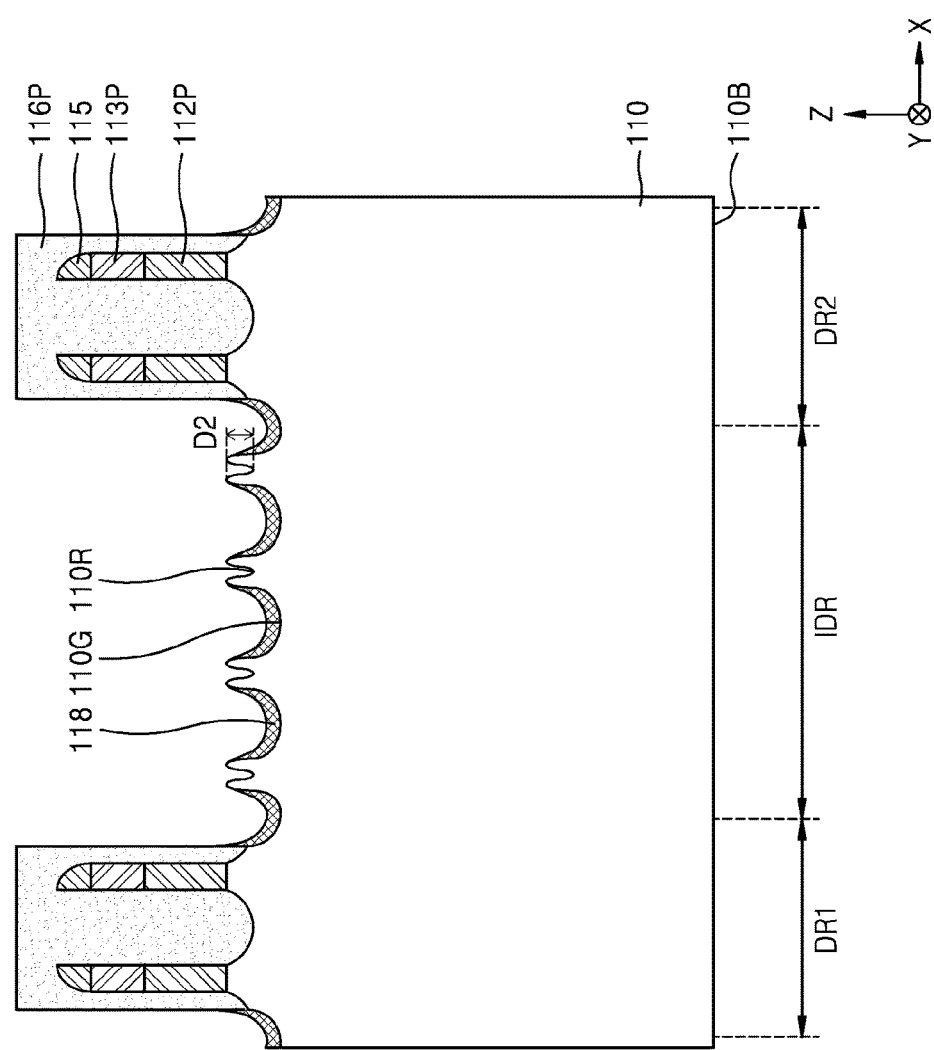
Figure 5K:
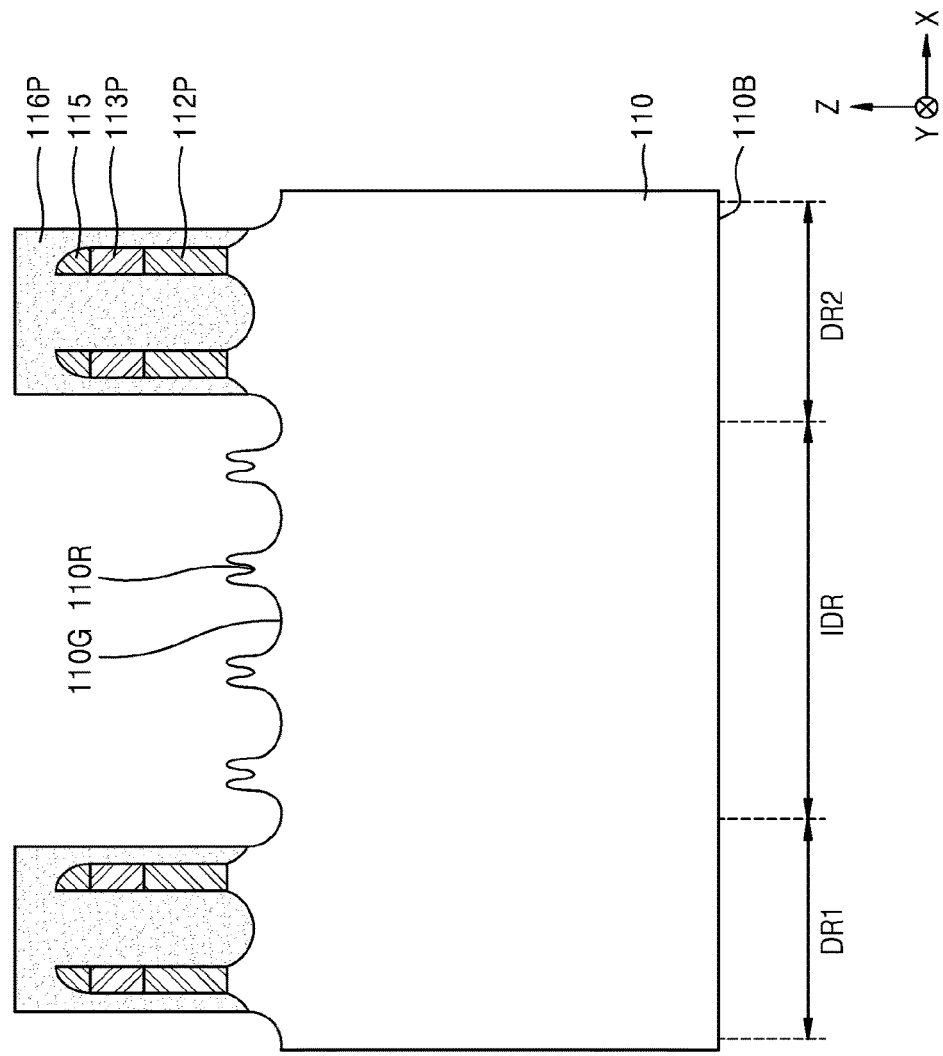
Figure 5L:
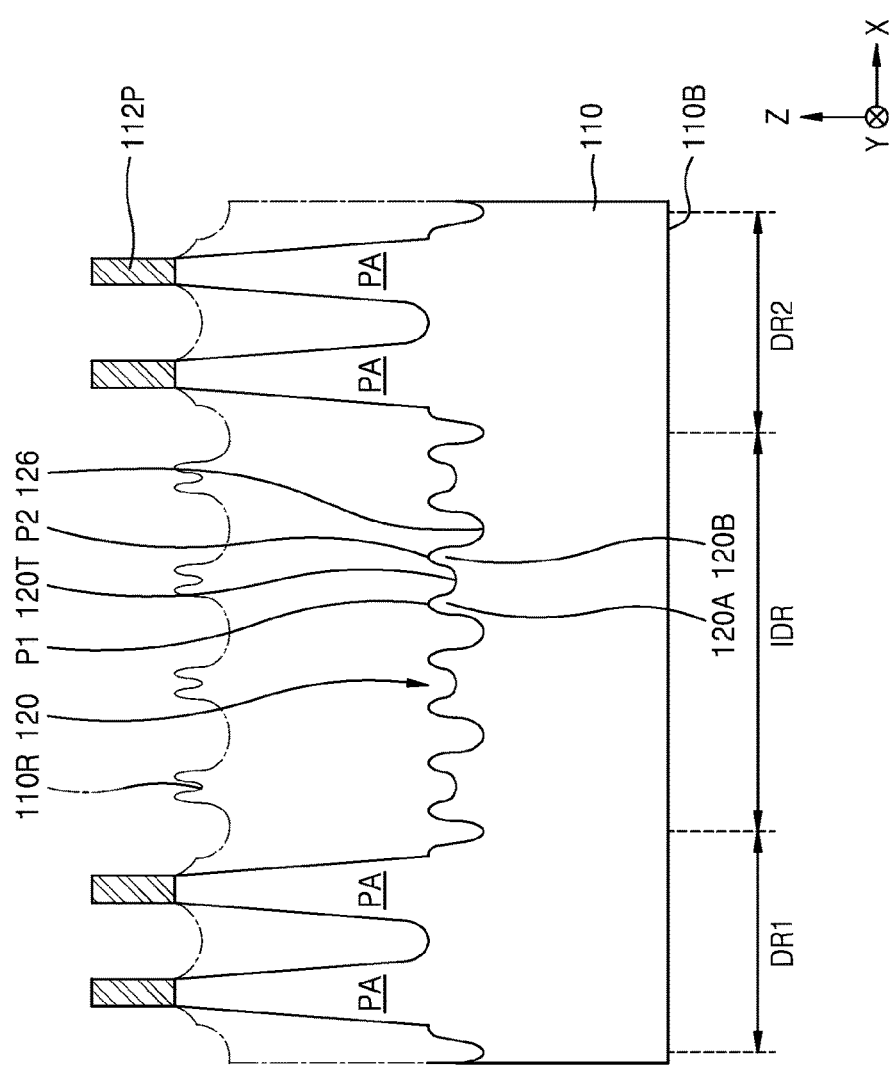
Figure 5M:
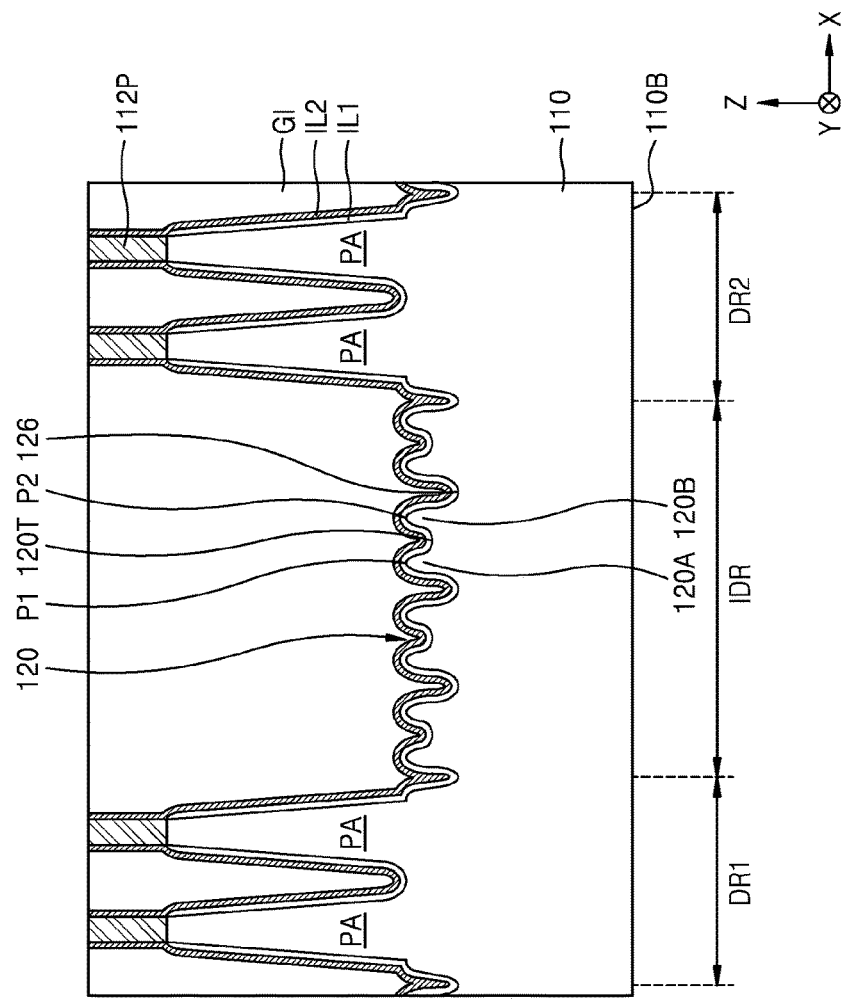
Figure 5N:
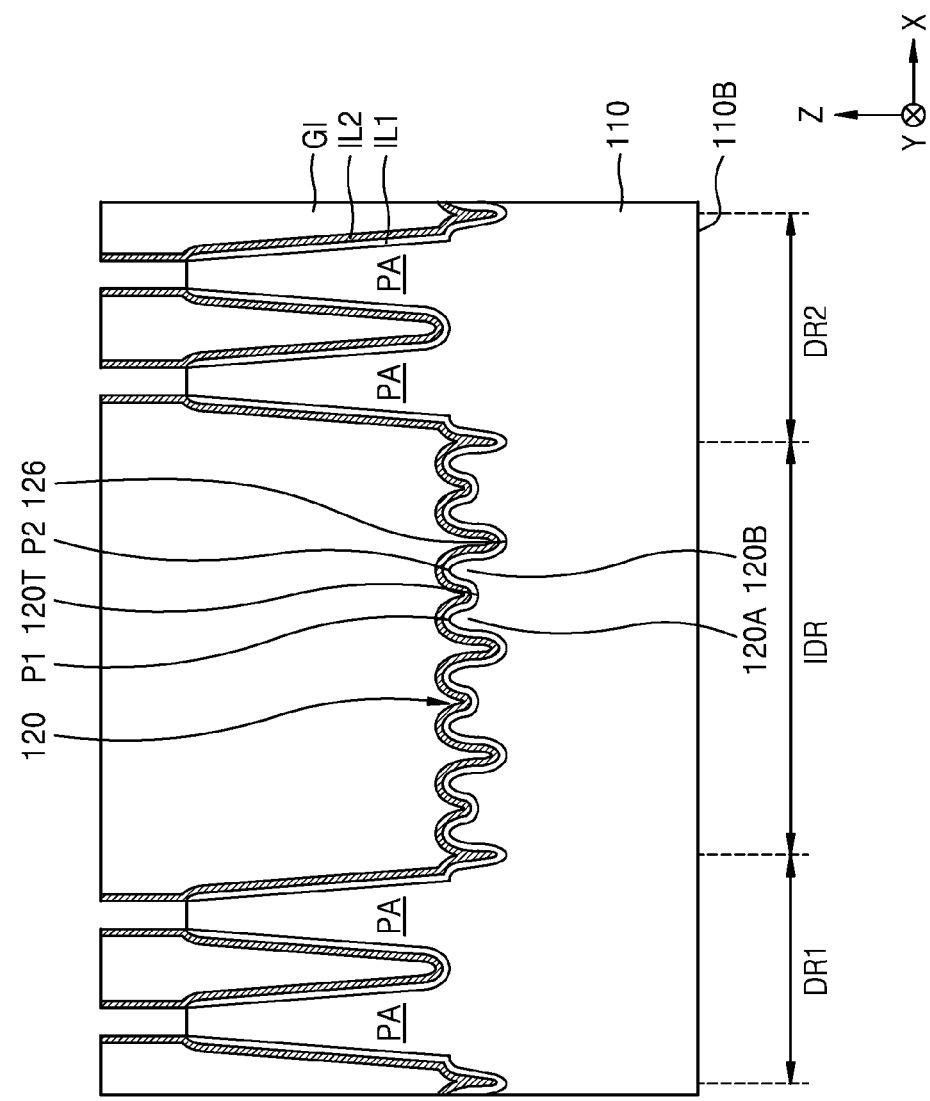
Figure 50:
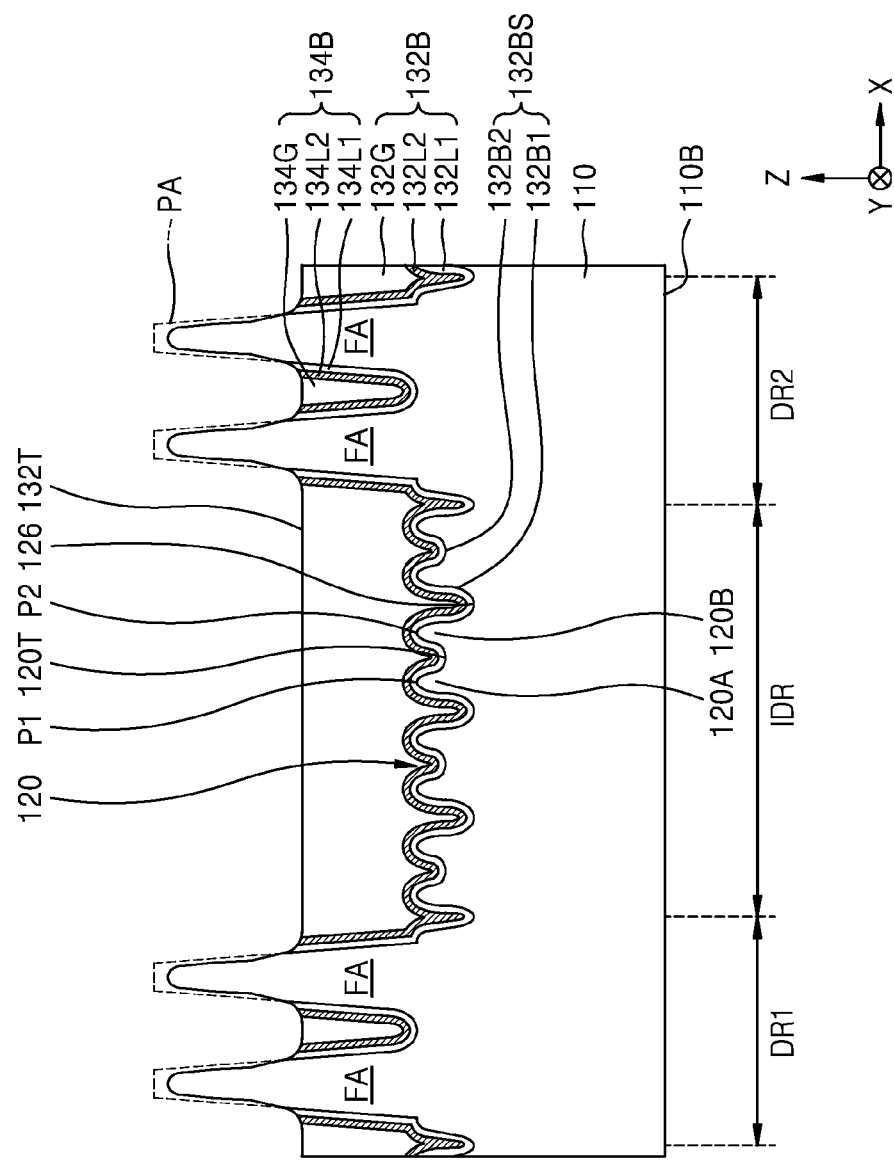
Figure 5P:
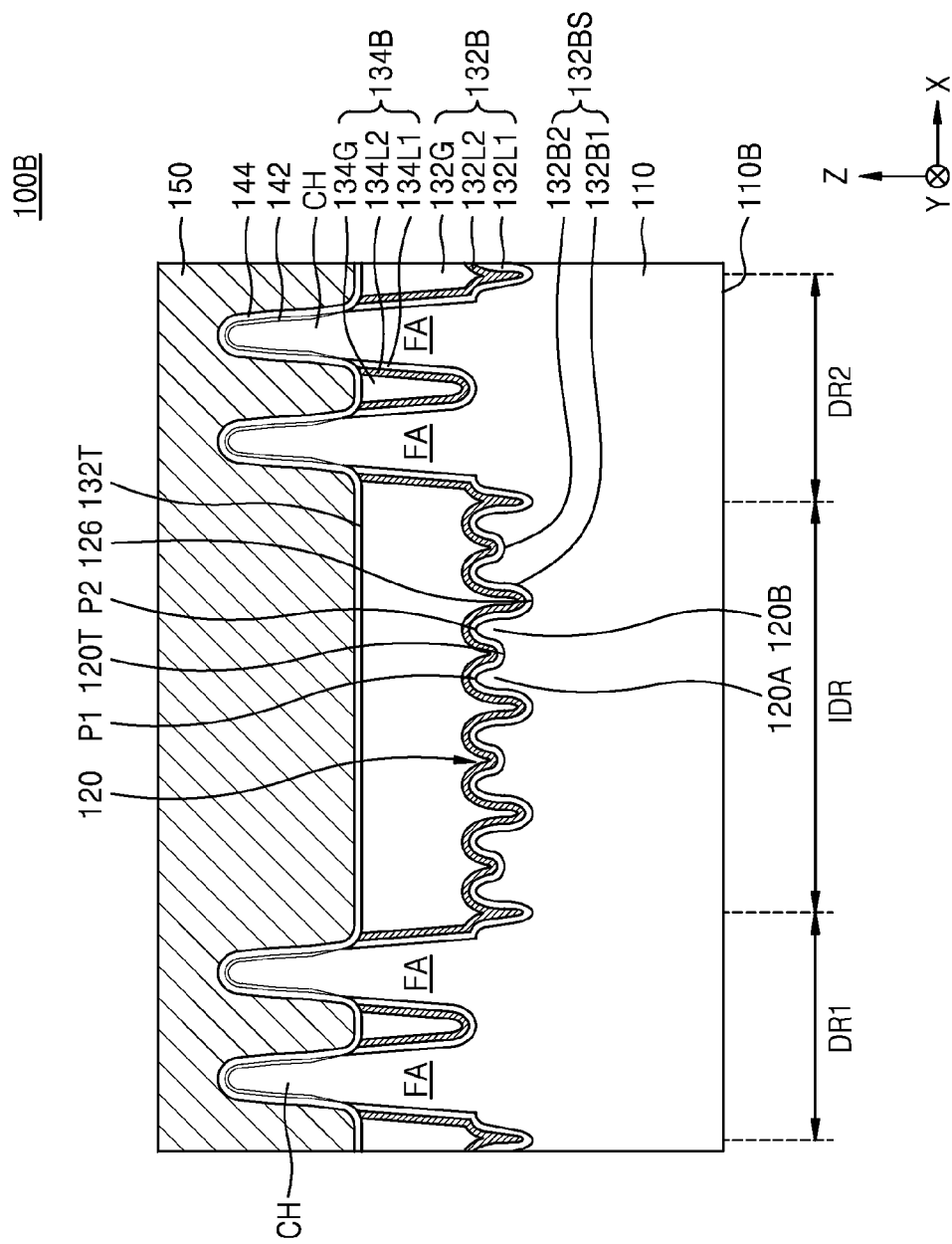

FIGS. 5A through 5P are cross-sectional views for describing a method of manufacturing the integrated circuit device 100B based on a process order, according to certain exemplary embodiments. The method of manufacturing the integrated circuit device 100B of FIG. 3 will now be described with reference to FIGS. 5A through 5P. In FIGS. 5A through 5P, like reference numerals as those of FIGS. 1A and 4 denote like elements, and detailed descriptions of the elements will be omitted.

Referring to FIG. 5A, a first mask layer 112 and a second mask layer 113 may be sequentially formed on the substrate 110, and a plurality of sacrificial patterns 114 may be formed on the second mask layer 113.

Among the first mask layer 112, the second mask layer 113, and the plurality of sacrificial patterns 114, adjacent layers may include materials for providing different etch selectivity. For example, the first mask layer 112 may have a different etch rate from the etch rate of the second mask layer 113 in a following etch process, and the second mask layer 113 may have a different etch rate from the etch rate of the plurality of sacrificial patterns 114 in a following etch process. In some exemplary embodiments, the first mask layer 112 may include a silicon nitride layer or a silicon oxynitride layer, and the second mask layer 113 may include polysilicon. The plurality of sacrificial patterns 114 may include a spin-on hardmask (SOH) material. In some exemplary embodiments, the SOH material may include a hydrocarbon compound having a relatively high carbon content in a range from about 85 wt % to about 99 wt % with respect to the total weight of the SOH material or derivatives thereof. For example, the SOH material may include a structural analog of a hydrocarbon compound having a high carbon content described above. However, the materials of the first mask layer 112, the second mask layer 113, and the plurality of sacrificial patterns 114 are not limited to the above examples.

In some exemplary embodiments, the plurality of sacrificial patterns 114 may include a plurality of line patterns having a third pitch W1 and extending in parallel to each other in one direction (Y direction).

Referring to FIG. 5B, a plurality of spacer mask patterns 115 may be formed on the second mask layer 113 to cover both side walls of the plurality of sacrificial patterns 114.

In an example of forming the plurality of spacer mask patterns 115, an insulating layer covering the plurality of sacrificial patterns 114 at a uniform thickness may be formed on the second mask layer 113, and then the insulating layer may be etched back, and thus the plurality of spacer mask patterns 115 may remain. For example, an insulating layer may be conformally formed on the plurality of sacrificial patterns 114 and the second mask layer 113, and then the insulting layer is anisotropically etched to form the plurality of spacer mask patterns 115. In some exemplary embodiments, the plurality of spacer mask patterns 115 may be formed at an equal space along an X direction which is substantially perpendicular to the Y direction.

In some exemplary embodiments, the plurality of spacer mask patterns 115 may include a silicon oxide, a silicon oxynitride, a silicon nitride, or a combination thereof.

Referring to FIG. 5C, a top surface of the second mask layer 113 may be exposed at both sides of the plurality of spacer mask patterns 115 by removing the plurality of sacrificial patterns 114 (see FIG. 5B).

Referring to FIG. 5D, a plurality of second mask patterns 113P may be formed by an anisotropic dry etch of the second mask layer 113 (see FIG. 5C) by using the plurality of spacer mask patterns 115 as an etching mask.

A plasma etching process or a reactive ion etching (RIE) process may be used to etch the second mask layer 113 but the exemplary embodiments of the inventive concept are not limited to the above processes.

After the plurality of second mask patterns 113P is formed, a top surface of the first mask layer 112 may be exposed between the plurality of second mask patterns 113P. Remnants of the plurality of spacer mask patterns 115 that are not consumed by the etching process of the second mask patterns 113P may remain on the plurality of second mask patterns 113P.

Referring to FIG. 5E, a plurality of first mask patterns 112P may be formed by an anisotropic etch of the first mask layer 112 (see FIG. 5D) by using the plurality of the second mask patterns 113P and the remnants of the plurality of spacer mask patterns 115 remaining on the second mask patterns 113P as an etching mask. During the etching process for forming the plurality of first mask patterns 112P, over-etching may be performed, and thus a part of the substrate 110 exposed between the plurality of first mask patterns 112P may be etched.

The plurality of first mask patterns 112P may include a plurality of line patterns extending in parallel to each other at a fourth pitch W2 smaller than a third pitch W1 of the plurality of sacrificial patterns 114 of FIG. 5A. In some exemplary embodiments, the fourth pitch W2 may be about ½ of the third pitch W1.

Referring to FIG. 5F, a protection mask layer 116 may be formed on the substrate 110 after the plurality of first mask patterns 112P are formed. The protection mask layer 116 may cover the substrate 110, the plurality of first mask patterns 112P, the plurality of second mask patterns 113P, and the plurality of spacer mask patterns 115. A plurality of local mask patterns 117 may be formed on the protection mask layer 116. The plurality of local mask patterns 117 may cover portions of the substrate 110 that are to be the device regions DR1 and DR2.

In some exemplary embodiments, the protection mask layer 116 may include an SOH material, and the plurality of local mask patterns 117 may include silicon oxynitride but the exemplary embodiments of the inventive concept are not limited to the above materials.

Referring to FIG. 5G, a protection mask pattern 116P may be formed by etching a part of the protection mask layer 116 by using the plurality of local mask patterns 117 as an etching mask. During this etching process, portions of the protection mask layer 116 covering portions of the substrate 110 that are to be an inter-device isolation region IDR may be removed. For example, the protection mask pattern 116P may expose a part of the plurality of first mask patterns 112P, the plurality of second mask patterns 113P, and the plurality of spacer mask patterns 115.

Even after the protection mask pattern 116P is formed, the substrate 110 may not be exposed by being covered by the protection mask pattern 116P. For example, a lower portion of the protection mask layer 116 may remain on the substrate 110 in the portions that are to be an inter-device isolation region IDR after the protection mask pattern 116P is formed.

Referring to FIG. 5H, the plurality of local mask patterns 117 remaining on the protection mask pattern 116P may be removed by an etch process. The plurality of second mask patterns 113P and the plurality of spacer mask patterns 115 that are exposed by the protection mask pattern 116P on the inter-device isolation region IDR of the substrate 110 may be removed by the etch process. For example, the plurality of first mask patterns 112P may remain on the inter-device isolation region IDR.

Thereafter, after the plurality of local mask patterns 117, the plurality of second mask patterns 113P, and the plurality of spacer mask patterns 115 are removed, over-etching may be performed, a partial thickness of the protection mask pattern 116P may be removed such that the substrate 110 is exposed between the plurality of first mask patterns 112P in the inter-device isolation region IDR, and a plurality of grooves 110G may be formed on a top surface of the substrate 110 by etching the substrate 110 exposed between the plurality of first mask patterns 112P. A first depth D1 of the plurality of grooves 110G may be determined in consideration of a desired height of the double-humped protrusion 120 (see FIG. 5L) that is to be formed during a subsequent process.

During the formation of the plurality of grooves 110G, the plurality of first mask patterns 112P, the plurality of second mask patterns 113P, the plurality of spacer mask patterns 115, and the top surface of the substrate 110 may remain covered by the protection mask pattern 116P on the device regions DR1 and DR2 of the substrate 110.

FIGS. 5I through 5J are cross-sectional views for describing a process of removing the plurality of first mask patterns 112P on the inter-device isolation region IDR of the substrate 110 and etching a part of the substrate 110.

Referring to FIG. 5I, a passivation layer 118 may be formed in a periphery of each of the plurality of first mask patterns 112P while the plurality of first mask patterns 112P exposed on the inter-device isolation region IDR is removed.

The passivation layer 118 may be collected on inner walls of a plurality of grooves 110G and may be formed on the substrate 110 to cover peripheral portions of the plurality of first mask patterns 112P and portions of the plurality of grooves 110G. For example, the passivation layer 118 may be formed on the substrate 110 including the plurality of grooves 110G.

In some exemplary embodiments, an RIE process may be performed by using etching gas including a hydrocarbon compound substituted with fluorine and oxygen in order to remove the plurality of first mask patterns 112P on the inter-device isolation region IDR. For example, the etching gas may include $O_2$ and at least one selected from $CH_3F$, $CHF_3$, $CH_2F_2$, $CF_4$, $C_2F_6$, $C_4F_8$, and $C_4F_6$, but the exemplary embodiments of the inventive concept are not limited thereto. During the etching process removing the plurality of first mask patterns 112P, the passivation layer 118 may be formed by oxidizing a part of the substrate 110 by $O_2$ included in the etching gas. In some exemplary embodiments, when the substrate 110 includes Si, the passivation layer 118 may include silicon oxide. In some other exemplary embodiments, the passivation layer 118 may include silicon oxide and a polymer including $C_xF_yH_z$, etc.

During removing the plurality of first mask patterns 112P on the inter-device isolation region IDR, the peripheral portions of the plurality of first mask patterns 112P and the portions of the plurality of grooves 110G are covered by the passivation layer 118. Therefore, the peripheral portions of the plurality of first mask patterns 112P and the portions of the plurality of grooves 110G may be protected from the etching atmosphere. For example, because the portion of the substrate 110 exposed between the first patterns 112P may be protected from etchant during the removing process of the first mask patterns 112P because the portion of the substrate is covered by the passivation layer 118. Thus, the peripheral portions of the plurality of first mask patterns 112P and the portions of the plurality of grooves 110G in the substrate 110 may be protected from the etching atmosphere for removing the plurality of first mask patterns 112P.

The etching process for removing the plurality of first mask patterns 112P from a resultant of FIG. 5I may be continued to completely remove the plurality of first mask patterns 112P exposed on the inter-device isolation region IDR of the substrate 110. Even after the plurality of first mask patterns 112P are completely removed, the etching process may be continued to over etch a portion of the substrate 110 by using the etching atmosphere described with reference to FIG. 5I. Therefore, the portions of the substrate 110 on which the first mask patterns 112P were disposed may be partially removed after the first mask patterns 112P are completely removed. For example, a recess 110R may be formed on the top surface of the substrate 110 exposed between the plurality of grooves 110G as illustrated in FIG. 5J. During this over etch process, the peripheral portions of the plurality of first mask patterns 112P and the portions of the plurality of grooves 110G of the substrate 110, may be covered by the passivation layer 118, and thus the peripheral portions of the plurality of first mask patterns 112P and the portions of the plurality of grooves 110G may not be removed but may remain as they are. For example, while the portions of the substrate 110 on which the first mask patterns 112P were disposed are partially removed to form recesses 110R, the portions of the substrate 110 on which the passivation layer 118 is formed are not removed, and therefore maintain their shape.

The recess 110R may be formed at a second depth D2 from the top surface of the substrate 110. The second depth D2 of the recess 110R may be smaller than the first depth D1 (see FIG. 5H) of the plurality of grooves 110G.

Referring to FIG. 5K, the inner walls of the plurality of grooves 110G may be exposed by removing the passivation layer 118 from a resultant of FIG. 5J in which the plurality of grooves 110G and the plurality of recesses 110R are formed on the inter-device isolation region IDR of the substrate 110.

A wet etching process may be used to remove the passivation layer 118 but is not limited thereto.

After removing the passivation layer 118, the plurality of grooves 110G and the plurality of recesses 110R of the substrate 110 may be exposed on the inter-device isolation region IDR. Protrusions of shapes corresponding to the double-humped protrusions 120 that are to be formed in a subsequent process may remain on the inter-device isolation region IDR by the plurality of grooves 110G and the plurality of recesses 110R of the substrate 110.

Referring to FIG. 5L, the plurality of first mask patterns 112P, the plurality of second mask patterns 113P, and the plurality of spacer mask patterns 115 that are formed on the plurality of device regions DR1 and DR2 may be exposed by removing the protection mask pattern 116P remaining on the substrate 110.

Thereafter, an upper portion of the substrate 110 of the plurality of device regions DR1 and DR2, and the inter-device isolation region IDR may be removed by an etching process. During this etching process, a plurality of preliminary fin-type active areas PA may be formed in the plurality of device regions DR1 and DR2 by using the plurality of first mask patterns 112P, the plurality of second mask patterns 113P, and the plurality of spacer mask patterns 115 as an etching mask. During this etching process, a plurality of double-humped protrusions 120 may be formed by transferring shapes of the plurality of recesses 110R and the plurality of grooves 110G (see FIG. 5K) on the inter-device isolation region IDR.

During this etching process, the plurality of first mask patterns 112P, the plurality of second mask patterns 113P, and the plurality of spacer mask patterns 115 that are used as the etching mask may be partially consumed. FIG. 5L illustrates a case where portions of the plurality of first mask patterns 112P remain on the plurality of preliminary fin-type active areas PA.

Referring to FIG. 5M, a first insulating liner IL1 covering exposed surfaces of the plurality of preliminary fin-type active areas PA and the plurality of double-humped protrusions 120 may be formed on a resultant in which the plurality of preliminary fin-type active areas PA and the plurality of double-humped protrusions 120 are formed.

The first insulating liner IL1 may be obtained by performing a process of oxidizing surfaces of the plurality of preliminary fin-type active areas PA and surfaces of the plurality of double-humped protrusions 120. For example, the first insulating liner IL1 may be formed using a thermal oxidation process but is not limited thereto. In some exemplary embodiments, the first insulating liner IL1 may have a thickness in a range from about 10 Å to about 100 Å.

Thereafter, a second insulating liner IL2 may be formed on the first insulating liner IL1. The second insulating liner IL2 may have a uniform thickness to conformally cover the first insulating liner IL1.

In each area that an NMOS transistor is to be formed, the second insulating liner IL2 may include a material applying a tensile stress to each of the plurality of preliminary fin-type active areas PA. In an area that a PMOS transistor is to be formed, the second insulating liner IL2 may include a material applying a compressive stress to each of the plurality of preliminary fin-type active areas PA. For example, the second insulating liner IL2 may include SiN, SiON, SiBN, SiC, SiC:H, SiCN, SiCN:H, SiOCN, SiOCN:H, SiOC, $SiO_2$, polysilicon, or a combination thereof. In some exemplary embodiments, the second insulating liner IL2 may be formed by a plasma enhanced chemical vapour deposition (PECVD) process, a high density plasma CVD (HDP CVD) process, an inductively coupled plasma CVD (ICP CVD) process, or a capacitor coupled plasma CVD (CCP CVD) process. In some exemplary embodiments, the second insulating liner IL2 may be formed to a thickness ranging from about 10 Å to about 100 Å.

Thereafter, a gap-fill insulating layer GI covering the second insulating liner IL2 may be formed. In some exemplary embodiments, to form the gap-fill insulating layer GI, oxide may be accumulated on the second insulating liner IL2, and then the accumulated oxide may be annealed. For example, after an oxide layer is formed on the second insulating liner IL2, the oxide layer may be heated to a high temperature. Thereafter, top surfaces of the gap-fill insulating layer GI and the second insulating liner IL2 may be planarized by partially removing the gap-fill insulating layer GI and the second insulating liner IL2 from top portions of the gap-fill insulating layer GI and the second insulating liner IL2, and top surfaces of the plurality of first mask patterns 112P may be exposed.

The gap-fill insulating layer GI may be formed using a flowable chemical vapor deposition (FCVD) process or a spin coating process. For example, the gap-fill insulating layer GI may include FSG, USG, BPSG, PSG, FOX, PE-TEOS, or TOSZ.

Referring to FIG. 5N, top surfaces of the plurality of preliminary fin-type active areas PA may be exposed by removing the plurality of first mask patterns 112P exposed through the gap-fill insulating layer GI and the second insulating liner IL2.

Referring to FIG. 5O, a recess process may be performed to remove a partial thickness of each of the gap-fill insulating layer GI, the first insulating liner ILL and the second insulating liner IL2 (see FIG. 5N) from top surfaces thereof such that the top surface and top side walls of each of the plurality of preliminary fin-type active areas PA are exposed. For example, an upper portion of each preliminary fin-type active area may be exposed by a recess process that removes upper portions of the gap-fill insulating layer GI, the first insulating liner ILL and the second insulating liner IL2.

As a result, heights of the gap-fill insulating layer GI, the first insulating liner ILL and the second insulating liner IL2 may be reduced, and thus top outer surfaces of some of the plurality of preliminary fin-type active areas PA may be consumed, thereby obtaining the plurality of fin-type active areas FA from the plurality of preliminary fin-type active areas PA. For example, respective upper portions of the plurality of the preliminary fin-type active areas PA may be removed by the recess process, and a plurality of fin-type active areas FA may be formed by removing the respective upper portions of the plurality of the preliminary fin-type active areas PA.

For example, dry etching, wet etching, or a combination of dry etching and wet etching may be used to perform the recess process. During the recess process, the top portion of each of the plurality of preliminary fin-type active areas PA exposed on the substrate 110 may be exposed to an etching atmosphere and/or a cleaning atmosphere after etching. As a result, outer surfaces of the plurality of preliminary fin-type active areas PA may be partially consumed by etching, oxidation, and/or cleaning, as illustrated in FIG. 5O, the plurality of preliminary fin-type active areas PA having top portions of reduced widths may be obtained. For example, during the recess process, the respective upper portions of the preliminary fin-type active areas PA may be exposed to etchant, and some of the upper portions of the preliminary fin-type active areas PA may be removed. For example, the etchant may be a liquid chemical, a gas chemical, or a plasma.

By the recess process, a device isolation layer 132B and an STI layer 134B may be formed in the inter-device isolation region IDR and in the device regions DR1 and DR2. The device isolation layer 132B may include a bi-layer structure of insulating liners 132L1 and 132L2, and a gap-fill insulating layer 132G. The STI layer 134B may include a bi-layer structure of the insulating liners 134L1 and 134L2, and the gap-fill STI layer 134G.

In some exemplary embodiments, impurity ions may be injected into a top portion of each of the plurality of fin-type active areas FA protruding from the device isolation layer 132B and the STI layer 134B. The impurity ions may adjust threshold voltages of a transistor formed with the fin-type active areas FA in a following process. For example, boron (B) ions may be injected as impurities into an area in which an NMOS transistor is formed. Phosphorus (P) ions or arsenide (As) ions may be injected into an area in which a PMOS transistor is formed as impurities. For example, the first device region DR1 may be NMOS region, and the second device region DR2 may be PMOS region. For example, an n-well (a portion of the substrate doped with n-type impurities) may be formed in a p-type substrate 110 to define the PMOS region. For example, the substrate 110 may form the second device region DR2 by selectively exposing second device region DR2 and doping second device region DR2 with n-type impurities to create an n-well throughout this region. At this time, the remainder of the substrate 110 may remain doped with a p-type impurity. The bulk portion of the fin-type active areas FA in the PMOS region (including channel regions formed in such fin-type active areas FA) may have substantially the same doping level as the remainder of this n-well, while source/drain regions may be subsequently doped by implantation (or epitaxially grown with in-situ doping) with p-type dopants to form the PMOS transistors in the second device region DR2. The boundary of the n-well (from a top down perspective) may be formed below the inter-device isolation region IDR and an upper surface of part of the n-well may contact the device isolation layer 134B. The bulk and channel regions of the plurality of fin-type active areas FA in the NMOS region may be doped with p-type impurities with source/drain regions of NMOS transistors formed from the fin-type active areas FA in the NMOS region being doped with an n-type dopant (either through n-type dopant implantation into the source/drain regions of the NMOS transistors or by epitaxially growing the source/drain regions with in-situ doping).

Referring to FIG. 5P, the integrated circuit device 100B illustrated in FIG. 3 may be manufactured by forming an interfacial layer 142, a gate insulating layer 144, a gate line 150, and source and drain areas 162 (see FIG. 1A). The interfacial layer 142 may cover an exposed surface of each of the plurality of fin-type active areas FA. The gate insulating layer 144, the gate line 150, and the source and drain areas 162 may sequentially cover the top portions of the plurality of fin-type active areas FA on the interfacial layer 142.

In some exemplary embodiments, a replacement gate (RPG) process may be used to form the gate line 150. The top portion of each of the plurality of fin-type active areas FA may be a channel area CH of a transistor.

According to the method of manufacturing the integrated circuit device 100B described with reference to FIGS. 5A through 5P, at least one double-humped protrusion 120 may be formed on a surface of an inter-device isolation region adjacent to device regions. The integrated circuit device may include a highly scaled fin-type FETs. The double-humped protrusion 120 may have a structure obtained during a process of manufacturing an integrated semiconductor device for obtaining optimized operating characteristics and an excellent performance of the integrated circuit device. For example, the integrated circuit device according to the exemplary embodiment of the inventive concept may be beneficial to control leakage current in the highly scaled fin-type FET and may enhance performance of the fin-type FET.

Although an example of the method of manufacturing the integrated circuit device 100B is described with reference to FIGS. 5A through 5P, integrated circuit devices having various structures described in the present specification, for example, the integrated circuit device 100 illustrated in FIGS. 1A and 1B and the integrated circuit device 100A illustrated in FIG. 2 may be easily implemented using various methods modified and changed therefrom within the scope of the inventive concept.

For example, in an example of manufacturing the integrated circuit device 100 illustrated in FIGS. 1A and 1B, a process of forming the first insulating liner IL1 and the second insulating liner IL2 described with reference to FIG. 5M may be omitted, and the gap-fill insulating layer GI in direct contact with the plurality of preliminary fin-type active areas PA and the plurality of double-humped protrusions 120 may be formed.

In an example of manufacturing the integrated circuit device 100A illustrated in FIG. 2, the first insulating liner IL1 described with reference to FIG. 5M may be formed, a process of forming the second insulating liner IL2 may be omitted, and the gap-fill insulating layer GI may be directly formed on the first insulating liner IL1.

FIGS. 6A through 6D are cross-sectional views for describing a method of manufacturing the integrated circuit device 100C based on a process order, according to certain exemplary embodiments. The method of manufacturing the integrated circuit device 100C of FIG. 4 will now be described with reference to FIGS. 6A through 6D. In FIGS. 6A through 6D, like reference numerals as those of FIGS. 1A and 5P denote like elements, and detailed descriptions of the elements will be omitted.

Figure 6A:
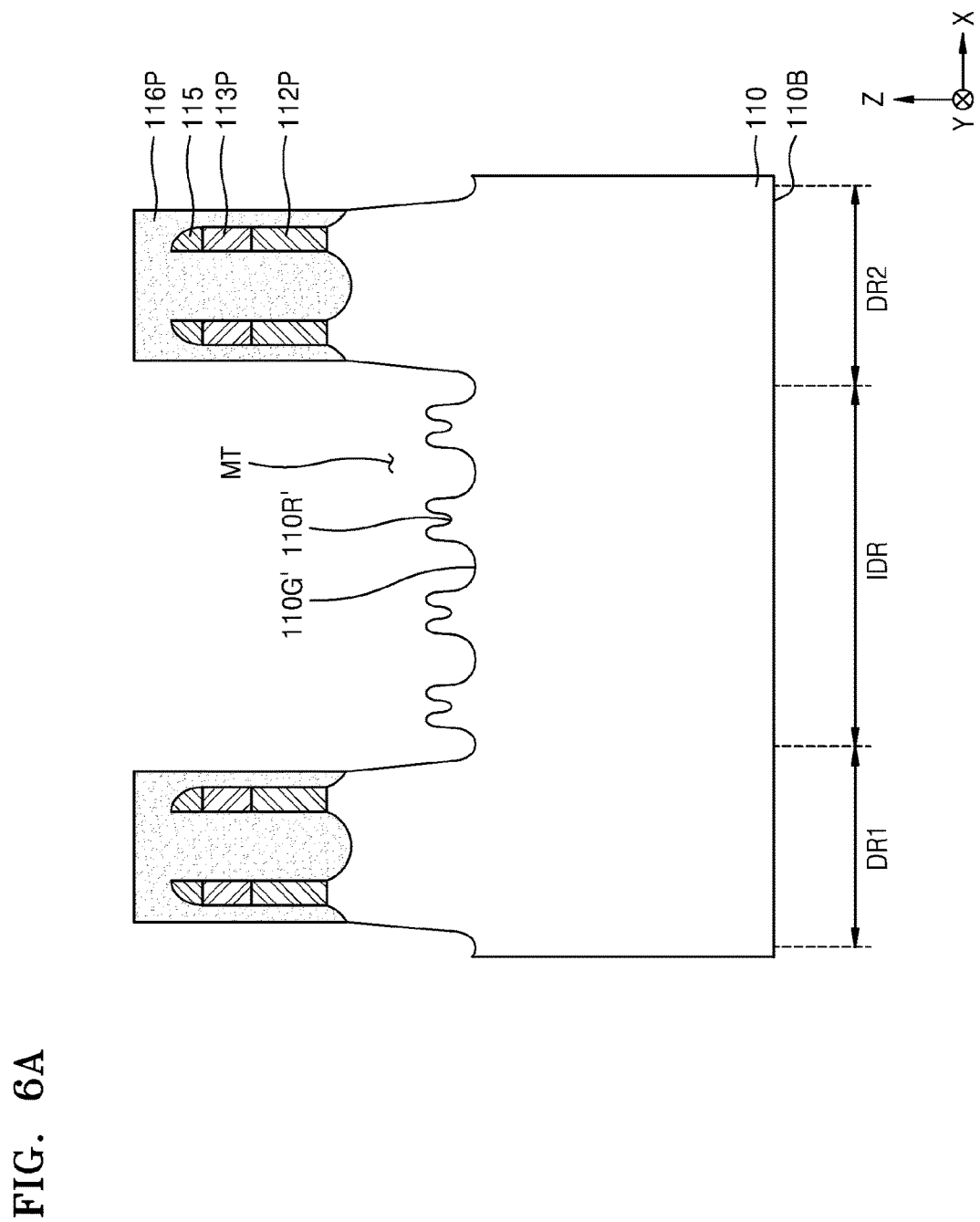
FIGS. 6A through 6D are cross-sectional views for describing a method of manufacturing an integrated circuit device based on a process order, according to certain exemplary embodiments.

Referring to FIG. 6A, the same method as the one described with reference to FIGS. 5A through 5K may be performed to form a plurality of grooves 110G and a plurality of recesses 110R in the inter-device isolation IDR of the substrate 110, to remove a passivation layer 118, and to expose a plurality of grooves 110G and a plurality of recesses 110R.

Thereafter, a middle trench MT defining the plurality of device regions DR1 and DR2 may be formed by removing the substrate 110 exposed through the protection mask pattern 116P such that the exposed portions of the substrate 110 are reduced by a uniform thickness. For example, substantially the same thickness of the substrate 110 is removed throughout the exposed portions of the substrate by the removing process. As a result, shapes of the plurality of grooves 110G and the plurality of recesses 110R (see FIG. 5K) may be transferred to a bottom surface of the middle trench MT in the inter-device isolation region IDR, and thus a plurality of grooves 110G' and a plurality of recesses 110R' having shapes substantially the same as or similar to those of the plurality of grooves 110G and the plurality of recesses 110R may be formed.

In some exemplary embodiments, an RIE process may be used to remove the substrate 110 exposed through the protection mask pattern 116P such that the exposed portions of the substrate 110 are reduced by a uniform thickness. For example, substantially the same thickness of the substrate 110 is removed throughout the exposed portions of the substrate by the ME process. However, the exemplary embodiment of the inventive concept is not limited thereto.

Figure 6B:
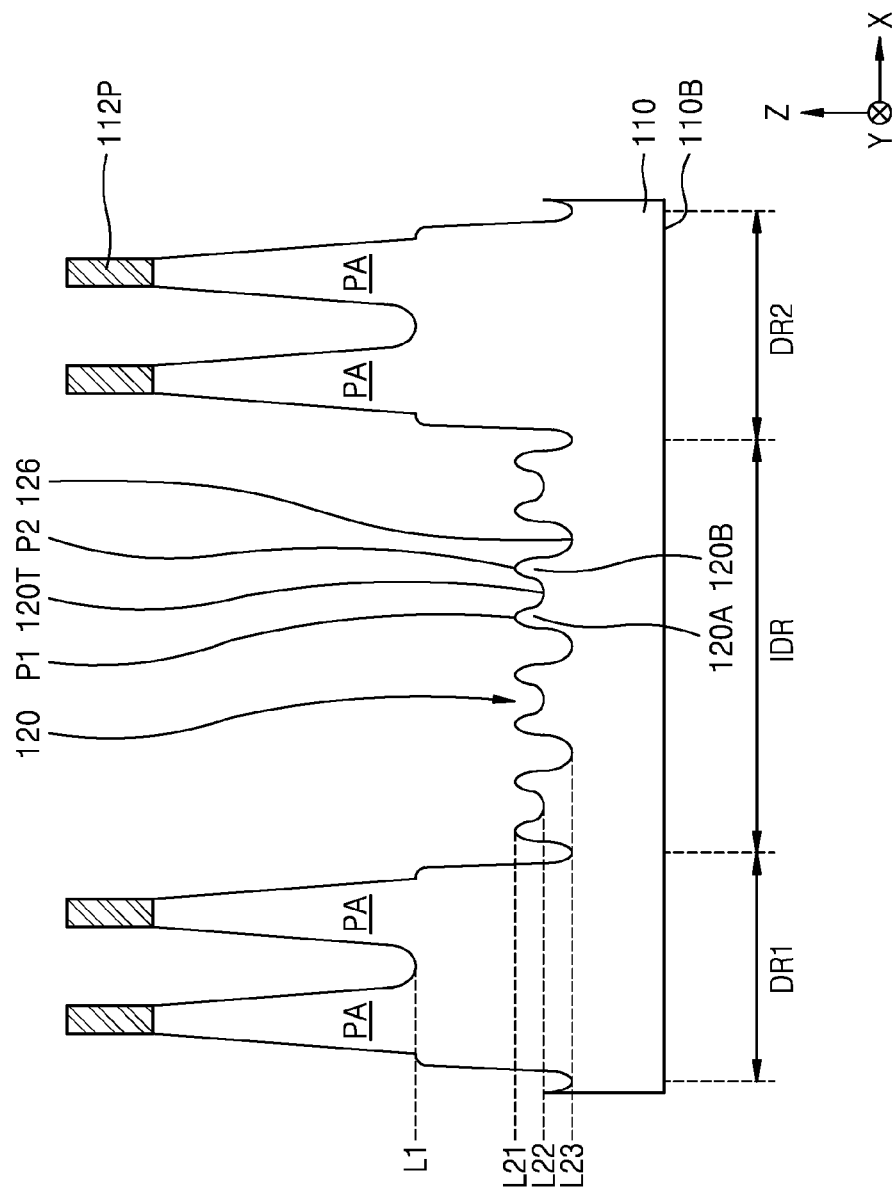

Referring to FIG. 6B, in a similar manner as the one described with reference to FIG. 5L, a plurality of first mask patterns 112P, a plurality of second mask patterns 113P, and a plurality of spacer mask patterns 115 (see FIG. 6A) that are formed on the plurality of device regions DR1 and DR2 may be exposed by removing the protection mask pattern 116P remaining on the substrate 110.

Thereafter, the substrate 110 exposed between the plurality of first mask patterns 112P, the plurality of second mask patterns 113P, and the plurality of spacer mask patterns 115 may be etched by using the plurality of first mask patterns 112P, the plurality of second mask patterns 113P, and the plurality of spacer mask patterns 115 as an etching mask. A plurality of preliminary fin-type active areas PA may be formed in the plurality of device regions DR1 and DR2, and a plurality of double-humped protrusions 120 may be formed by transferring shapes of the plurality of grooves 110G' and the plurality of recesses 110R' (see FIG. 6A) in the inter-device isolation region IDR.

Unlike the exemplary embodiment illustrated in FIG. 5L, in the present exemplary embodiment, after the plurality of preliminary fin-type active areas PA are formed in the plurality of device regions DR1 and DR2, the level L21 of the first peak P1 and the second peak P2 of the double-humped protrusions 120 in the inter-device isolation region IDR may be lower than the first level L1 of a top surface of the substrate 110 disposed between the two adjacent preliminary fin-type active areas PA in the inter-device regions DR1 and DR2.

In the inter-device isolation region IDR of the present embodiment, the levels of the recessed top surface 120T of the double-humped protrusions 120, the first peak P1 and the second peak P2 of the double-humped protrusions 120, and the valley portions 126 at both sides of each of the double-humped protrusions 120 may be lower than the level of the valley portion 126 of the device isolation region illustrated in FIG. 5L. For example, the levels of the corrugated bottom surfaces 132BS and the peak levels L21 (see FIG. 6C) of the present embodiment may be lower than the level of the valley portion 126 of the embodiment shown in FIG. 5L.

Figure 6C:
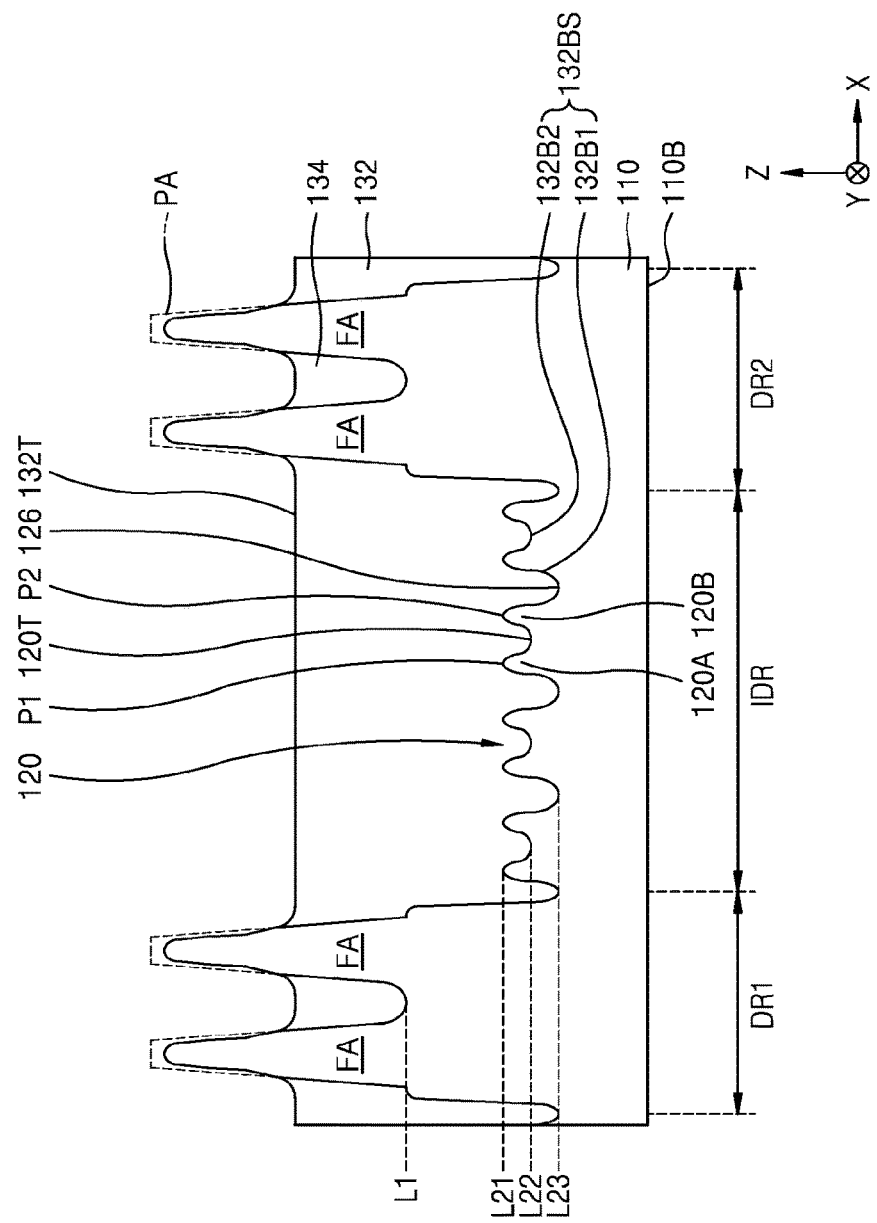

Referring to FIG. 6C, processes similar to those described with reference to FIGS. 5M through 5O may be performed to form a plurality of fin-type active areas FA and a device isolation layer between the plurality of preliminary fin-type active areas PA (see FIG. 6B). However, in the present example, a device isolation layer 132 and an STI layer 134 may be formed instead of the device isolation layer 132B and the STI layer 134B illustrated in FIGS. 5M through 5O. When the device isolation layer 132 and the STI layer 134 are formed, a process of forming the first insulating liner IL1 and the second insulating liner IL2 described with reference to FIG. 5M may be omitted.

Figure 6D:
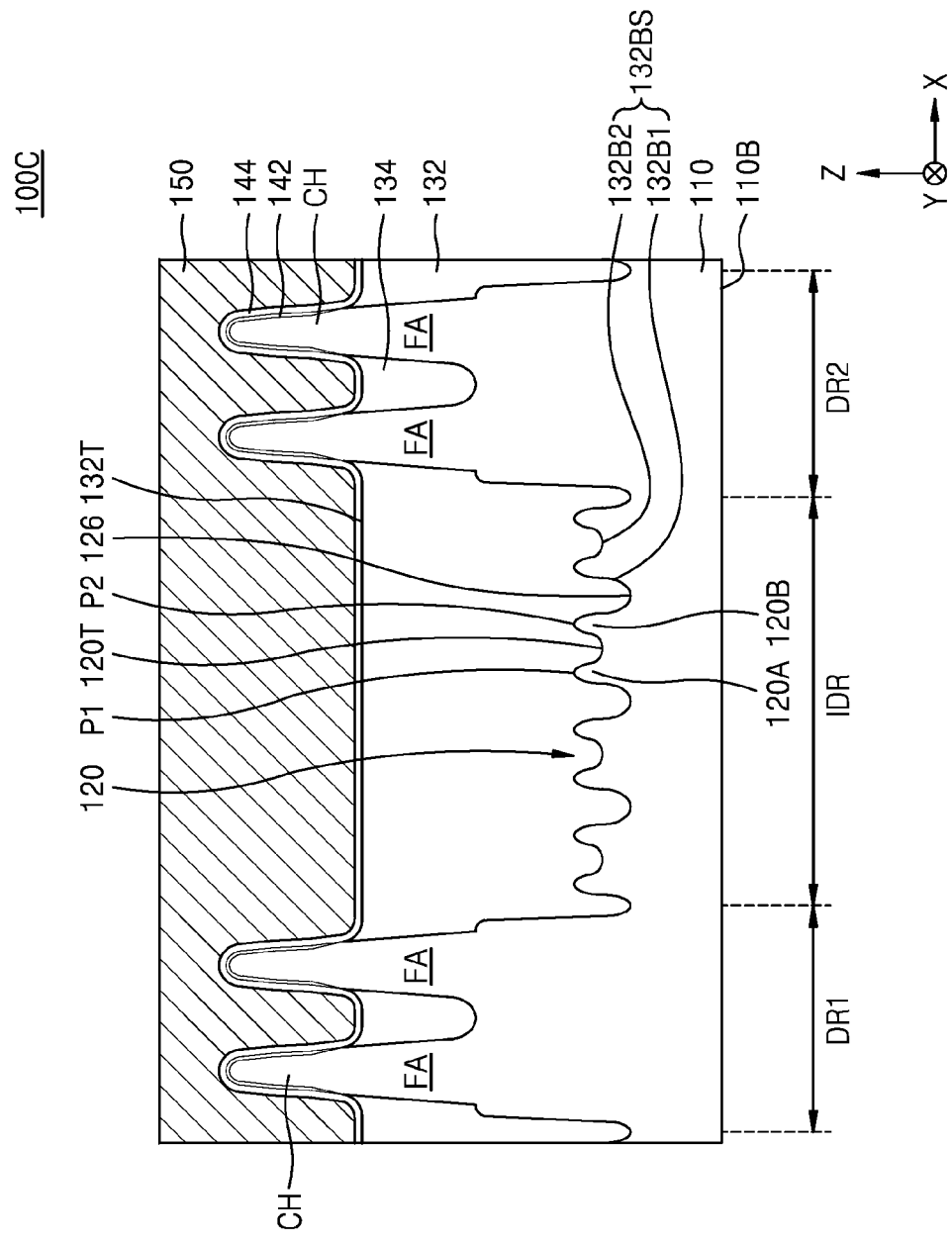

Referring to FIG. 6D, in the same manner as the one described with reference to FIG. 5P, the integrated circuit device 100C illustrated in FIG. 4 may be manufactured by forming the interfacial layer 142, the gate insulating layer 144, the gate line 150, and the source and drain areas 162 (see FIG. 1A) on a resultant in which the plurality of fin-type active areas FA, the device isolation layer 132, and the STI layer 134 are formed.

FIGS. 7A through 7F are cross-sectional views for describing a method of manufacturing the integrated circuit device 100B illustrated in FIG. 3 based on a process order, according to certain exemplary embodiments. The method of manufacturing the integrated circuit device 100B of FIG. 3 will now be described with reference to FIGS. 7A through 7F. In FIGS. 7A through 7F, like reference numerals as those of FIGS. 1A through 6D denote like elements, and detailed descriptions of the elements will be omitted.

Figure 7A:
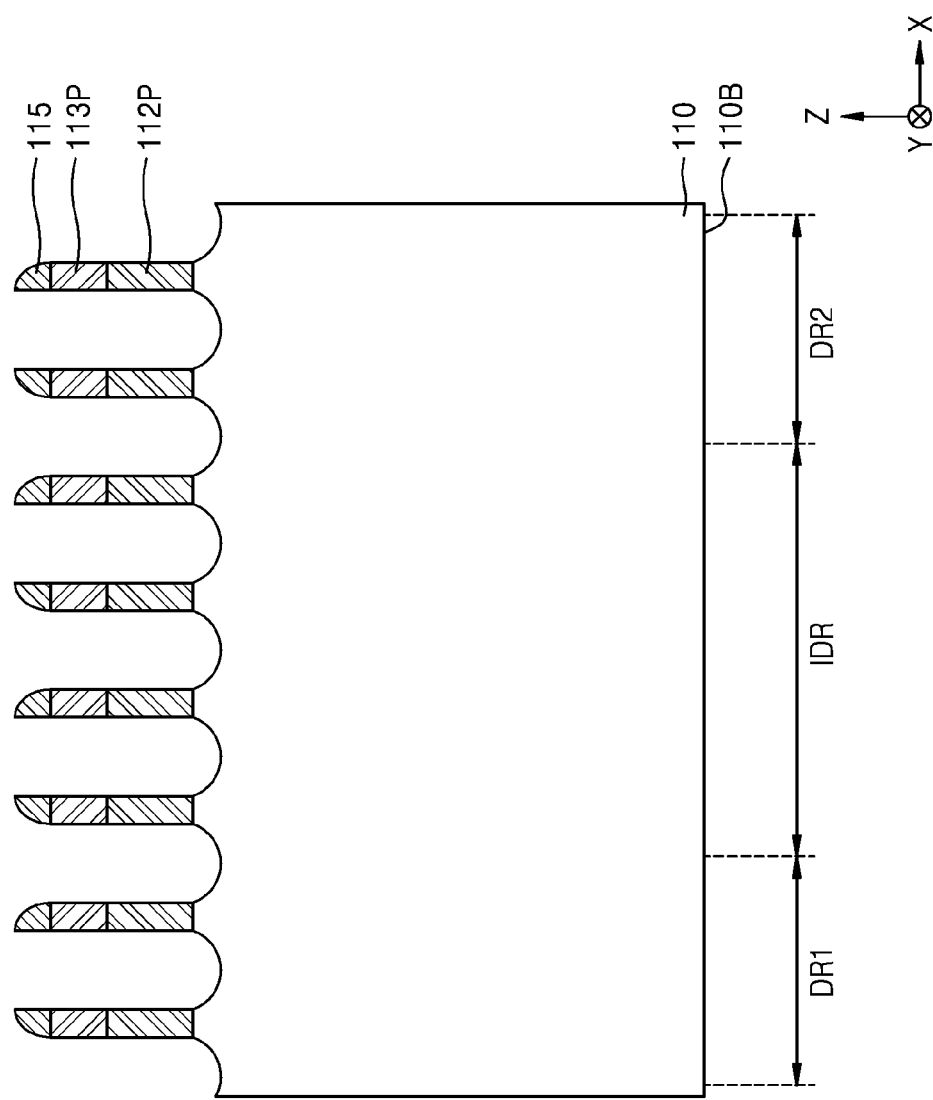
FIGS. 7A through 7F are cross-sectional views for describing a method of manufacturing an integrated circuit device based on a process order, according to certain exemplary embodiments.

Referring to FIG. 7A, in the same manner as those described with reference to FIGS. 5A through 5E, a process of forming a plurality of first mask patterns 112P, a plurality of second mask patterns 113P, and a plurality of spacer mask patterns 115 on the substrate 110 may be performed.

Figure 7B:
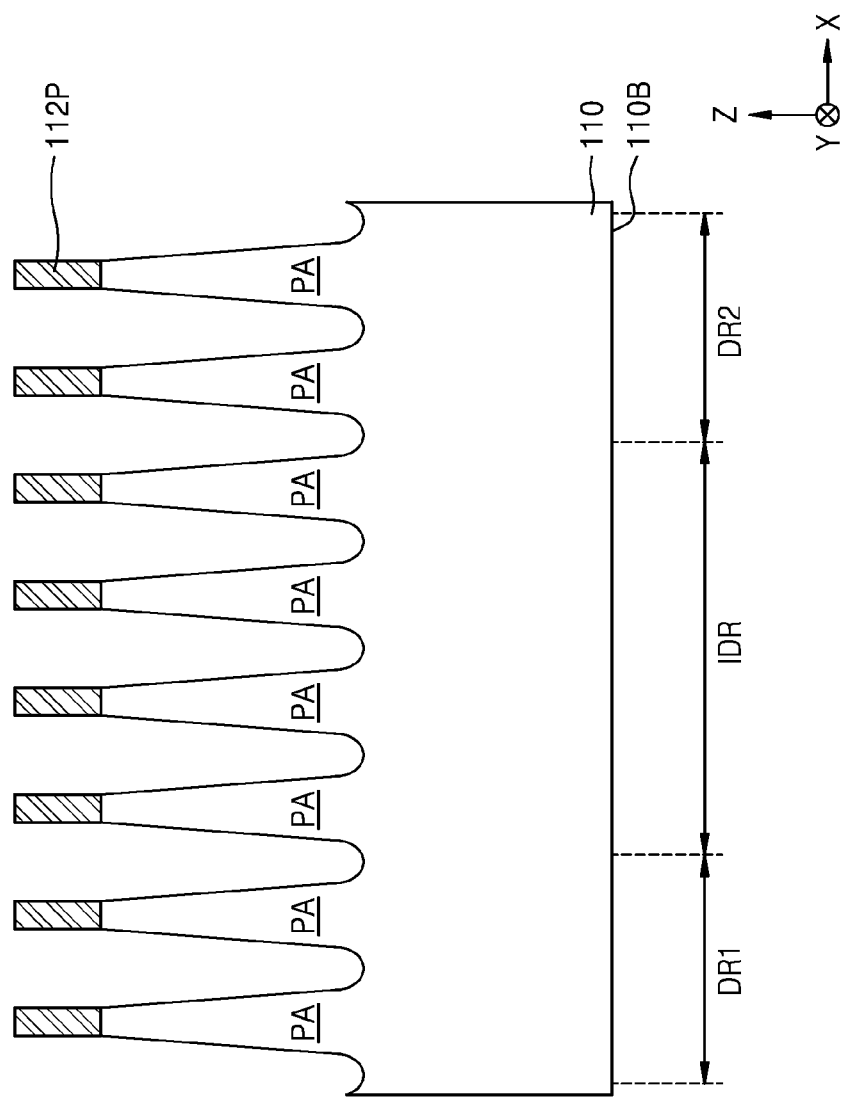

Referring to FIG. 7B, the substrate 110 exposed between the plurality of first mask patterns 112P, the plurality of second mask patterns 113P, and the plurality of spacer mask patterns 115 (see FIG. 7A) may be etched by using the plurality of first mask patterns 112P, the plurality of second mask patterns 113P, and the plurality of spacer mask patterns 115 as an etching mask, a plurality of preliminary fin-type active areas PA may be formed in the plurality of device regions DR1 and DR2 and the inter-device isolation region IDR between the plurality of device regions DR1 and DR2.

During an etching process for forming the plurality of preliminary fin-type active areas PA, the plurality of first mask patterns 112P, the plurality of second mask patterns 113P, and the plurality of spacer mask patterns 115 that are used as the etching mask may be partially consumed. FIG. 7B illustrates a case where some of the plurality of first mask patterns 112P remain on the plurality of preliminary fin-type active areas PA.

Figure 7C:
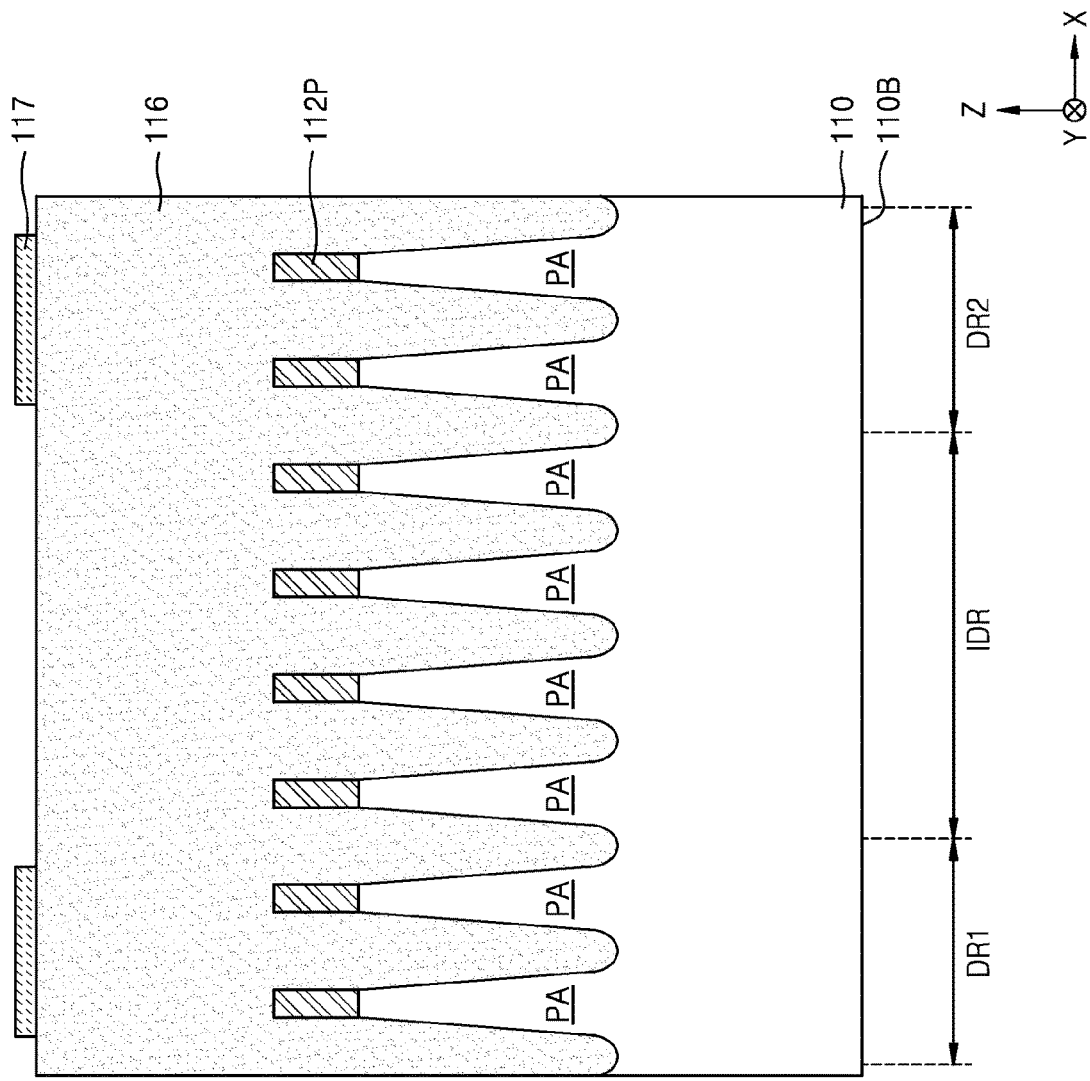

Referring to FIG. 7C, in a similar manner to the one described with reference to FIG. 5F, a protection mask layer 116 covering the substrate 110 and the plurality of first mask patterns 112P may be formed on a resultant in which the plurality of preliminary fin-type active areas PA (see FIG. 7B) are formed. A plurality of local mask patterns 117 covering portions of the substrate 110 that are to be the device regions DR1 and DR2 may be formed on the protection mask layer 116.

Figure 7D:
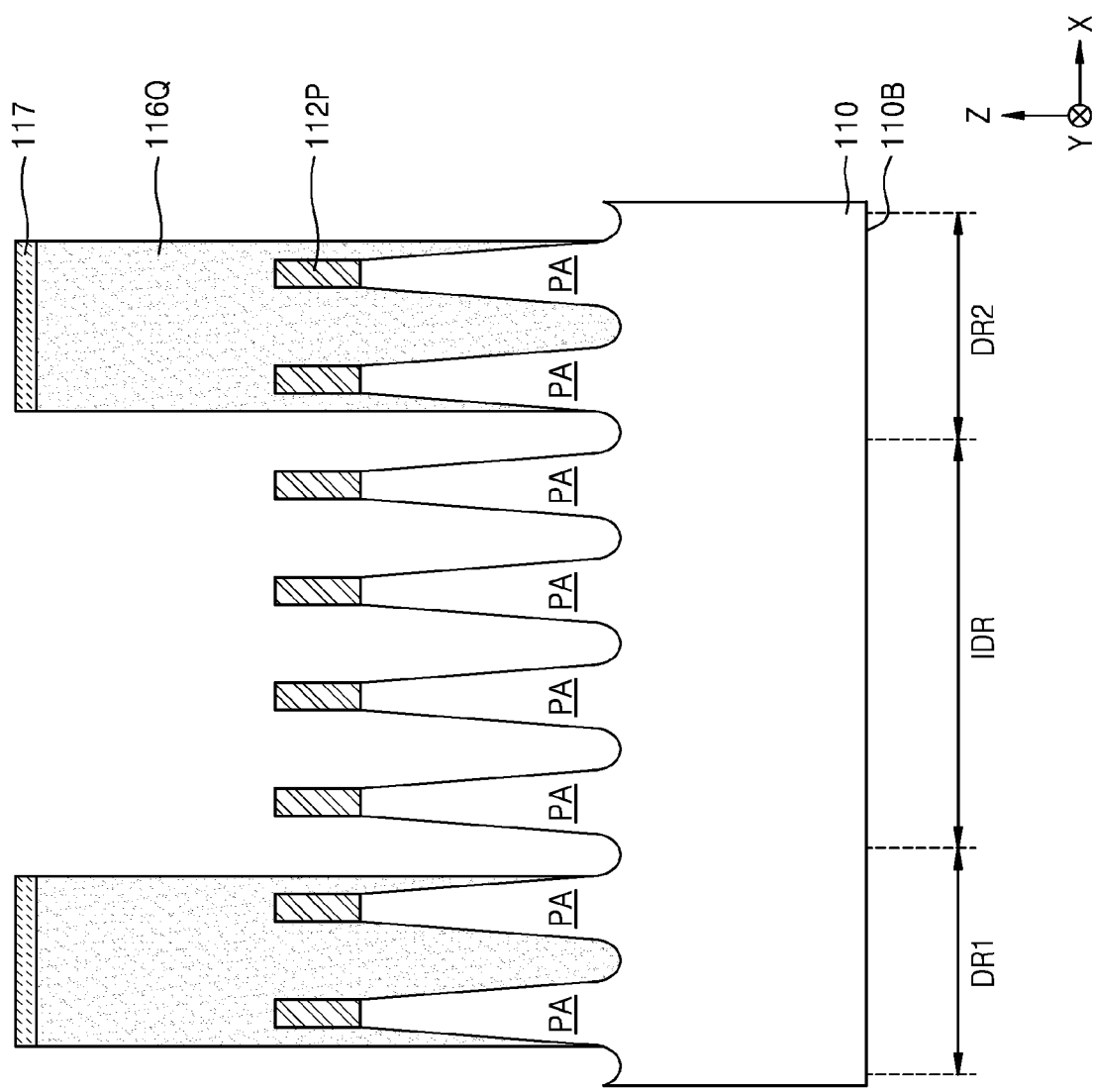

Referring to FIG. 7D, in a similar manner to the one described with reference to FIG. 5G, a protection mask pattern 116Q may be formed on portions of the substrate 110 that are to be the device regions DR1 and DR2 by etching a part of the protection mask layer 116 by using the plurality of local mask patterns 117 as an etching mask. However, unlike the process illustrated in FIG. 5G, in the present example, the protection mask pattern 116Q may be formed such that the plurality of first mask patterns 112P and the plurality of preliminary fin-type active areas PA are exposed in the inter-device isolation region IDR.

Figure 7E:
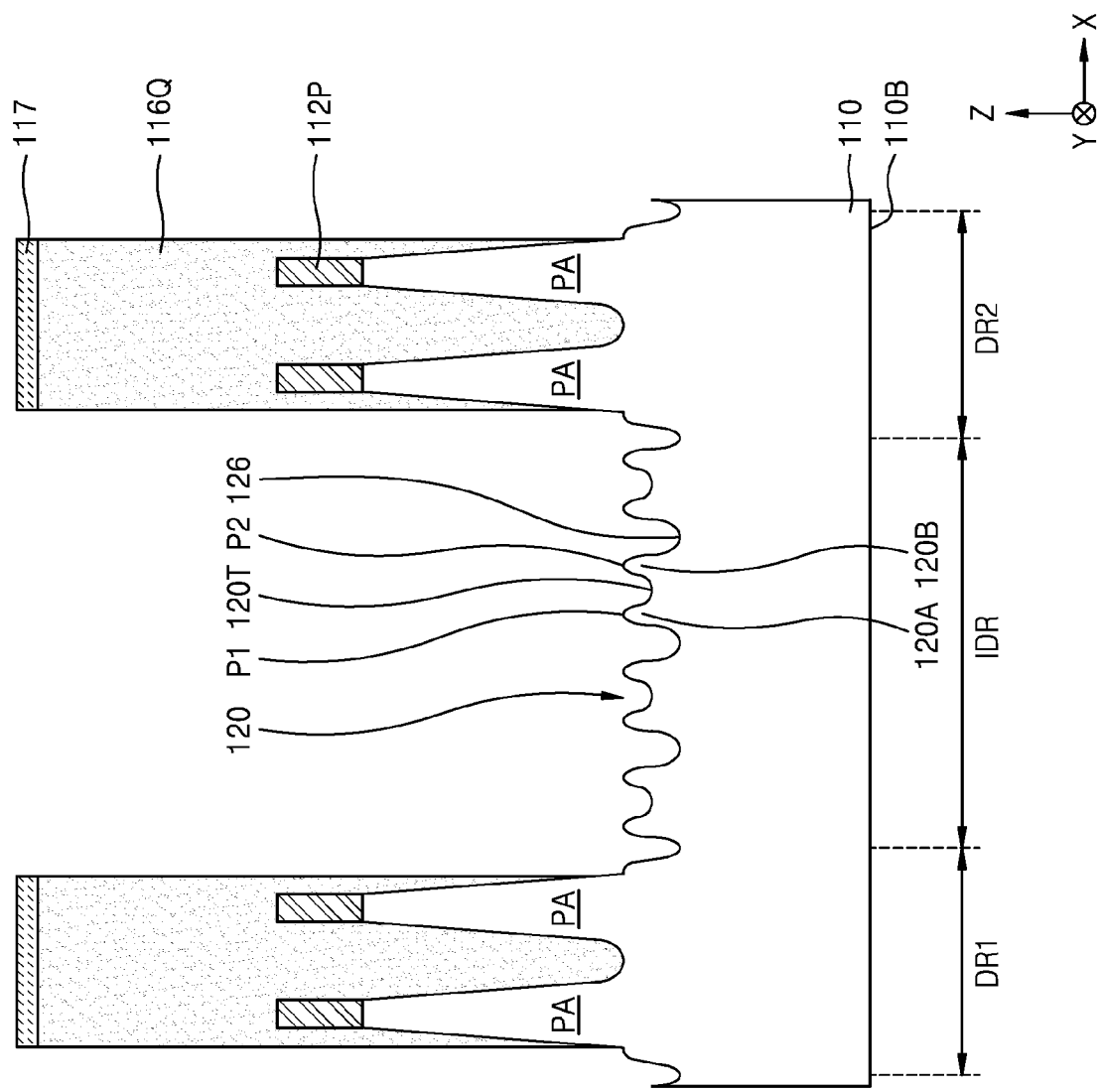

Referring to FIG. 7E, in a similar manner to the one described with reference to FIGS. 5H through 5L, the plurality of first mask patterns 112P (see FIG. 7D) exposed in the inter-device isolation region IDR may be removed, and the plurality of preliminary fin-type active areas PA exposed as a result may be etched, thereby forming a plurality of double-humped protrusions 120 and a plurality of valley portions 126 in the inter-device isolation region IDR.

During etching the plurality of preliminary fin-type active areas PA exposed in the inter-device isolation region IDR in order to form the plurality of double-humped protrusions 120 and the plurality of valley portions 126, the plurality of preliminary fin-type active areas PA in the device regions DR1 and DR2 may be protected by the protection mask pattern 116Q and the plurality of local mask patterns 117.

Figure 7F:
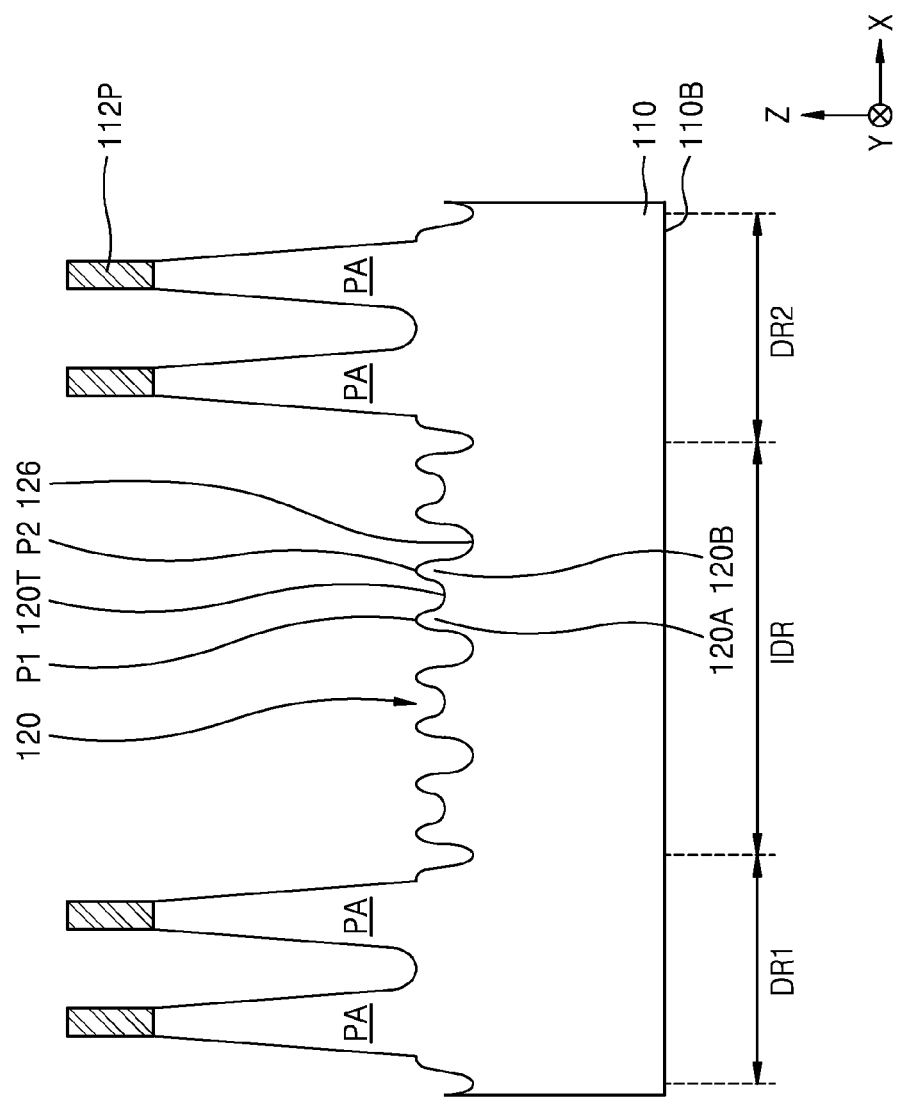

Referring to FIG. 7F, the plurality of preliminary fin-type active areas PA may be exposed by removing the protection mask pattern 116Q and the plurality of local mask patterns 117 in the device regions DR1 and DR2.

Thereafter, the integrated circuit device 100B illustrated in FIG. 3 may be manufactured by performing processes described with reference to FIGS. 5M through 5P.

Figure 8A:
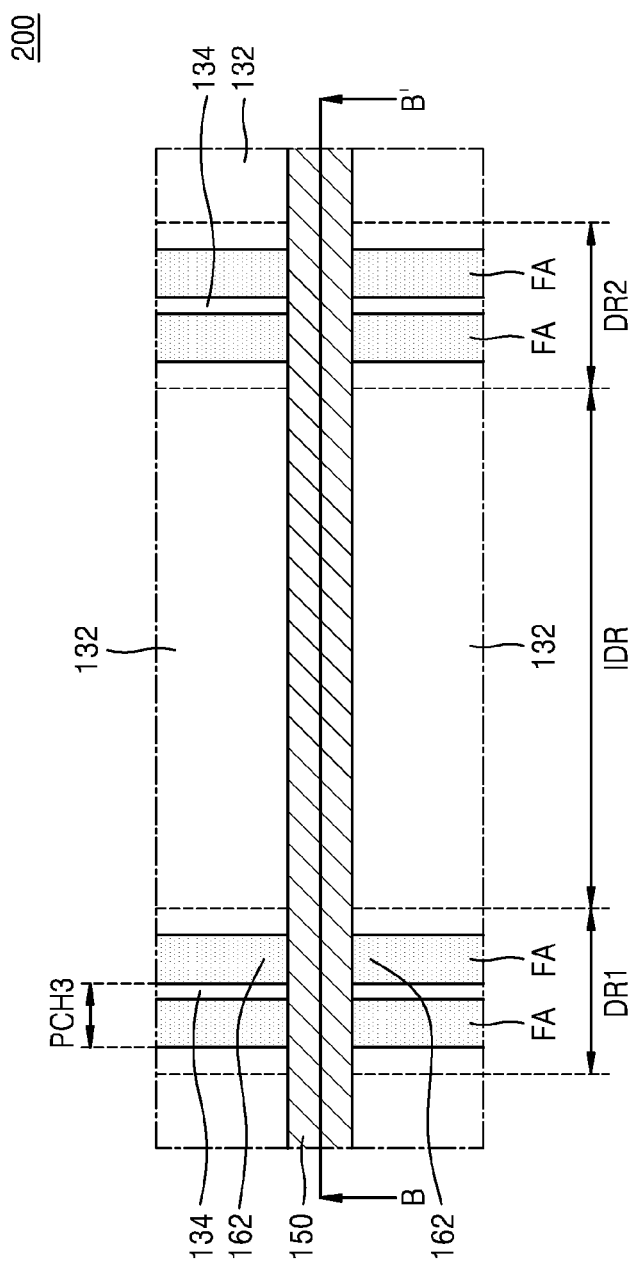
FIG. 8A is a plan layout diagram of main elements of an integrated circuit device according to certain exemplary embodiments.
Figure 8B:
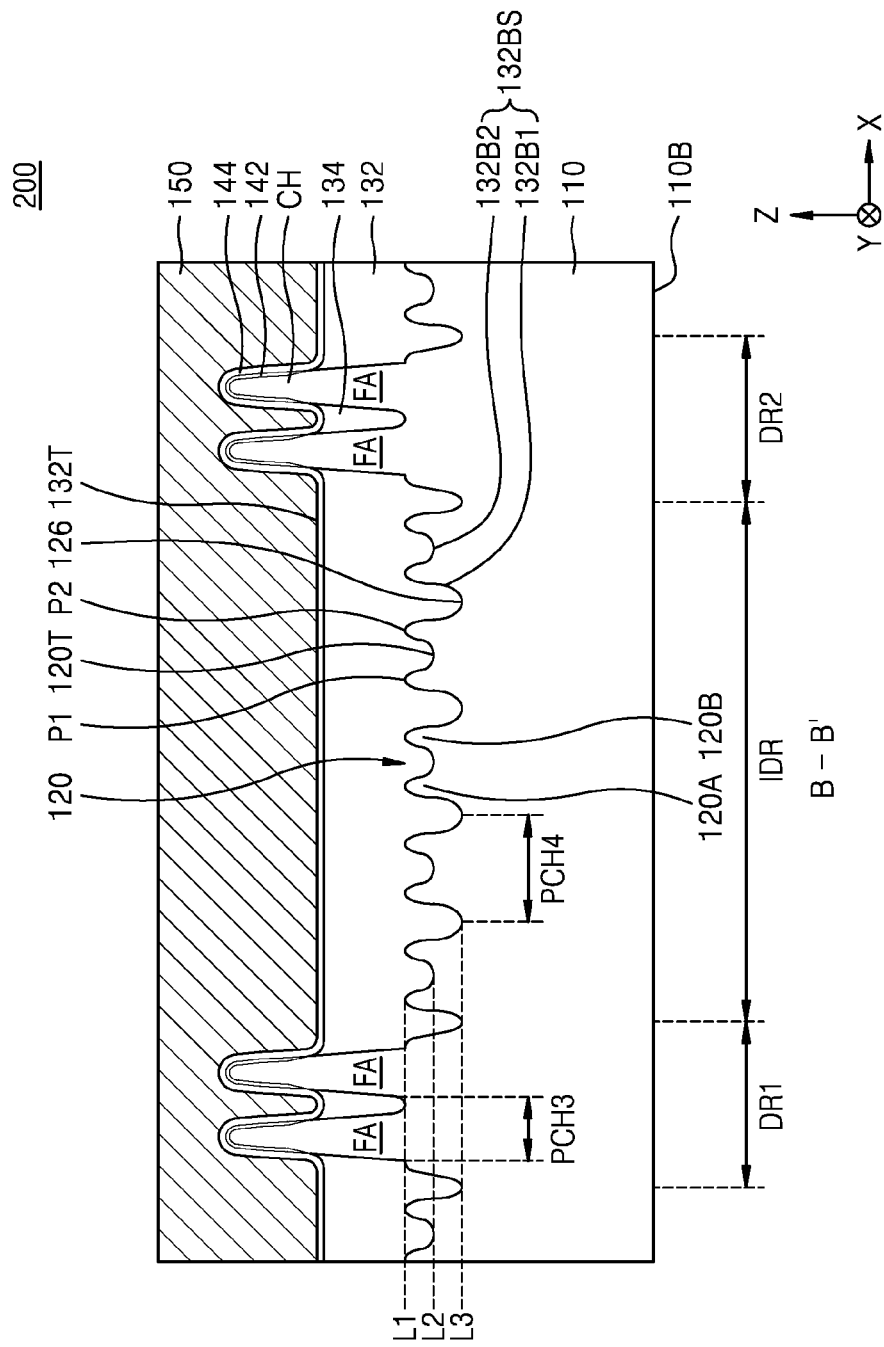
FIG. 8B is a cross-sectional view of the integrated circuit device taken along a line B-B' of FIG. 8A.

FIGS. 8A and 8B are diagrams of main elements of an integrated circuit device 200 according to certain exemplary embodiments. FIG. 8A is a plan layout diagram of the integrated circuit device 200. FIG. 8B is a cross-sectional view of the integrated circuit device taken along a line B-B' of FIG. 8A. In FIGS. 8A and 8B, like reference numerals as those of FIGS. 1A and 1B denote like elements, and detailed descriptions of the elements will be omitted.

Referring to FIGS. 8A and 8B, the integrated circuit device 200 may generally have the same configuration as the integrated circuit device 100 illustrated in FIGS. 1A and 1B, except that a pitch PCH3 of a plurality of fin-type active areas FA formed in a plurality of device regions DR1 and DR2 and a pitch PCH4 of a plurality of double-humped protrusions 120 formed in an inter-device isolation region IDR are different in the integrated circuit device 200, unlike the integrated circuit device 100 illustrated in FIGS. 1A and 1B.

FIG. 8B illustrates the pitch PCH3 of the plurality of fin-type active areas FA that is smaller than the pitch PCH4 of the plurality of double-humped protrusions 120 but the exemplary embodiments of the inventive concept are not limited to the example illustrated in FIG. 8B. In some other exemplary embodiments, the pitch PCH3 of the plurality of fin-type active areas FA may be greater than the pitch PCH4 of the plurality of double-humped protrusions 120.

The integrated circuit device 200 may include a device isolation layer 132 and an STI layer 134, like the integrated circuit device 100 illustrated in FIGS. 1A and 1B. However, the exemplary embodiments of the inventive concept are not limited to the examples illustrated in FIGS. 8A and 8B. In some exemplary embodiments, similarly to the integrated circuit device 100A illustrated in FIG. 2, the integrated circuit device 200 may include the device isolation layer 132A including the insulating liner 132L and the gap-fill insulating layer 100A, instead of the device isolation layer 132, and the STI layer 134A including the insulating liner 134L and the gap-fill STI layer 134G, instead of the STI layer 134. In some other exemplary embodiments, similarly to the integrated circuit device 100B illustrated in FIG. 3, the integrated circuit device 200 illustrated in FIGS. 8A and 8B may include the device isolation layer 132B including the insulating liners 132L1 and 132L2 of a bi-layer structure and the gap-fill insulating layer 132G, instead of the device isolation layer 132, and the STI layer 134B including the insulating liners 134L1 and 134L2 of the bi-layer structure and the gap-fill STI layer 134G, instead of the STI layer 134.

Similarly to the integrated circuit device 100 illustrated in FIGS. 1A and 1B, in the integrated circuit device 200, in the plurality of device regions DR1 and DR2, the first level L1 of a top surface of the substrate 110 between two adjacent fin-type active areas FA among the plurality of fin-type active areas FA may be the same as or similar to a level of the first peak P1 and the second peak P2. However, the exemplary embodiments of the inventive concept are not limited to the examples illustrated in FIGS. 8A and 8B. For example, similarly to the integrated circuit device 100C illustrated in FIG. 4, the first level L1 of the top surface of the substrate 110 between the two adjacent fin-type active areas FA among the plurality of fin-type active areas FA formed in the plurality of device regions DR1 and DR2 may be higher than the level of the first peak P1 and the second peak P2 of the double-humped protrusions 120.

Figure 9A:
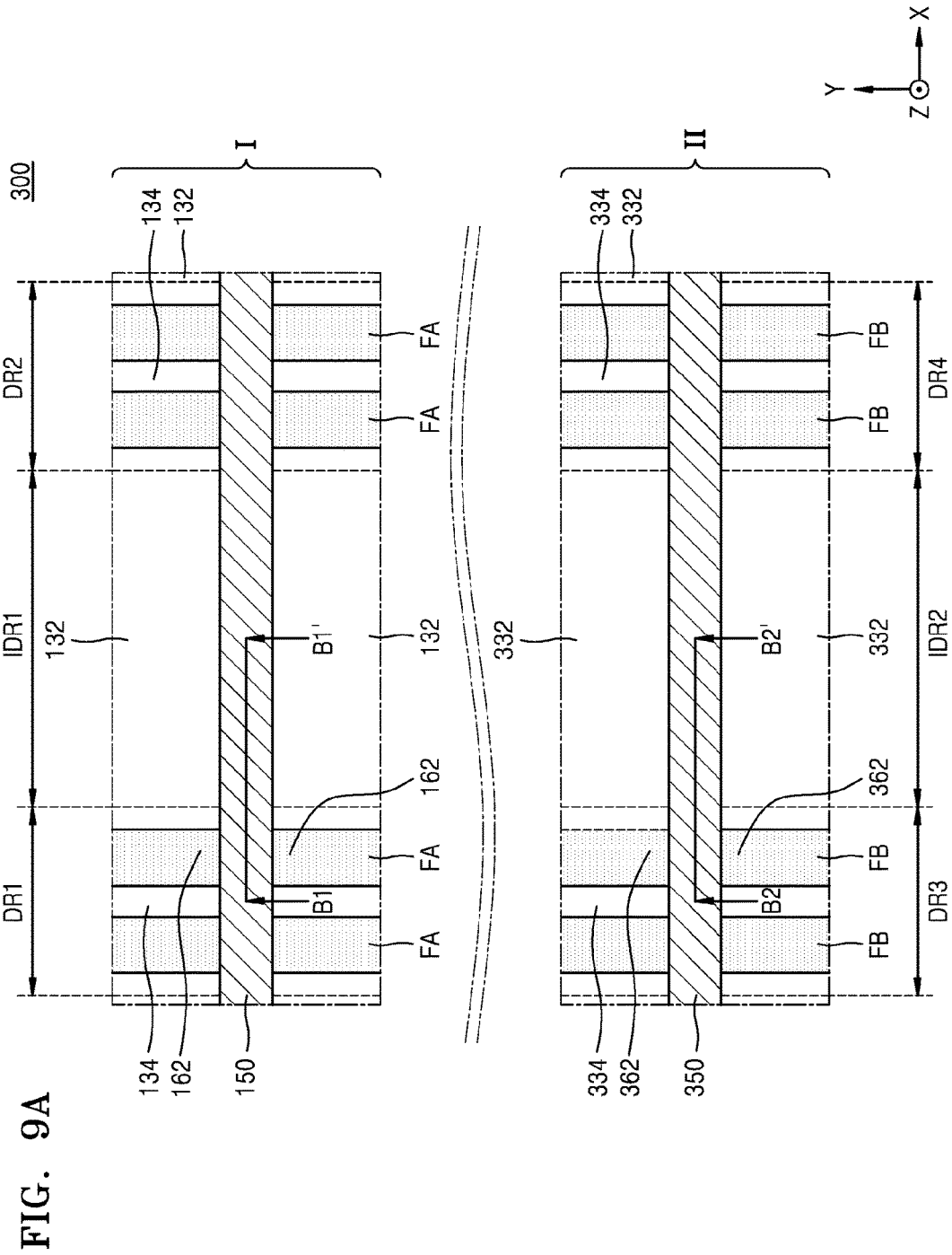
FIG. 9A is a plan layout diagram of main elements of an integrated circuit device according to certain exemplary embodiments.
Figure 9B:
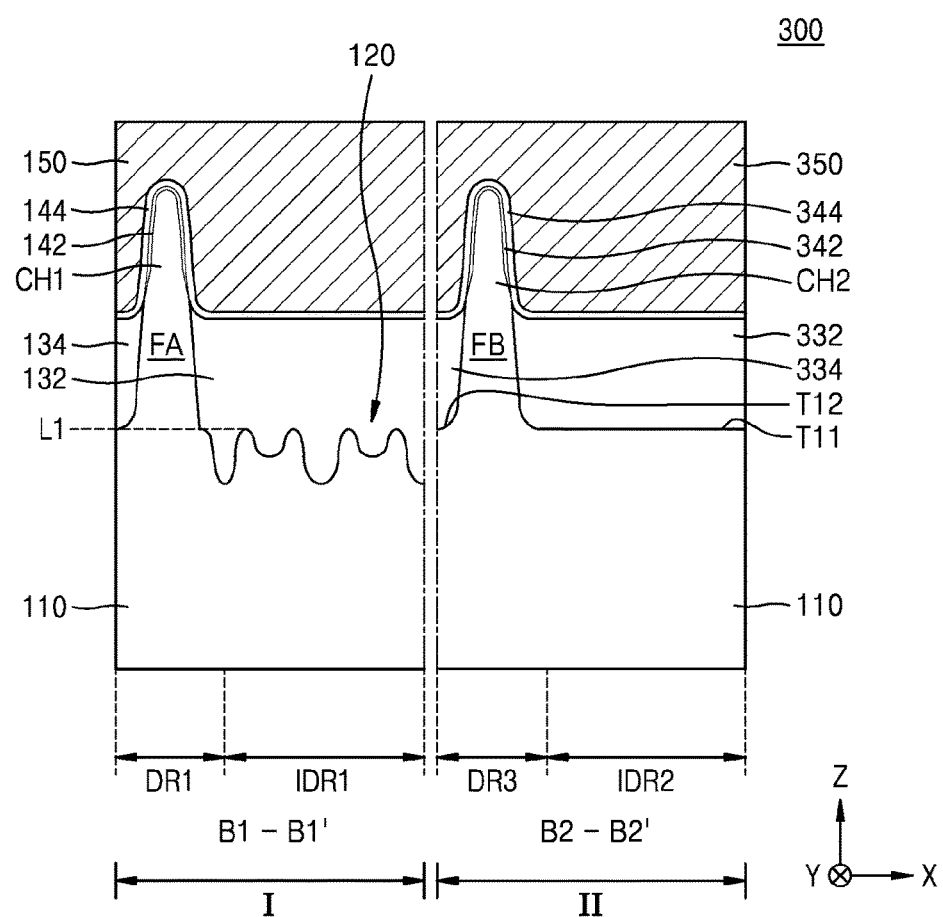
FIG. 9B is a cross-sectional view of the integrated circuit device taken along lines B1-B1' and B2-B2' of FIG. 9A.

FIGS. 9A and 9B are diagrams of an integrated circuit device 300 according to certain exemplary embodiments. FIG. 9A is a plan layout diagram of main elements of the integrated circuit device 300 including a first region I and a second region II. FIG. 9B is a cross-sectional view of the integrated circuit device 300 taken along lines B1-B1' and B2-B2' of FIG. 9A. In FIGS. 9A and 9B, like reference numerals as those of FIGS. 1A through 8B denote like elements, and detailed descriptions of the elements will be omitted.

Referring to FIGS. 9A and 9B, the substrate 110 of the integrated circuit device 300 may include the first region I and the second region II. The first region I and the second region II of the substrate 110 may designate different regions of the substrate 110.

The first region I of the integrated circuit device 300 may include a first inter-device isolation region IDR1 and the first device region DR1 and the second device region DR2 that are spaced apart from each other with the first inter-device isolation region IDR1 interposed therebetween.

The plurality of fin-type active areas FA may be formed in each of the first device region DR1 and the second device region DR2. A first channel area CH1 may be formed on the plurality of fin-type active areas FA protruding from the device isolation layer 132 and the STI layer 134. More detailed configurations of the first device region DR1 and the second device region DR2 are generally the same as those described with reference to FIGS. 1A and 1B.

As described with respect to the inter-device isolation region IDR with reference to FIGS. 1A and 1B, at least one double-humped protrusion 120 may be formed on a surface of the substrate 110 in the first inter-device isolation region IDR1.

The second region II of the integrated circuit device 300 may include a second inter-device isolation region IDR2 and a third device region DR3 and a fourth device region DR4 that are spaced apart from each other with the second inter-device isolation region IDR interposed therebetween.

A plurality of fin-type active areas FB may be formed in each of the third device region DR3 and the fourth device region DR4. In some exemplary embodiments, the plurality of fin-type active areas FB formed in the second region II may have shapes that are the same as or similar to those of the plurality of fin-type active areas FA formed in the first region I. In some other exemplary embodiments, the plurality of fin-type active areas FB formed in the second region II may have different shapes from those of the plurality of fin-type active areas FA formed in the first region I.

The plurality of fin-type active areas FB may have lower side walls defined by an STI layer 334 and a device isolation layer 332. The STI layer 334 may be formed in each of the third device region DR3 and the fourth device region DR4. The device isolation layer 332 may be formed in the second inter-device isolation region IDR2. A second channel area CH2 may be formed on the plurality of fin-type active areas FB protruding from the device isolation layer 332 and the STI layer 334. The second channel area CH2 may be a conductive type area that is the same as or different from the first channel area CH1 formed in the first region I.

The second channel area CH2 of the fin-type active area FB may be covered by an interfacial layer 342. A gate insulating layer 344 and a gate line 350 that cover both side walls and a top surface of the fin-type active area FB may be formed on the interfacial layer 342. The gate line 350 may extend in a direction (X direction of FIGS. 9A and 9B) crossing the direction in which the fin-type active area FB extends. A source/drain area 362 may be formed at both sides of the gate line 350 in the fin-type active area FB.

More detailed configurations of the device isolation layer 332, the STI layer 334, the interfacial layer 342, the gate insulating layer 344, the gate line 350, and the source/drain area 362 are generally the same as the device isolation layer 132, the STI layer 134, the interfacial layer 142, the gate insulating layer 144, the gate line 150, and the source/drain area 162 described with reference to FIGS. 1A and 1B.

The substrate 110 may have a flat top surface T11 in the second inter-device isolation region IDR2 of the second region II. For example, a bottom surface of the device isolation layer 332 facing the planar top surface T11 may also extend flatly.

In some exemplary embodiments, the flat top surface T11 and a top surface T12 of the substrate 110 in the third device region DR3 and the fourth device region DR4 may be located at substantially the same level.

In some exemplary embodiments, a level of the flat top surface T11 in the second inter-device isolation region IDR2 of the second region II may be substantially the same as or similar to the first level L1 of a top surface of the substrate 110 disposed between two adjacent fin-type active areas FA among the plurality of fin-type active areas FA in the respective first device region DR1 and second device region DR2 of the first region I. For example, the flat top surface T11 of the second inter-device isolation region IDR2 of the second region II may be at substantially the same level as or a similar level to a top surface level L1 of the first and second peaks of a double-humped protrusion in the first inter device isolation region IDR1.

Figure 10:
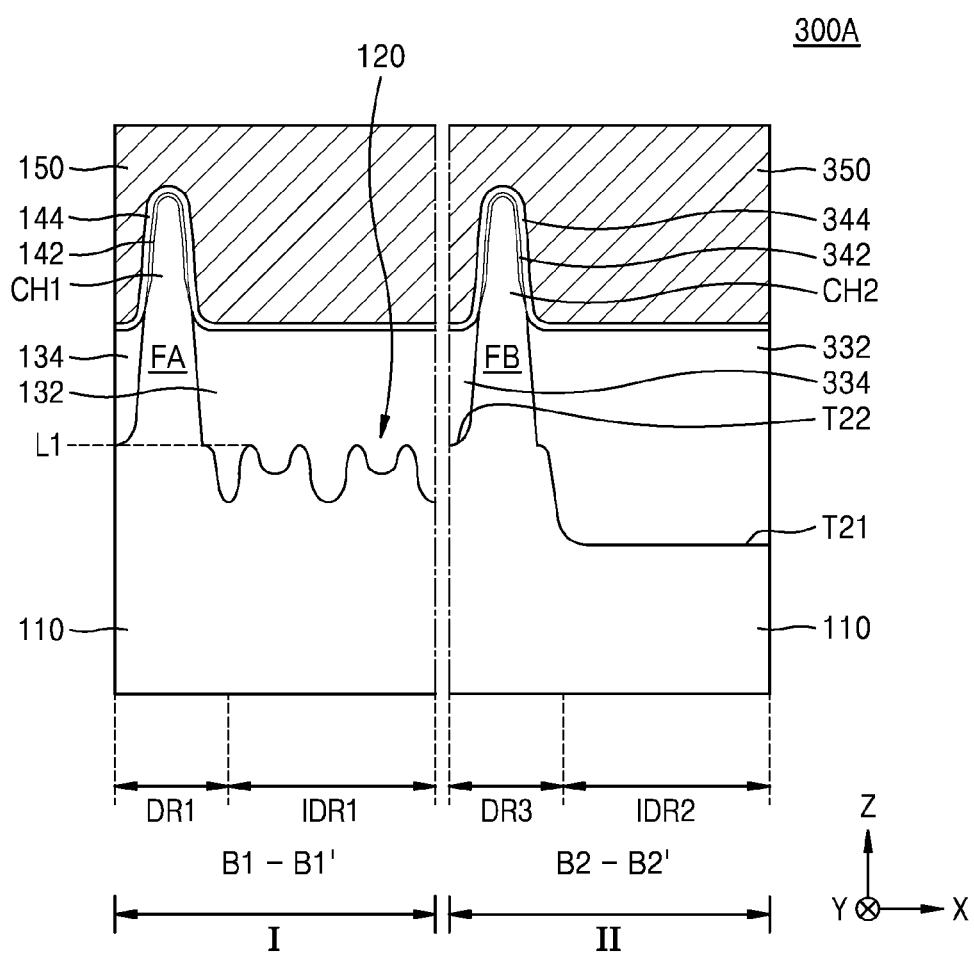
FIG. 10 is a cross-sectional view of an integrated circuit device according to certain exemplary embodiments.

FIG. 10 is a cross-sectional view of an integrated circuit device 300A according to certain exemplary embodiments. The integrated circuit device 300A illustrated in FIG. 10 is a modification example of the integrated circuit device 300 illustrated in FIG. 9B. The cross-sectional view of FIG. 10 may correspond to a cross-sectional view of the integrated circuit device 300 taken along lines B1-B1' and B2-B2' of FIG. 9A. In FIG. 10, like reference numerals as those of FIGS. 1A through 9B denote like elements, and detailed descriptions of the elements will be omitted.

Referring to FIG. 10, the integrated circuit device 300A may generally have the same configuration as the integrated circuit device 300 illustrated in FIGS. 9A and 9B, except that in the integrated circuit device 300A, the substrate 110 has a flat top surface T21 in the second inter-device isolation region IDR2 of the second region II, and a level of the flat top surface T21 is lower than a level of a top surface T22 of the substrate 110 in the third and fourth device regions DR3 and DR4. A bottom surface of the device isolation layer 332 may extend flat on the flat top surface T21. For example, the flat top surface T21 of the second inter-device isolation region IDR2 of the second region II may be lower than a top surface level L1 of the first and second peaks of a double-humped protrusion in the first inter device isolation region IDR1.

In some exemplary embodiments, the flat top surface T21 in the second inter-device isolation region IDR2 of the second region II may be lower than the first level L1 of a top surface of the substrate 110 disposed between two adjacent fin-type areas FA among the plurality of fin-type active areas FA in the respective first device region DR1 and second device region DR2 of the first region I.

In the integrated circuit device 300 illustrated in FIGS. 9A and 9B and the integrated circuit device 300A illustrated in FIG. 10, an example in which a configuration of the first region I is the same as that of the integrated circuit device 100 illustrated in FIGS. 1A and 1B is described, but the exemplary embodiments of the inventive concept may not be limited to the example. For example, in the integrated circuit devices 300 and 300A, the configuration of the first region I may be the same as that of the integrated circuit device 100B illustrated in FIG. 3, the integrated circuit device 100C illustrated in FIG. 4, or the integrated circuit device 200 illustrated in FIGS. 8A and 8B.

In the integrated circuit devices 300 and 300A, the first region I and the second region II may be regions having substantially the same threshold voltage or different threshold voltages. In some exemplary embodiments, one of the first region I and the second region II may be an NMOS transistor region, and the other may be a PMOS transistor region. In some other exemplary embodiments, both the first region I and the second region II may be NMOS transistor regions. In some other exemplary embodiments, both the first region I and the second region II may be PMOS transistor regions.

In certain embodiments, at least one of the first region I and the second region II may be a peripheral circuit region in which peripheral circuits are formed. The peripheral circuits may perform a function inputting external data into internal circuits of the integrated circuit devices 300 and 300A or outputting data from the internal circuits of the integrated circuit devices 300 and 300A to outside. In some exemplary embodiments, at least one of the first region I and the second region II may configure a part of an input/output (I/O) circuit apparatus.

In certain embodiments, at least one of the first region I and the second region II may be a region in which a transistor having a relatively low threshold voltage and a high switching speed is formed. In some exemplary embodiments, at least one of the first region I and the second region II may be a cell array region in which unit memory cells are arranged in a form of matrix. For example, at least one of the first region I and the second region II may be a logic cell region or a memory cell region. Logic cells of the logic cell region may be standard cells performing a desired logical function such as a counter, a buffer, etc. and may include different types of logic calls including a plurality of circuit elements such a transistor, a register, etc. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, etc. However, the logic cells according to the exemplary embodiments of the inventive concept are not limited to the above examples. The memory cell region may include at least one of SRAM, DRAM, MRAM, RRAM, and PRAM.

Integrated circuit devices including FinFETs having a channel of a 3D structure and methods of manufacturing the integrated circuit devices are described with reference to FIGS. 1A through 10 but the exemplary embodiments of the inventive concept are not limited thereto. For example, it will be obvious to one of ordinary skill in the art that integrated circuit devices including planar MOSFETs having characteristics of the exemplary embodiments of the inventive concept and methods of manufacturing the integrated circuit devices may be provided through various modifications and changes within the scope of the inventive concept.

Figure 11:
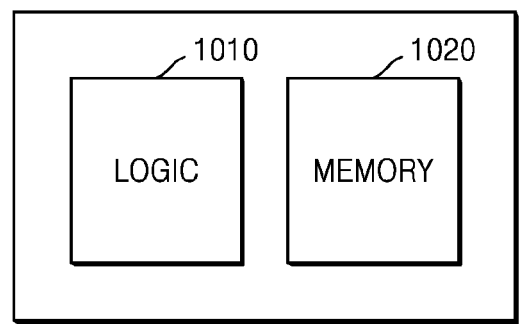
FIG. 11 is a block diagram of an electronic device according to certain exemplary embodiments.

FIG. 11 is a block diagram of an electronic device 1000 according to certain exemplary embodiments.

Referring to FIG. 11, the electronic device 1000 may include a logic area 1010 and a memory area 1020.

The logic area 1010 may include various kinds of logic cells including a plurality of circuit elements such as transistors, registers, etc., as standard cells performing desired logic functions such as a counter, a buffer, etc. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT). OAI (OR/AND/INVERTER), AO (AND/OR), AOI (AND/OR/INVERTER), D flip-flop, reset flip-flop, master-slaver flip-flop, latch, etc. However, the logic cells according to the exemplary embodiments of the inventive concept are not limited to the above examples.

The memory area 1020 may include at least one of SRAM, DRAM, MRAM, RRAM, and PRAM.

The logic area 1010 and the memory area 1020 may respectively include at least one of the integrated circuit devices 100, 100A, 100B, 100C, 200, 300, and 300A illustrated in FIGS. 1A through 10 and other integrated circuit devices having various structures modified and changed from the above integrated circuit devices 100, 100A, 100B, 100C, 200, 300, and 300A within the scope of the inventive concept.

Figure 12:
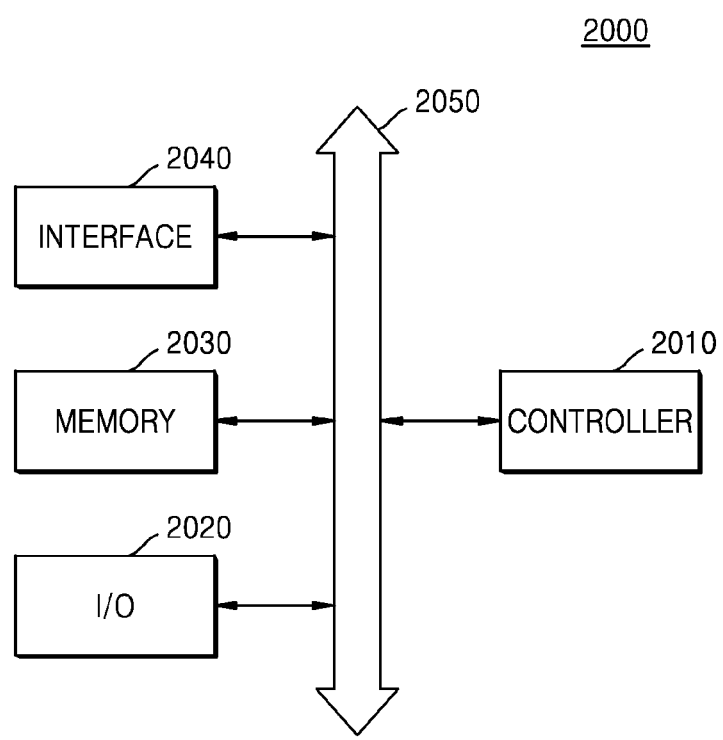
FIG. 12 is a block diagram of an electronic system according to certain exemplary embodiments.

FIG. 12 is a block diagram of an electronic system 2000 according to certain exemplary embodiments.

Referring to FIG. 12, the electronic system 2000 may include a controller 2010, an input/output (I/O) device 2020, a memory 2030, and an interface 2040 that are electrically connected to one another via a bus 2050.

The controller 2010 may include at least one of a microprocessor, a digital signal processor, and other similar processors. The I/O device 2020 may include at least one of a keypad, a keyboard, and a display. The memory 2030 may be used to store data or a command executed by the controller 2010. For example, the memory 2030 may be used to store user data.

The electronic system 2000 may configure a wireless communication device, or a device capable of transmitting and/or receiving information under a wireless communication environment. The interface 2040 may include a wireless interface in order to transmit/receive data via a wireless communication network in the electronic system 2000. The interface 2040 may include an antenna and/or a wireless transceiver. In some exemplary embodiments, the electronic system 2000 may be used for a communication interface protocol of a third-generation communication system, e.g., code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100, 100A, 100B, 100C, 200, 300, and 300A illustrated in FIGS. 1A through 10 and other integrated circuit devices having various structures modified and changed from the above integrated circuit devices 100, 100A, 100B, 100C, 200, 300, and 300A within the scope of the inventive concept.

While the inventive concept has been particularly shown and described with reference to exemplary embodiments thereof, it will be understood that various changes in form and details may be made therein without departing from the spirit and scope of the following claims.

What is claimed is:

1. An integrated circuit device comprising:
a substrate comprising a PMOS device region, an NMOS device region adjacent to the PMOS device region and an inter-device isolation region interposed between the PMOS device region and the NMOS device region;
a first fin-type active area protruding from the substrate, in one of the PMOS device region and NMOS device region;
a device isolation layer covering the substrate at the inter-device isolation region,
wherein, as viewed with respect to a vertical cross section extending between the PMOS device region and the NMOS device region:
an upper surface of the substrate at the inter-device isolation region comprises a double-humped protrusion, the double-humped protrusion comprising a first hump having a first peak, a second hump having a second peak and a recess disposed between the first peak and the second peak, the recess having a depth comprising a vertical distance from the lower most portion of the recess to a height of one of the first peak and second peak,
wherein the double-humped protrusion has a height comprising a vertical distance from a minimum height of a top surface of the substrate immediately adjacent to the double-humped protrusion to a top of one of the first peak and second peak, and the height of the double-humped protrusion is greater than the depth of the recess,
wherein the device isolation layer comprises:
an insulating liner covering a side wall of the first fin-type active area and the double-humped protrusion and being conformally formed on a top surface of the double-humped protrusion; and
a gap-fill insulating layer on the insulating liner, the gap-fill insulating layer covering the side wall of the first fin-type active area and covering the double-humped protrusion,
wherein the insulating liner comprises a first insulating liner and a second insulating liner that are sequentially stacked on the side wall of the first fin-type active area and the double-humped protrusion, and
wherein the first insulating liner is formed of a different material from the material of the second insulating liner.

2. The integrated circuit device of claim 1, wherein the vertical cross section is taken in a direction perpendicular to a length direction of the first fin-type active area.

3. The integrated circuit device of claim 2,
wherein, with respect to the vertical cross section, side walls of the first hump are asymmetric with respect to the first peak, and
wherein, with respect to the vertical cross section, side walls of the second hump are asymmetric with respect to the second peak.

4. The integrated circuit device of claim 2, wherein the upper surface of the substrate comprises valley portions at sides of the double-humped protrusion,
wherein, with respect to the vertical cross section, a lowest point of each of the valley portions is lower than a lowest point of the recessed top surface of the double-humped protrusion.

5. The integrated circuit device of claim 2, wherein the integrated circuit device comprises a second fin-type active area adjacent to the first fin-type active area,
wherein, with respect to the vertical cross section, at least one of the first peak and the second peak is at the same level as a top surface of the substrate between the first and second fin-type active areas.

6. The integrated circuit device of claim 2, wherein the integrated circuit device comprises a second fin-type active area adjacent to the first fin-type active area,
wherein, with respect to the vertical cross section, at least one of the first peak and the second peak is lower than a lowest point of the top surface of the substrate between the first and second fin-type active areas.

7. The integrated circuit device of claim 2, wherein the integrated circuit device comprises a second fin-type active area adjacent to the first fin-type active area, and wherein, with respect to the vertical cross section, a lowest point of the recess is lower than a lowest point of the top surface of the substrate between the first and second fin-type active areas.

8. The integrated circuit device of claim 1, wherein the insulating liner is formed of different material from the material of the gap-fill insulating layer.

9. An integrated circuit device comprising:
a substrate comprising a first device region, a second device region, and an inter-device isolation region between the first device region and the second device region;
a plurality of fin-type active areas protruding from the substrate, in the first device region and the second device region;
a device isolation layer disposed on the substrate at the inter-device isolation region between the first device region and the second device region;
wherein a surface of the substrate in the inter-device isolation region comprises a plurality of double-humped protrusions with a plurality of valley portions each between immediately neighboring pairs of the plurality of double-humped protrusions in the inter-device isolation region, a vertical depth of the valley portions being less than a height of the plurality of fin-type active areas;
wherein each of the plurality of double-humped protrusions comprises:
a first hump having a first peak;
a second hump having a second peak; and
a recessed top surface between the first hump and the second hump and lower than the first peak and the second peaks,
wherein, with respect to a vertical cross section, each of the plurality of double-humped protrusions is substantially symmetric about a vertical line extending through the recessed top surface, and
wherein the device isolation layer covers the plurality of double-humped protrusions and the plurality of valley portions.

10. The integrated circuit device of claim 9, wherein the device isolation layer comprises a corrugated bottom surface facing the substrate,
wherein the corrugated bottom surface comprises a first protrusion surface and a second protrusion surface that protrude downward to different depths.

11. The integrated circuit device of claim 9,
wherein the recessed top surface is higher than a lowest point in the plurality of valley portions.

12. The integrated circuit device of claim 11, wherein each of the plurality of valley portions and the recessed top surface are alternately disposed one by one along a direction extending from the first device region to the second device region.

13. The integrated circuit device of claim 11, wherein the device isolation layer comprises a corrugated bottom surface facing the substrate, and
wherein the corrugated bottom surface comprises a first protrusion facing the plurality of valley portions and a second protrusion facing the recessed top surface, the first protrusion having a first depth from a top surface of the device isolation layer, and the second protrusion having a second depth from the top surface of the device isolation layer, wherein the second depth is less than the first depth.

14. The integrated circuit device of claim 11, wherein each of the first hump and the second hump has both side walls of an asymmetric shape.

15. The integrated circuit device of claim 11, wherein
sidewalls of the first hump have different lengths in a vertical direction, and
sidewalls of the second hump have different lengths in the vertical direction.

16. The integrated circuit device of claim 9,
wherein the fin type active areas of the plurality of fin-type active areas are spaced apart from each other by a first pitch, and
the double-humped protrusions of the plurality of double-humped protrusions are spaced apart from each other by a second pitch that is equal to the first pitch.

17. The integrated circuit device of claim 9,
wherein the fin-type active areas of the plurality of fin-type active areas are repeatedly formed at a first pitch, and
wherein the fin-type active areas of the plurality of double-humped protrusions are repeatedly formed at a second pitch that is different from the first pitch.

18. The integrated circuit device of claim 9, wherein each of the plurality of double-humped protrusions comprises at least one of a III-V group material and a IV group material.

19. An integrated circuit device comprising:
a substrate having a top surface having a plurality of double-humped protrusions, including a first double-humped protrusion, in a first region of a substrate; and
a fin-type active area in a second region of the substrate,
wherein a ratio of a height of a first fin-type active area to a height of a hump of the first double-humped protrusions is between 2 and 4,
wherein a height of the fin-type active area is a vertical distance from a top surface of the first fin-type active area to a depth corresponding to a minimum height of the substrate immediately adjacent to the first fin-type active area,
wherein the height of the hump is a vertical distance from a top surface of the hump to a depth corresponding to a minimum height of the substrate immediately adjacent to the first double-humped protrusion,
wherein the first double-humped protrusion comprises:
two humps having respective peaks; and
a recessed top surface between the two humps,
wherein the recessed top surface is lower than the peaks of the two humps,
wherein, with respect to a vertical cross section, the first double-humped protrusion is substantially symmetric about a vertical line extending through the recessed top surface.

20. The device of claim 19, wherein ratios of the height of the humps to the depth of the recessed top surface is between 1.2 and 2.5.

21. The device of claim 19, wherein the first region is an inter-device isolation region, and the second region is a device region.

22. The device of claim 19, further comprising:
a second fin-type active area formed in a third region of the substrate,
wherein the first fin-type active area forms a first transistor having a channel region doped with n-type impurities, and the second fin-type active area forms a second transistor having a channel region doped with p-type impurities.

23. The device of claim 22, further comprising:
a device isolation layer extending from a sidewall of the first fin-type active area to a sidewall of the second fin-type active area and covering the plurality of double-humped protrusions disposed between the first fin-type active area and the second fin-type active area.

24. The integrated circuit device of claim 1, wherein, with respect to a vertical cross section, the double-humped protrusion is substantially symmetric about a vertical line extending through the recess.

25. The integrated circuit device of claim 9, wherein the device isolation layer comprises:
a first insulating liner conformally formed on a top surface of the plurality of double-humped protrusions, the valley portions and sidewalls of the plurality of fin-type active areas,
a second insulating liner that is conformally formed on the first insulating liner over the plurality of double-humped protrusions, the valley portions and the sidewalls of the plurality of the fin-type active areas, and
a gap-fill insulating layer formed on the second insulating liner over the plurality of double-humped protrusions, the valley portions and the sidewalls of the plurality of the fin-type active areas,
wherein the first insulating liner is formed of a different material from the material of the second insulating liner.

* * * * *

UNITED STATES PATENT AND TRADEMARK OFFICE
CERTIFICATE OF CORRECTION

PATENT NO.        : 9,899,388 B2
APPLICATION NO.   : 15/191562
DATED             : February 20, 2018
INVENTOR(S)       : Ki-Il Kim, Jung-gun You and Gi-Gwan Park Page 1 of 1

It is certified that error appears in the above-identified patent and that said Letters Patent is hereby corrected as shown below:

In the Claims

Column 34, Line 54, change "second peaks," to -second peak,-.

Signed and Sealed this
Second Day of July, 2019

Andrei Iancu
*Director of the United States Patent and Trademark Office*